US006265811B1

(12) United States Patent
Takeuchi et al.

(10) Patent No.: US 6,265,811 B1
(45) Date of Patent: Jul. 24, 2001

(54) CERAMIC ELEMENT, METHOD FOR PRODUCING CERAMIC ELEMENT, DISPLAY DEVICE, RELAY DEVICE AND CAPACITOR

(75) Inventors: Yukihisa Takeuchi, Nishikamo-gun; Toshikatsu Kashiwaya, Inazawa; Nobuo Takahashi, Owariasahi, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/117,243

(22) PCT Filed: Nov. 28, 1997

(86) PCT No.: PCT/JP97/04371

§ 371 Date: Nov. 10, 1998

§ 102(e) Date: Nov. 10, 1998

(87) PCT Pub. No.: WO98/24130

PCT Pub. Date: Jun. 4, 1998

(30) Foreign Application Priority Data

Nov. 29, 1996 (JP) ................................................ 8-320482
Dec. 27, 1996 (JP) ................................................ 8-351715

(51) Int. Cl.[7] ........................................ H01L 41/08

(52) U.S. Cl. ........................ 310/330; 310/328; 310/331

(58) Field of Search ........................... 310/311, 328, 310/330–332, 365, 366, 358, 359

(56) References Cited

U.S. PATENT DOCUMENTS

| 2,540,412 | * | 2/1951 | Adler | 310/330 X |
| 2,565,514 | | 8/1951 | Pajes | 88/61 |
| 2,997,922 | | 8/1961 | Kaprelian | 350/285 |

(List continued on next page.)

FOREIGN PATENT DOCUMENTS

| 3-128681 | 5/1991 | (JP) . |
| 3-283515 | 12/1991 | (JP) . |
| 4-337681 | 11/1992 | (JP) . |

(List continued on next page.)

OTHER PUBLICATIONS

Uchino, Kenji, "Shape Memory Material Using Antiferroelectrics", Department of Physics, Faculty of Science and Technology, Sophia University, Jan. 10, 1985, pp. 591(67)–595(71).

Berlincourt, D., et al., "Stability of Phases in Modified Lead Zirconate With Variation in Pressure, Electric Field, Temperature and Composition", J.Phys. Chem. Solids, Pergamon Press 1964, vol. 25, pp. 659–674.

Kenji Uchino, *Digital Placement Transducer Using Antiferroelectrics*, Japanese Journal of Applied Physics, vol. 24, 1985, Supplement 24–2, pp. 460–462.

(List continued on next page.)

*Primary Examiner*—Mark O. Budd
(74) *Attorney, Agent, or Firm*—Burr & Brown

(57) ABSTRACT

A ceramic element comprises a main actuator element 26 having an anti-ferroelectric film 22 and a pair of electrodes 24a, 24b formed on a first principal surface (front surface) of the anti-ferroelectric film 22, a vibrating section 18 for supporting the main actuator element 26, and a fixed section 20 for supporting the vibrating section 18 in a vibrating manner. The anti-ferroelectric film 22 after polarization has a region Zt in which its average dielectric constant is increased in an analog manner in accordance with a voltage V applied to the pair of electrodes 24a, 24b. Specifically, an expression of $p/t \leq 2.5$ is satisfied provided that an average film thickness of the anti-ferroelectric film 22 is t, and a pitch between the pair of electrodes 24a, 24b is p. Accordingly, the mechanical displacement amount is changed in an analog manner in accordance with the applied voltage, making it possible to maintain a displacement amount equivalent to that obtained during application of a driving voltage, in a no voltage-loaded state after completion of application of the driving voltage.

21 Claims, 54 Drawing Sheets

U.S. PATENT DOCUMENTS

| | | | |
|---|---|---|---|
| 3,376,092 | 4/1968 | Kushner et al. | 350/160 R |
| 3,404,296 * | 10/1968 | Jaffe et al. | 310/358 X |
| 3,698,793 | 10/1972 | Tellerman | 350/160 R |
| 5,210,455 | 5/1993 | Takeuchi et al. | 310/328 |
| 5,319,491 | 6/1994 | Selbrede | 359/291 |
| 5,622,748 | 4/1997 | Takeuchi et al. | 427/100 |
| 5,636,072 | 6/1997 | Shibata et al. . | |
| 5,681,410 | 10/1997 | Takeuchi et al. | 156/89 |
| 5,691,593 | 11/1997 | Takeuchi et al. | 310/328 |
| 5,767,612 * | 6/1998 | Takeuchi et al. | 310/330 X |
| 5,771,321 | 6/1998 | Stern | 385/31 |
| 5,774,257 | 6/1998 | Shibata et al. . | |
| 5,831,371 * | 11/1998 | Bishop | 310/330 X |
| 5,862,275 * | 1/1999 | Takeuchi et al. | 310/330 X |
| 5,889,353 * | 3/1999 | Takeuchi et al. | 310/330 |
| 5,953,469 | 9/1999 | Zhou | 385/22 |

FOREIGN PATENT DOCUMENTS

| | | |
|---|---|---|
| 5-49270 | 2/1993 | (JP) . |
| 6-247769 | 9/1994 | (JP) . |
| 7-287176 | 10/1995 | (JP) . |
| 8-148697 | 6/1996 | (JP) . |
| 10-52071 | 2/1998 | (JP) . |
| 10-66360 | 3/1998 | (JP) . |

OTHER PUBLICATIONS

Ki–Young Oh, et al., *Shape Memory Unimorph Actuators Using Lead Zirconate–Based Antiferroelectrics*, Proceeding of Symposia of Ceramic Society of Japan, 98[8], 1990, Tokyo , pp. 905–908.

Kenji Uchino, *Present State of Development of Shape–Memory Ceramics* (in Japanese), Metal, [59], 1989, Tokyo, pp. 41–47.

* cited by examiner

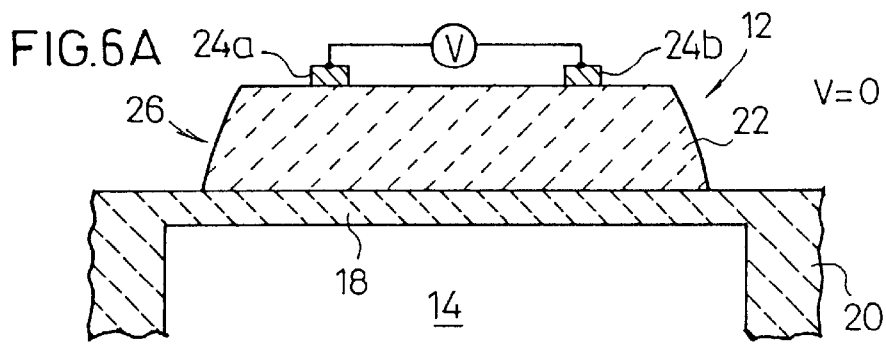
FIG.6A  V=0
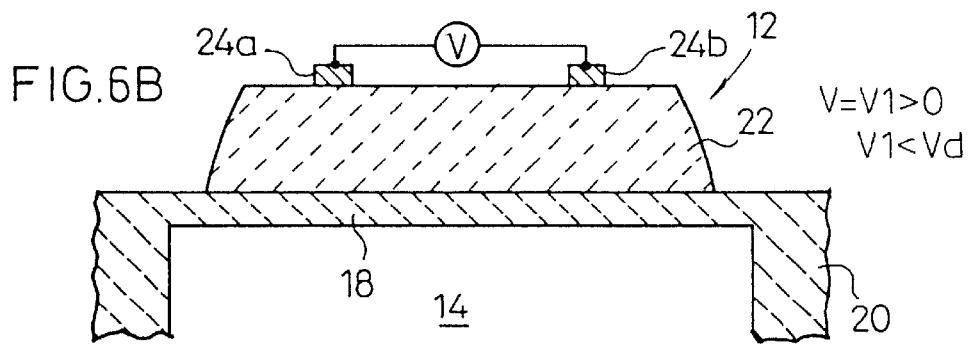
FIG.6B  V=V1>0, V1<Vd
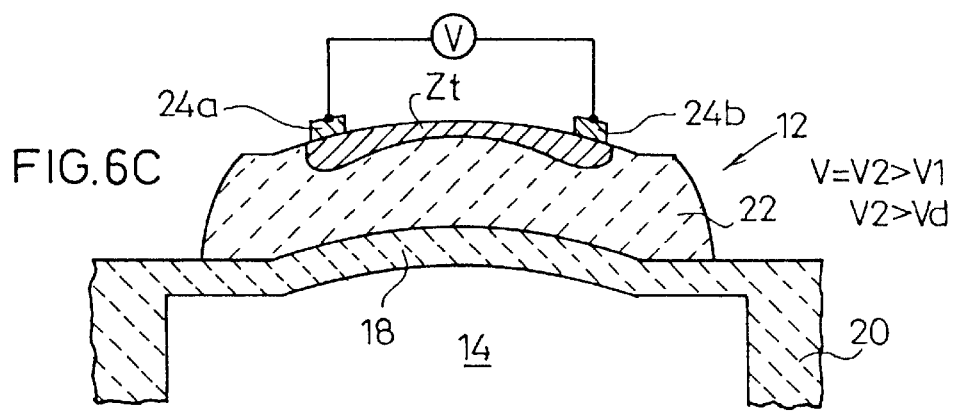
FIG.6C  V=V2>V1, V2>Vd
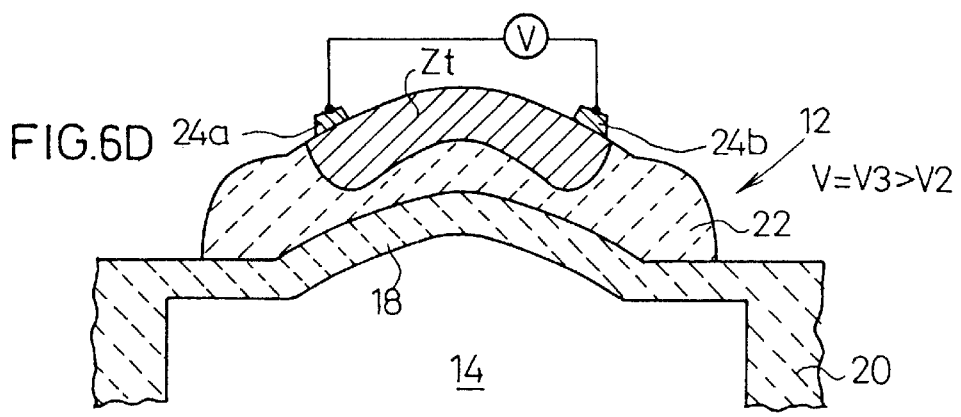
FIG.6D  V=V3>V2

|  | CONDITION OF INTERMEDIATE LAYER | DISPLACEMENT-RETAINING RATIO (%) |
|---|---|---|
| EXAMPLE 1 | WITH INTERMEDIATE LAYER OF Pt WITH THICKNESS OF 4 μm | 75 |
| EXAMPLE 2 | WITH INTERMEDIATE LAYER OF Pd WITH THICKNESS OF 2 μm | 71 |
| EXAMPLE 3 | WITH INTERMEDIATE LAYER OF Pd WITH THICKNESS OF 8 μm | 67 |
| COMPARATIVE EXAMPLE 1 | WITH INTERMEDIATE LAYER OF Pt WITH THICKNESS OF 15 μm | (NOTE 1) |
| COMPARATIVE EXAMPLE 2 | WITH INTERMEDIATE LAYER OF Pt WITH THICKNESS OF 0.5 μm | 58 |
| COMPARATIVE EXAMPLE 3 | NO INTERMEDIATE LAYER | 54 |

NOTE 1: MEASUREMENT UNSUCCESSFUL DUE TO PEELING OFF OF INTERMEDIATE LAYER

FIG. 27

| | THICKNESS OF SUBSTRATE (μm) | THICKNESS OF ANTI-FERROELECTRIC (μm) | DISPLACEMENT-RETAINING RATIO (%) |
|---|---|---|---|
| EXAMPLE 4 | 310(10, 150, 150) | 20 | 54 |
| EXAMPLE 5 | 210(10, 100, 100) | 19 | 57 |
| EXAMPLE 6 | 130(10, 60, 60) | 22 | 62 |
| EXAMPLE 7 | 50(10, 20, 20) | 19 | 70 |

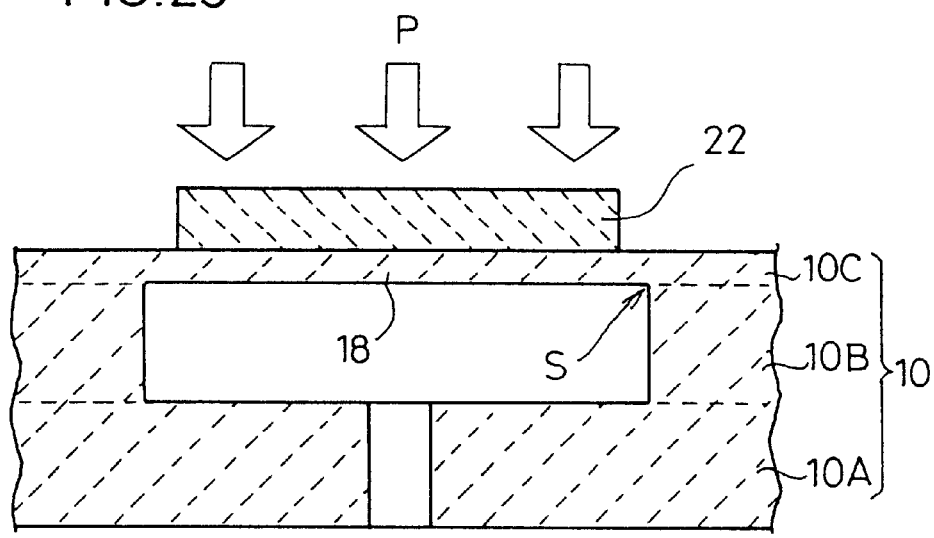

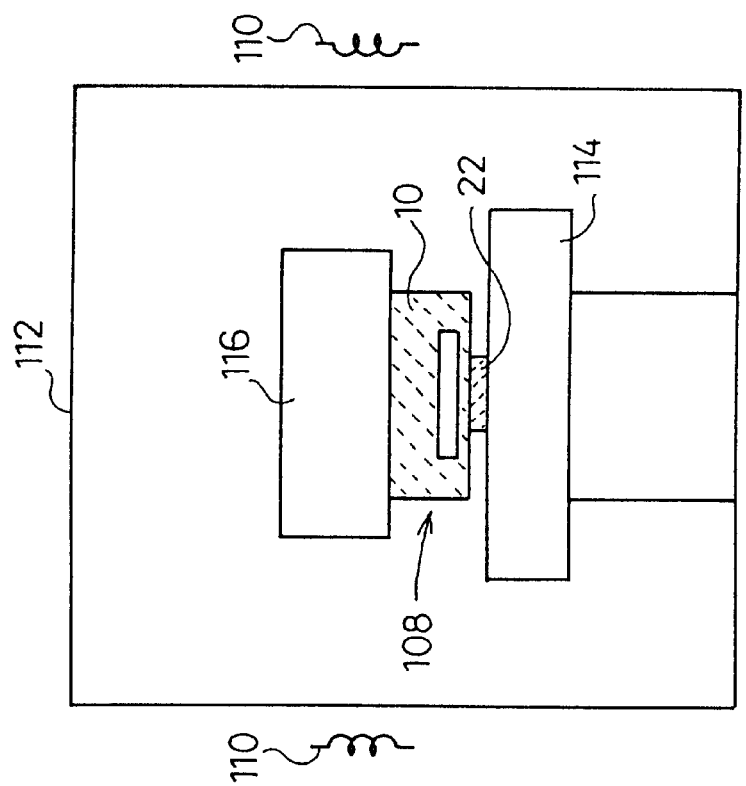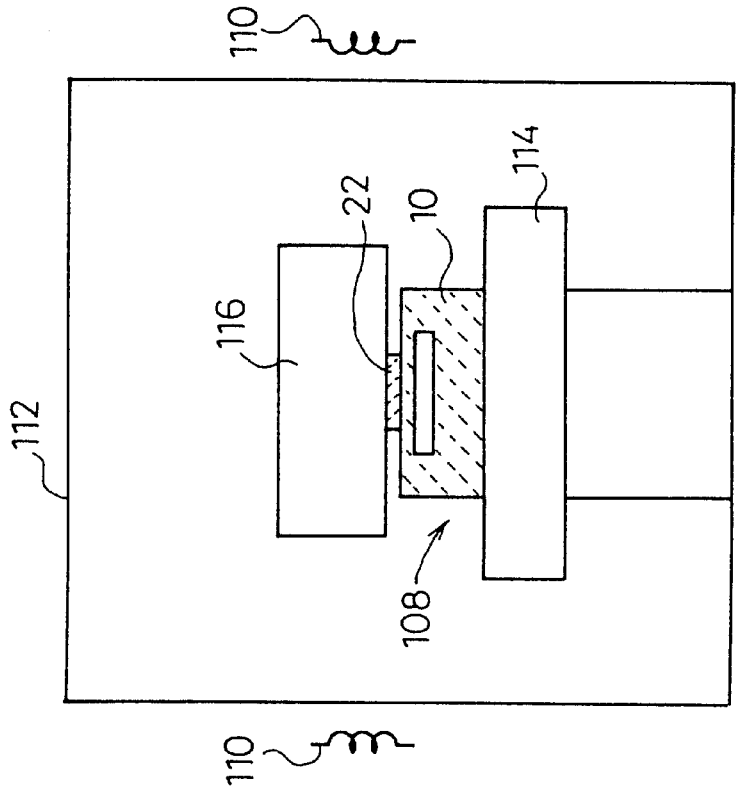

FIG. 31

| | HOT PRESS LOAD (kg/cm$^2$) | DEGREE OF DENSENESS OF FILM (%) |
|---|---|---|
| COMPARATIVE EXAMPLE 4 | 0 | 87 |
| COMPARATIVE EXAMPLE 5 | 0.3 | 89 |
| EXAMPLE 8 | 0.6 | 96 |
| COMPARATIVE EXAMPLE 6 | 1.0 | DESTRUCTION OF VIBRATING PLATE |

FIG. 34

| | SPECULATIVE COMPENSATION AMOUNT | | DISPLACEMENT-RETAINING RATIO (%) |
|---|---|---|---|
| | (%) TO PRESCRIBED $ZrO_2$ AMOUNT | (%) TO PRESCRIBED $TiO_2$ AMOUNT | |
| COMPARATIVE EXAMPLE 7 | 100 | 100 | 52 |
| EXAMPLE 9-1 | 100 | 103 | 58 |
| EXAMPLE 9-2 | 96 | 100 | 57 |
| EXAMPLE 10-1 | 96 | 103 | 62 |
| EXAMPLE 10-2 | 98 | 104 | 60 |

FIG. 36

| | POST-COMPENSATION AMOUNT OF LEAD COMPONENT (POST-COMPENSATION AMOUNT IN 100% OF LEAD COMPONENT, wt%) | DEGREE OF DENSENESS OF FILM (%) | REMARKS |
|---|---|---|---|
| COMPARATIVE EXAMPLE 10 | 0 | 82 | NO DENSIFICATION |
| EXAMPLE 11 | 3 | 90 | |
| EXAMPLE 12 | 5 | 93 | |
| EXAMPLE 13 | 10 | 94 | |
| COMPARATIVE EXAMPLE 11 | 25 | 92 | DENSIFICATION OCCURS BUT DISTRIBUTION OF LEAD IS NONUNIFORM |

FIG. 38

| | SPECIFIC SURFACE AREA OF $SnO_2$ (m²/g) | MEASUREMENT RESULT OF HYSTERESIS CHARACTERISTIC |
|---|---|---|
| COMPARATIVE EXAMPLE 12 | 5 | *1 |
| EXAMPLE 14 | 13 | *2 |
| COMPARATIVE EXAMPLE 13 | 22 | *3 |

*1: PRESENCE OF RESIDUAL $SnO_2$ PARTICLES, LARGE DISPERSION IN COMPOSITION, NO DISPLACEMENT
*2: GOOD HYSTERESIS
*3: PRESENCE OF MUTUAL AGGREGATION OF $SnO_2$ PARTICLES, LARGE DISPERSION IN COMPOSITION, NO DISPLACEMENT

FIG. 43

| | THICKNESS OF SECOND LAYER (μm) | THICKNESS OF ANTI-FERROELECTRIC FILM (μm) | DEPRESSION AMOUNT δ (μm) | DISPLACEMENT (μm) |
|---|---|---|---|---|
| EXAMPLE 15 | 3 | 20 | 3 | 3.5 |
| COMPARATIVE EXAMPLE 14 | 20 | 20 | 18 | 1.3 |
| EXAMPLE 16 | 10 | 30 | 10 | 2.9 |
| COMPARATIVE EXAMPLE 15 | 50 | 30 | 30 | 0.6 |

FIG. 44

| | DISPLACEMENT-RETAINING RATIO (%) |
|---|---|
| BULK-TYPE ELEMENT | 100~107 |
| EXAMPLE 17 | 81~95 |
| COMPARATIVE EXAMPLE 16 | 50~54 |

F I G. 46
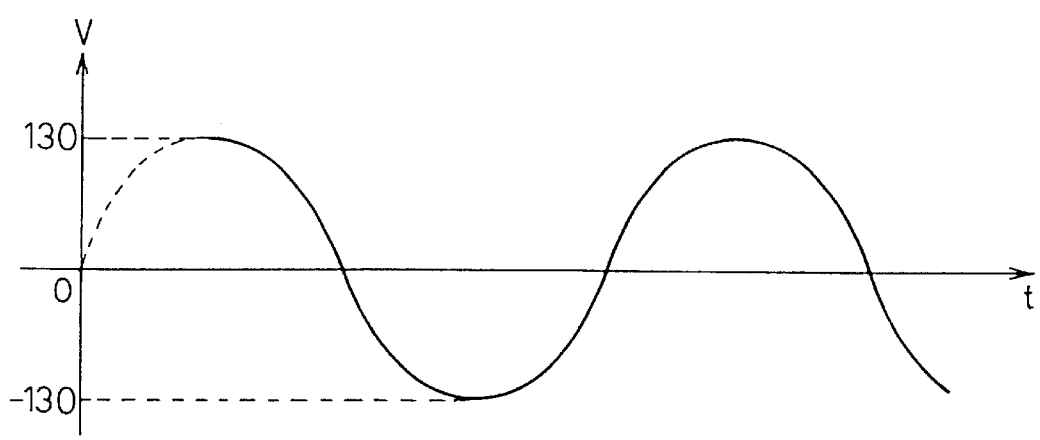

F I G. 51A
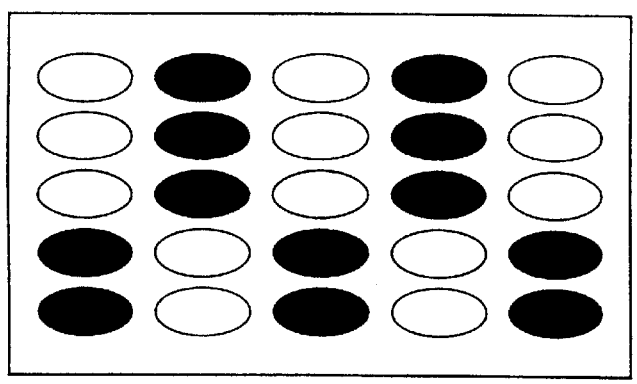
← SELECTED ROW
F I G. 51B
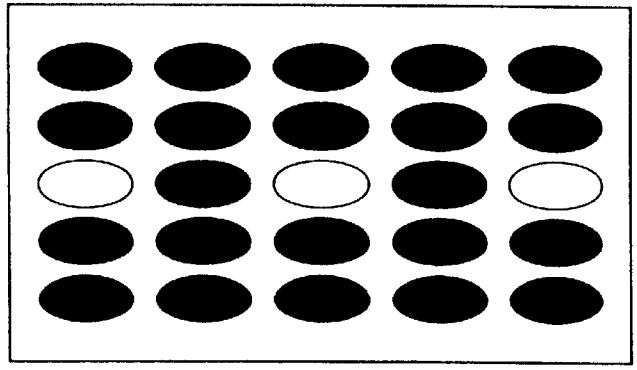
← SELECTED ROW
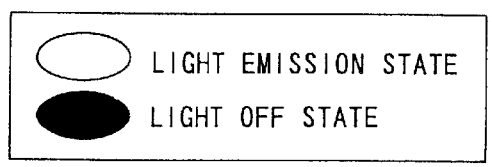
○ LIGHT EMISSION STATE
● LIGHT OFF STATE

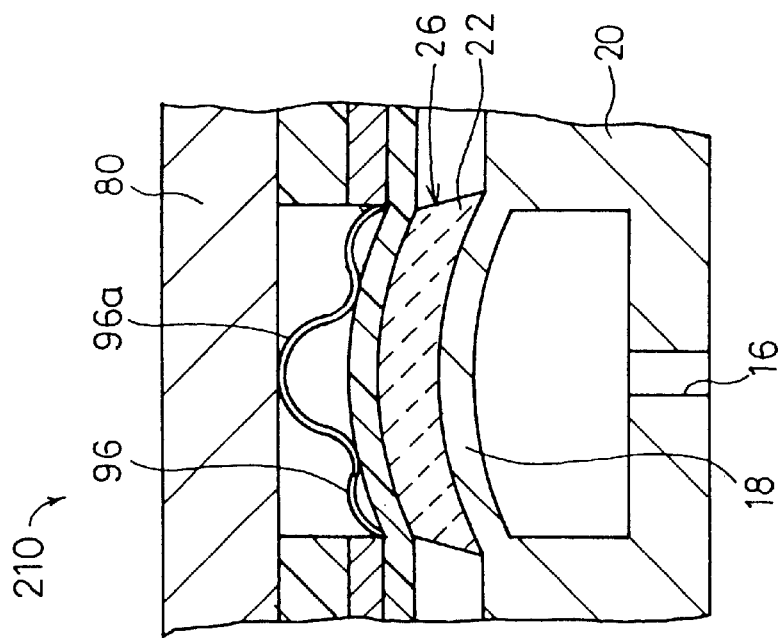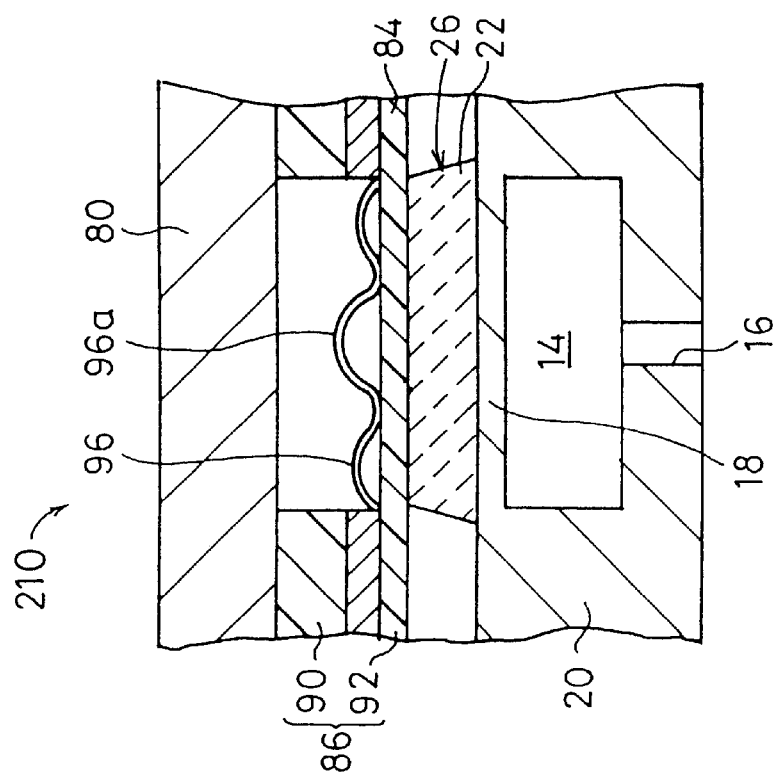

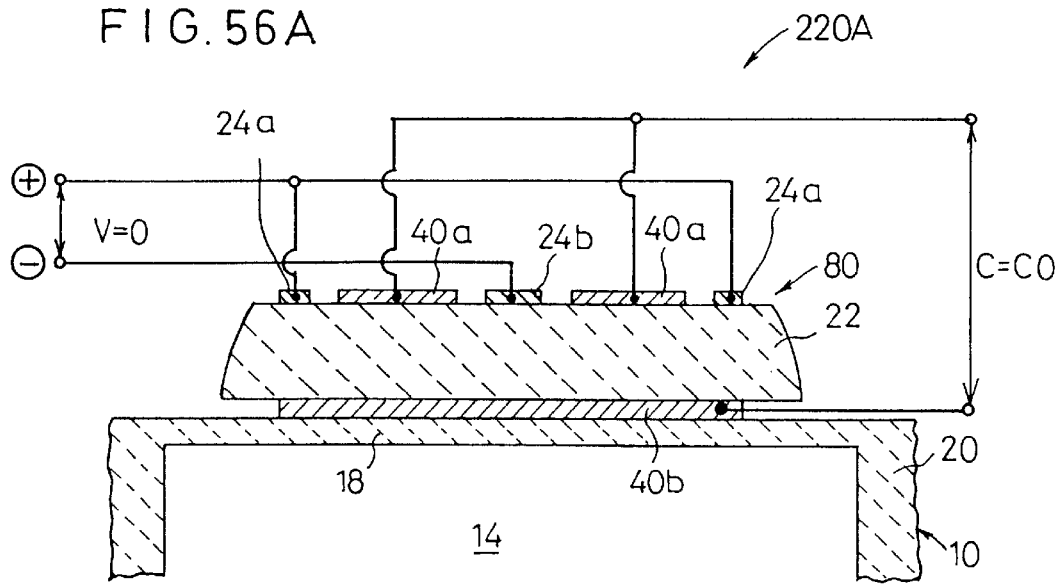
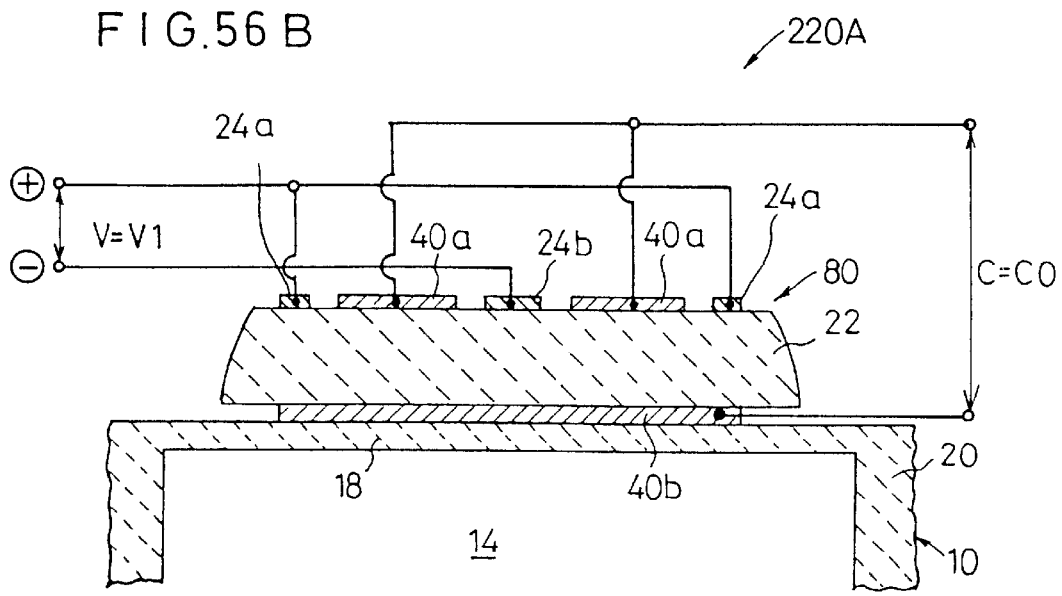

CERAMIC ELEMENT, METHOD FOR PRODUCING CERAMIC ELEMENT, DISPLAY DEVICE, RELAY DEVICE AND CAPACITOR

BACKGROUND OF THE INVENTION

The present invention relates to an element for converting electric energy into mechanical energy to be used, for example, for actuators, various vibrators, displays, and relays, or a capacitor element to be used, for example, for filters and resonance circuits. In particular, the present invention relates to a ceramic element based on the use of the phase transition between the anti-ferroelectric phase and the ferroelectric phase, a display device based on the ceramic element to be used for driving a picture element (image pixel) to perform display, a relay device based on the ceramic element to be used for driving a relay to perform switching, and a capacitor based on the ceramic element to be used for varying the capacitance.

Recently, it has been demanded, for example, in the fields of optics and precision manufacturing, to use a displacement element for adjusting the optical path length or the position on the order of submicron.

In order to respond to such a demand, development is being advanced for actuators which utilize occurrence of displacement based on the inverse piezoelectric effect caused when an electric field is applied to a piezoelectric material such as a ferroelectric substance.

In such a trend, the present applicant has also previously proposed piezoelectric/electrostrictive film-type elements made of ceramics, which can be preferably used for various applications, as described, for example, in Japanese Laid-Open Patent Publication Nos. 3-128681 and 5-49270.

The previously proposed piezoelectric/electrostrictive film-type element has such excellent features that it serves as a compact and inexpensive electromechanical conversion element with high reliability to provide a large displacement at a low driving voltage, in which the response speed is quick, and the generated force is large. The piezoelectric/electrostrictive film-type element is useful to be used, for example, as a constituting component of actuators, displays, and relays.

The piezoelectric/electrostrictive film-type element described above is operated such that the mechanical displacement is obtained in accordance with the inverse piezoelectric effect or the electrostrictive effect by applying a voltage to the piezoelectric/electrostrictive operating section (actuator element). Therefore, the piezoelectric/electrostrictive film-type element is advantageous in that the magnitude of the displacement amount can be precisely controlled with respect to the applied voltage, while it is disadvantageous in that it is difficult to obtain a large displacement-generating force when a minute element is used.

In the case of the piezoelectric/electrostrictive film-type element, when it is required to maintain a state of displacement in one direction for a certain period of time, it is necessary to continuously apply the voltage to the piezoelectric/electrostrictive film operating section.

For this reason, for example, when the piezoelectric/electrostrictive film-type element is applied to a display device as disclosed by the present inventors in Japanese Laid-Open Patent Publication No. 7-287176, it is necessary to continuously apply the voltage to the piezoelectric/electrostrictive film operating section throughout the period in which the light emission state should be maintained.

In this case, for example, when a display device, which comprises a large number of light-emitting elements disposed two-dimensionally, is produced, it is necessary to arrange electric wiring for driving each of the elements one by one. Such an arrangement involves large restriction in view of design and production.

SUMMARY OF THE INVENTION

The present invention has been made considering the problems as described above, an object of which is to provide a ceramic element which makes it possible to precisely control the magnitude of displacement amount with respect to an applied voltage, and obtain a large displacement-generating force exceeding those obtained by the piezoelectric/electrostrictive film-type element even when a minute element is used.

Another object of the present invention is to provide a ceramic element which makes it possible to maintain a displacement amount approximately equivalent to that obtained when a driving voltage is applied, in the no voltage-loaded state or in a low voltage-loaded state after completion of application of the driving voltage, in addition to the condition described above.

Still another object of the present invention is to provide a ceramic element which makes it possible to simplify electric wiring for driving the element and effectively reduce the production cost when a variety of applications (for example, display devices and filters) are constructed, in addition to the condition described above.

Still another object of the present invention is to provide a display device which consumes less electric power and which makes it possible to simplify electric wiring for driving the display device and effectively reduce the production cost and the running cost.

Still another object of the present invention is to provide a relay device which consumes less electric power and which makes it possible to simplify electric wiring for driving the relay device, effectively reduce the production cost and the running cost, and realize various types of switching operations.

Still another object of the present invention is to provide a capacitor which makes it possible to easily construct a thin-type capacitance-variable capacitor with its capacitance changeable in an analog manner, and facilitate miniaturization of, for example, parametric amplifiers incorporated with the variable capacitor, automatic frequency control circuits (AFC), and various types of communication instruments.

According to the present invention, there is provided a ceramic element comprising an operating section having an anti-ferroelectric film and at least a pair of electrodes formed on the anti-ferroelectric film, a vibrating section for supporting the operating section, and a fixed section for supporting the vibrating section in a vibrating manner.

The principle of operation of the anti-ferroelectric film will now be explained. When the ferroelectric phase is induced in the anti-ferroelectric film in accordance with the change in, for example, the temperature, the stress, and the electric field, then the strain $X_F$ is given by the following expression:

$$X_F = Q(1+\Omega)P_F^2$$

wherein $P_F$ represents the ferroelectric polarization, and it satisfies $P_F = (Pa+Pb)/2$, and wherein Pa and Pb represent the sub-lattice polarization.

In the case of the perovskite type crystal, the electrostrictive constant $Qh$ $(=Q_{11}+2Q_{12})$ has a positive value.

Therefore, the spontaneous volume strain of an ordinary ferroelectric is always positive, while in the case of the anti-ferroelectric, its spontaneous strain $x_A$ may be positive or negative depending on the value of $\Omega$. In the case of lead zirconate ($PbZrO_3$), there is given $\Omega=1.8$.

It is assumed that the absolute values $|Pa|$, $|Pb|$ of the sub-lattice polarization are not changed so much before and after the anti-ferroelectric phase-ferroelectric phase transition. On this assumption, the amount of strain change $\Delta x$ involved in the transition is represented as follows:

$$\Delta x = x_F - x_A = 2Q\Omega P_F^2$$

Further, it is known that large displacement is obtained when the anti-ferroelectric phase-ferroelectric phase transition is utilized, rather than when the paraelectric phase-anti-ferroelectric phase transition is used.

It is known, for example, that a ceramic (polycrystal) derived from lead zirconate titanate (PZT) successively causes transition to the pseudo-tetragonal anti-ferroelectric phase and the orthorhombic ferroelectric phase in accordance with the decrease in temperature from the cubic paraelectric phase which is the phase at a high temperature. Therefore, when a composition, in which the anti-ferroelectric phase is stable at room temperature, is selected, it is possible to easily induce the ferroelectric phase by applying an external electric field. It is expected that a large change in strain takes place in accordance therewith.

Once the ferroelectric phase is induced, it is not returned to the anti-ferroelectric phase even when the electric field is made to be zero, exhibiting the "effect to store the strain state of the ferroelectric phase (shape memory effect)". In order to make restoration to the original anti-ferroelectric state, a small reverse bias voltage may be applied, or temperature-programmed annealing may be performed.

That is, the anti-ferroelectric causes the electric field-induced phase transition by applying the external magnetic field. Therefore, the phase transition occurs from the anti-ferroelectric phase to the ferroelectric phase to cause the volume change by applying, to the pair of electrodes, a voltage not less than a predetermined voltage. Thus, it is possible to easily obtain the mechanical displacement.

Since the displacement amount is brought about by the phase transition, it is impossible, unlike the piezoelectric/electrostrictive element, to accurately control the magnitude of the displacement amount by selecting the value of the voltage to be applied. However, on the contrary, the ceramic element exhibits a characteristic that the displacement can be continuously maintained even when the applied voltage is lowered provided that the applied voltage is not lowered up to a predetermined voltage at which the phase transition occurs from the ferroelectric phase to the original anti-ferroelectric phase.

Based on this knowledge, when the ceramic element according to the present invention is considered, the ceramic element has the structure in which the operating section having the anti-ferroelectric film is formed on the vibrating section which is vibratingly supported by the fixed section. Accordingly, when the predetermined voltage is applied to the pair of electrodes, the anti-ferroelectric film of the operating section undergoes the electric field-induced phase transition caused by the external electric field brought about by the predetermined voltage. The mechanical displacement is generated in accordance with the phase transition. The displacement is amplified by the vibrating section, and the operating section is displaced in a first direction (for example, in a direction for the operating section to face the free space).

Once the operating section is displaced in the first direction, the displacement is maintained as it is even when the voltage application to the pair of electrodes is stopped (for example, when the electric field is made to be zero). Accordingly, it is unnecessary to continuously apply the voltage to the pair of electrodes even when the displacement generated in the operating section is required to be maintained for a certain period of time. In order to restore the displacement generated in the operating section to the original state, a small reverse bias voltage, specifically a voltage to cause the phase transition from the ferroelectric phase to the anti-ferroelectric phase may be applied to the pair of electrodes.

As described above, in the ceramic element according to the present invention, the amount of mechanical displacement is changed in a digital manner depending on the voltage applied to the pair of electrodes. Further, the displacement amount, which is equivalent to that obtained upon the voltage application, can be maintained in the no voltage-loaded state after completion of application of the voltage.

It is preferable for the ceramic element constructed as described above that the pair of electrodes have a form in which an intensity of an electric field, which is generated by applying a voltage to the pair of electrodes, spatially differs. Accordingly, the following phenomenon occurs. That is, for example, a part of the region of the operating section is displaced by applying a low voltage, and the other region is not displaced. After that, for example, a high voltage is applied to the pair of electrodes, then the other region also undergoes displacement, and the entire operating section makes displacement.

In other words, the operating section successively makes displacement in a digital manner, starting from the portion to which a relatively high electric field is consecutively applied in accordance with the increase in the applied voltage.

As described above, in the ceramic element according to the present invention, a plurality of displacement forms and/or displacement distributions can be selected depending on the value of the voltage applied to the pair of electrodes. Thus, it is possible to realize semi-analog or quasi-analog mechanical displacement.

Specifically, in order to obtain the element which is excellent in selectivity, for example, for the displacement form, the ceramic element may have a region in which a distance between the pair of electrodes is large and a region in which the distance between the pair of electrodes is small. The region in which the distance between the electrodes is large and the region in which the distance between the electrodes is small are formed by using a pattern of the pair of electrodes. Accordingly, when a constant voltage is applied to the pair of electrodes, a high electric field is always generated in the small-distance region than in the large-distance region. Therefore, when the applied voltage is low, only the portion of the anti-ferroelectric film corresponding to the small-distance region is subjected to the phase transition at a certain voltage to cause displacement. Subsequently, when a larger voltage is applied to the pair of electrodes, the large-distance region is subjected to the phase transition at a certain voltage to cause displacement. As a result, the following effect can be obtained. That is, two displacement forms or displacement distributions can be arbitrarily selected by selecting any one of the two applied voltage levels.

Of course, it is possible to realize those based on three or more voltage levels to be applied to the pair of electrodes and three or more displacement forms or displacement distributions.

It is preferable for the ceramic element constructed as described above that the anti-ferroelectric film after polarization has a region in which its average dielectric constant is increased in an analog manner in accordance with a voltage applied to the electrodes. In this embodiment, when the voltage is applied to the electrodes, the electric field-induced phase transition is caused over a region corresponding to the applied voltage in the anti-ferroelectric film of the operating section. The term "applied voltage" refers to an absolute value of the positive or negative voltage.

The operation of the ceramic element according to the present invention will be specifically explained. At first, until the applied voltage arrives at a predetermined voltage in accordance with the gradual increase in applied voltage, the electric field generated in the operating section is weak. Therefore, the electric field-induced phase transition (hereinafter simply referred to as "phase transition") is not caused in the anti-ferroelectric film.

When the applied voltage exceeds the predetermined voltage, a sufficient electric field intensity is provided to cause the phase transition in a region in which the distance between the electrodes is shortest and in a region which is nearest to the electrodes. The phase transition occurs in these regions, and the mechanical displacement is generated in accordance with the phase transition. The displacement is amplified by the vibrating section, and the operating section is displaced in the first direction (for example, in the direction for the operating section to face the free space).

When the applied voltage is further increased, the region, which has the sufficient electric field intensity to cause the phase transition, is gradually widened. The phase transition also occurs in a region in which the distance between the electrodes is long and in a region which is far from the electrodes. In this stage, the mechanical displacement of the operating section is increased in accordance with the spread of the phase transition area.

That is, in the ceramic element according to the present invention, the displacement in the first direction generated in the operating section is increased in an analog manner in accordance with the increase in applied voltage.

Once the operating section is displaced in the first direction, the displacement is maintained as it is even when the voltage application to the pair of electrodes is stopped (for example, when the electric field is made to be zero). Accordingly, it is unnecessary to continuously apply the voltage to the pair of electrodes even when the displacement generated in the operating section is required to be maintained for a certain period of time. In order to restore the displacement generated in the operating section to the original state, a small reverse bias voltage, specifically a voltage to cause the phase transition from the ferroelectric phase to the anti-ferroelectric phase may be applied to the pair of electrodes.

As described above, in the ceramic element according to the present invention, the mechanical displacement amount is changed in the analog manner depending on the voltage applied to the electrodes. The displacement amount, which is equivalent to that obtained upon the voltage application, can be maintained in the no voltage-loaded state after completion of the application of the voltage to the electrodes.

Accordingly, it is possible to precisely control the magnitude of the displacement amount corresponding to the applied voltage. Moreover, it is possible to obtain a large displacement-generating force which exceeds those obtained in the piezoelectric/electrostrictive film-type element, even when a minute element is used.

In the ceramic element according to the present invention, the displacement amount, which is approximately the same as that obtained upon application of the driving voltage, can be maintained in the no voltage-loaded state and the low voltage-loaded state after completion of the application of the driving voltage. When the ceramic element is applied to a variety of applications (for example, display devices and filters), it is possible to simplify electric wiring for driving the element and effectively reduce the production cost.

In the ceramic element as described above, it is also preferable to combine a plurality of regions in which the average dielectric constant is increased in an analog manner depending on the applied voltage. In this embodiment, a plurality of areas exist depending on the applied voltage, in which the displacement ratio (displacement increase rate) differs. A plurality of displacement forms and/or displacement distributions can be selected depending on the value of the applied voltage. Thus, it is possible to obtain the element which is excellent in, for example, selectivity for the displacement form.

Specifically, for example, when it is intended to obtain the element excellent in selectivity for the displacement form, it is preferable to provide a region in which a distance between the pair of electrodes is large and a region in which the distance between the pair of electrodes is small. The region in which the distance between the electrodes is large and the region in which the distance between the electrodes is small are formed by using a pattern of the pair of electrodes. Accordingly, when a constant voltage is applied to the pair of electrodes, a high electric field is always generated in the small-distance region than in the large-distance region. Therefore, when the applied voltage is low, only the portion of the anti-ferroelectric film corresponding to the small-distance region is subjected to the phase transition at a certain voltage to cause displacement. Subsequently, when a larger voltage is applied to the pair of electrodes, the large-distance region is subjected to the phase transition at a certain voltage to cause displacement. As a result, the following effect can be obtained. That is, two displacement forms or displacement distributions can be arbitrarily selected by selecting any one of the two applied voltage levels.

Of course, it is possible to realize those based on three or more voltage levels to be applied to the pair of electrodes and three or more displacement forms or displacement distributions.

It is preferable for the ceramic element constructed as described above that the vibrating section and the fixed section are provided on a substrate formed by stacking ceramic green sheets or ceramic green tapes, followed by integrated sintering.

In this embodiment, it is preferable that at least the vibrating section is principally formed of partially stabilized zirconia. Accordingly, it is possible to obtain the vibrating section having high strength and high toughness, making it possible to obtain a long service life of the ceramic element.

It is preferable for the ceramic element constructed as described above that the anti-ferroelectric film principally has the following composition:

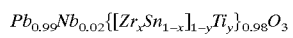

wherein $0.5 < x < 0.6$, $0.05 < y < 0.063$, $0.01 < Nb < 0.03$.

In this embodiment, the large displacement is obtained as compared with the paraelectric phase-anti-ferroelectric phase transition, because the anti-ferroelectric phase-ferroelectric phase transition is utilized. Especially, when the composition described above is used, the anti-ferroelectric phase is stable at room temperature. Therefore, it is possible to easily induce the anti-ferroelectric phase by applying an external electric field, in accordance with which it is possible to cause large strain change.

It is especially preferable that the composition contains Ag in an amount of 1 to 10% by weight as converted into an amount of silver oxide, as a material for the anti-ferroelectric film, in order to obtain more precise and larger displacement, and in order to obtain more stable shape memory characteristics.

In the embodiment described above, Ag may be contained by means of the following methods. That is, Ag may be added in a form of oxide together with other material powders during the process to prepare the anti-ferroelectric film. Alternatively, Ag may be added to a previously prepared anti-ferroelectric material powder, as silver oxide or as an aqueous solution of silver nitrate. Further alternatively, Ag may be mixed in a form of silver oxide powder or in a form of organic metal compound of Ag when a printing paste is prepared.

In a preferred embodiment, the substrate may be formed by stacking a spacer plate provided with a window and a closing plate to be superimposed on one side of the spacer plate so that the window is covered therewith, followed by integrated sintering. In this embodiment, the operating section can be formed in a minute region on the vibrating section, making it possible to realize high density integration for the operating section.

In another preferred embodiment, the substrate may be formed by stacking at least one layer of a base plate to be superimposed on the other side of the spacer plate so that the window is covered therewith, the base plate having one or more through-holes at a position corresponding to the window, followed by integrated sintering together with the spacer plate and the closing plate. In this embodiment, a stacked compact, which is composed of the spacer plate, the closing plate, and the base plate, is integrally sintered to form the vibrating section and the fixed section. However, in general, it is feared that the sintered compact itself may be destroyed due to the increase in pressure at the window, if the integrated sintering is performed while closing both openings of the window. However, in the present invention, one or more through-holes are provided through the base plate. Therefore, the pressure in the window generated during the integrated sintering is released to the outside through the through-hole. Accordingly, the destruction of the stacked compact is avoided, which would be otherwise caused during the integrated sintering. This feature is advantageous to improve the reliability of the vibrating section and the fixed section.

The pair of electrodes are formed on at least a part of the anti-ferroelectric film in accordance with the following embodiments. That is, both of the pair of electrodes may be formed on a first principal surface of the anti-ferroelectric film. Alternatively, one of the pair of electrodes may be formed on a first principal surface of the anti-ferroelectric film, and the other electrode may be formed on a second principal surface of the anti-ferroelectric film.

Especially, when the pair of electrodes are formed on the first principal surface of the anti-ferroelectric film, it is preferable to satisfy p/t≦2.5 provided that an average film thickness of the anti-ferroelectric film is t, and a pitch between the electrodes is p. It is preferable that the vibrating section principally comprises partially stabilized zirconia containing not less than 0.5 mole % of alumina. In this embodiment, the anti-ferroelectric film is directly formed on the vibrating section. Therefore, the anti-ferroelectric film is tightly joined to the vibrating section. Thus, it is possible to obtain the ceramic element having a large displacement amount.

When one of the electrodes is formed on the first principal surface of the anti-ferroelectric film, and the other electrode is formed on the second principal surface of the anti-ferroelectric film, it is preferable to satisfy A/B≦2 or A/B≦0.5 provided that an area of the one electrode is A, and an area of the other electrode is B. Alternatively, it is preferable that a region interposed between the electrodes has a film thickness distribution which involves dispersion of not less than 20%.

Especially, when the electrodes have the form as described above, it is preferable that the vibrating section is principally composed of partially stabilized zirconia containing not less than 0.5 mole % of titanium oxide. In this embodiment, the anti-ferroelectric film is tightly joined to the vibrating section by the aid of the other electrode. Therefore, the reliability is improved. Further, the anti-ferroelectric film is not secured to the vibrating section in the region in which the electrode does not exist on the surface to which the anti-ferroelectric film and the vibrating section are opposed. Accordingly, it is possible to obtain the ceramic element having a large displacement amount without restricting the vibrating displacement of the operating section.

When the pair of electrodes are formed on the first principal surface of the anti-ferroelectric film, an intermediate layer may be provided between the vibrating section and the anti-ferroelectric film. In this embodiment, the intermediate layer is preferably a metal of Pt or Pd or an alloy of the both metals. It is appropriate that a thickness of the intermediate layer is not less than 1 $\mu$m and not more than 10 $\mu$m. It is preferable that the thickness of the intermediate layer is not less than 2 $\mu$m and not more than 6 $\mu$m.

It is preferable for the ceramic element constructed as described above that a thickness of the vibrating section is thinner than a thickness of the anti-ferroelectric film. In this embodiment, it is appropriate that a thickness tb of the substrate satisfies tb≦350 $\mu$m when Ln<tv×15 is satisfied provided that a boundary portion between an upper surface of the fixed section and an upper surface of the vibrating section concerning a shortest dimension passing through a center of the vibrating section is defined as a boundary point, a distance from the boundary point to an end of a region in which the anti-ferroelectric film is formed is Ln, and a thickness of the vibrating section is tv. Preferably, tb≦250 $\mu$m is satisfied. More preferably, tb≦130 $\mu$m is satisfied. Most preferably, tb≦70 $\mu$m is satisfied.

When the distance Ln from the boundary point to the end of the region in which the anti-ferroelectric film is formed satisfies Ln≧tv×15, the thickness tv of the vibrating section is preferably 1 to 50 $\mu$m, and more preferably 3 to 20 $\mu$m. On the other hand, an average thickness of the anti-ferroelectric film 22 is preferably 1 to 100 $\mu$m, more preferably 3 to 50 $\mu$m, and most preferably 5 to 40 $\mu$m It is desirable that the anti-ferroelectric film formed on the substrate is obtained by performing a sintering treatment while applying a load. In this embodiment, it is preferable that the load is not less than 0.4 kg/cm². Further, it is preferable that a depth of a space disposed just under the vibrating section is not more than 10 $\mu$m.

According to another aspect of the present invention, there is provided a method for producing a ceramic element comprising an operating section having an anti-ferroelectric film and at least a pair of electrodes formed on the anti-ferroelectric film, a vibrating section for supporting the operating section, and a fixed section for supporting the vibrating section in a vibrating manner; the method comprising the steps of stacking ceramic green sheets or ceramic green tapes followed by integrated sintering to prepare a substrate having the vibrating section and the fixed section; forming the anti-ferroelectric film on the vibrating section of the substrate; and sintering the anti-ferroelectric film.

In this aspect, it is preferable that the anti-ferroelectric film is subjected to a sintering treatment while applying a load thereto. More desirably, the load is not less than 0.4 $kg/cm^2$.

In the production method described above, it is preferable that an anti-ferroelectric ceramic material is prepared to have a powder composition which is deviated from an optimum composition when a powder of the anti-ferroelectric ceramic material is prepared to produce the anti-ferroelectric film, while speculating variation in composition due to mutual diffusion with respect to the vibrating section during the sintering for the anti-ferroelectric film. In this embodiment, the material is prepared such that $ZrO_2$ is weighed in an amount smaller than its prescribed amount, and $TiO_2$ is weighed in an amount larger than its prescribed amount. Specifically, it is preferable that the amount of $ZrO_2$ is 95 to 98% provided that the prescribed amount is 100%, and/or the amount of $TiO_2$ is 102 to 104% provided that the prescribed amount is 100%.

It is preferable that when a powder of an anti-ferroelectric ceramic material is prepared to produce the anti-ferroelectric film, the powder is previously prepared in a composition in which lead oxide is contained in an amount smaller than its prescribed blending amount, and then an amount of shortage of lead component is compensated and mixed afterward in a form of lead oxide.

In this embodiment, an amount of post-compensation for the lead component is preferably not less than 3% and not more than 20% of the prescribed blending amount, and more preferably not less than 5% and not more than 15% thereof.

It is preferable that when a powder of an anti-ferroelectric ceramic material is prepared to produce the anti-ferroelectric film, a specific surface area of tin oxide to be used as a raw material is not less than 8 $m^2/g$ and not more than 20 $m^2/g$.

In the production method described above, it is preferable that the substrate is formed by stacking a second layer provided with a window, a third layer to be superimposed on one side of the second layer so that the window is covered therewith, and a first layer to be superimposed on the other side of the second layer so that the window is covered therewith, the first layer having one or more through-holes at a position corresponding to the window, followed by integrated sintering to produce the substrate made of ceramic.

In another embodiment of the production method, it is preferable that a paste composed of a ceramic material is formed as a pattern on an upper surface of a first layer having one or more through-holes, a second layer having a window is formed at a portion corresponding to the through-hole, and then a third layer is stacked to close the window, followed by integrated sintering to produce the substrate made of ceramic.

When the substrate is produced, it is preferable that a thickness of the second layer is 1 to 15 $\mu$m.

According to still another aspect of the present invention, there is provided a display device comprising an optical waveguide plate for introducing light thereinto, and a driving unit provided opposingly to one plate surface of the optical waveguide plate and including a number of actuator elements arranged corresponding to a large number of picture elements, for displaying, on the optical waveguide plate, a picture image corresponding to an image signal by controlling leakage light at a predetermined portion of the optical waveguide plate by controlling displacement action of each of the actuator elements in a direction to make contact or separation with respect to the optical waveguide plate in accordance with an attribute of the image signal to be inputted; wherein the actuator element comprises a main actuator element having an anti-ferroelectric film and at least a pair of electrodes formed on the anti-ferroelectric film, a vibrating section for supporting the main actuator element, and a fixed section for vibratingly supporting the vibrating section, the display device further comprising a displacement-transmitting section for transmitting, to the optical waveguide plate, the displacement action of the actuator element generated by applying a voltage to the pair of electrodes.

Accordingly, at first, all of the light, which is introduced, for example, from the end of the optical waveguide plate, is totally reflected at the inside of the optical waveguide plate without being transmitted through the front and back surfaces of the optical waveguide plate, by regulating the magnitude of the refractive index of the optical waveguide plate. In this state, for example, when the displacement-transmitting section contacts with the back surface of the optical waveguide plate at a distance of not more than the wavelength of the light, then the light, which has been totally reflected, is transmitted to the surface of the displacement-transmitting section contacting with the back surface of the optical waveguide plate. The light, which has once reached the surface of the displacement-transmitting section, is reflected by the surface of the displacement-transmitting section, and the light behaves as scattered light. A part of the scattered light is reflected again at the inside of the optical waveguide plate. However, almost all of the scattered light is not reflected by the optical waveguide plate, and the light is transmitted through the front surface of the optical waveguide plate.

As described above, it is possible to control the presence or absence of light emission (leakage light) at the front surface of the optical waveguide plate, depending on the presence or absence of the contact of the displacement-transmitting section disposed at the back of the optical waveguide plate. In this case, one unit for allowing the displacement-transmitting plate to make the displacement action in the direction to give contact or separation with respect to the optical waveguide plate may be regarded as one picture element. Thus, a picture image (for example, characters and graphics) corresponding to an image signal can be displayed on the front surface of the optical waveguide plate in the same manner as the cathode ray tube and the liquid crystal display device, by arranging a large number of such picture elements in a matrix form, and controlling the displacement action of each of the picture elements in accordance with an attribute of the inputted image signal.

According to still another aspect of the present invention, there is provided a relay device comprising an opposing terminal section, and a driving unit provided opposingly to one side of the opposing terminal section and including a number of actuator elements arranged corresponding to a large number of switching elements, for switching and controlling ON/OFF operation of the switching element by controlling displacement action of each of the actuator elements in a direction to make contact or separation with respect to the opposing terminal in accordance with an attribute of a driving signal to be inputted; wherein the actuator element comprises a main actuator element having an anti-ferroelectric film and at least a pair of electrodes formed on the anti-ferroelectric film, a vibrating section for supporting the main actuator element, and a fixed section for vibratingly supporting the vibrating section, the relay device further comprising a signal terminal section for transmitting, to the opposing terminal section, the displacement action of the actuator element generated by applying a voltage to the pair of electrodes.

Accordingly, the signal terminal section of one of the large number of switching elements contacts with the opposing terminal section, the signal terminal section is electrically connected to the opposing terminal section. A signal is transmitted between the signal terminal section and the opposing terminal section. Thus, for example, the ON operation is performed.

As described above, it is possible to control the ON/OFF operation of the large number of switching elements depending on the presence or absence of the contact of the signal terminal section disposed at the back of the opposing terminal section. In this case, one unit for allowing the signal terminal section to make the displacement action in the direction to give contact or separation with respect to the opposing terminal section may be regarded as one switching element. Thus, a large number of combinations of switching forms can be provided, for example, by arranging a large number of such switching elements in a matrix form, and controlling the displacement action of each of the switching elements in accordance with an attribute of the inputted switching signal.

The relay device according to the present invention includes the main actuator element for making selective displacement of the signal terminal section, the main actuator element comprising the anti-ferroelectric film, and at least one pair of electrodes formed on the anti-ferroelectric film. In this arrangement, when a predetermined voltage is applied to the pair of electrodes, an electric field is generated in the main actuator element depending on the applied voltage. The generated electric field allows the anti-ferroelectric film to make displacement, for example, in the first direction. The displacement of the anti-ferroelectric film in the first direction causes the signal terminal section to displace toward the opposing terminal section. Thus, the ON operation of the switching element is induced as described above.

Especially, as described above, once the anti-ferroelectric film undergoes the displacement, the displacement is maintained even when the no voltage-loaded state is given. Therefore, after the voltage is applied to the necessary switching element for performing the switching operation to displace the main actuator element of the necessary switching element, the displacement is maintained to continue the ON operation of the necessary switching element over a period until the displacement is counteracted, even when the voltage application to the pair of electrodes concerning the necessary switching element is stopped. Accordingly, electric power consumption is greatly reduced, and it is possible to realize reduction of running cost.

When the switching control is performed by specifying rows and columns, it is enough to apply the voltage to only a switching element column corresponding to a concerning row. It is unnecessary to consider voltage application to the other switching element columns. Therefore, when electric wiring is arranged for driving the element, it is unnecessary to arrange wiring for each of elements one by one in an individual manner. Thus, it is possible to simplify the electric wiring. This results in the reduction of load exerted on the system for supplying the driving voltage. Accordingly, it is possible to simplify the mechanical structure and the circuit arrangement and reduce the production cost.

According to still another aspect of the present invention, there is provided a capacitor comprising a vibrating section for supporting a capacitor unit, and a fixed section for vibratingly supporting the vibrating section, wherein the capacitor unit comprises an anti-ferroelectric film formed on the vibrating section, a pair of control electrodes formed on an upper surface of the anti-ferroelectric film, and both terminal electrodes of the capacitor formed on the upper surface and a lower surface of the anti-ferroelectric film respectively.

Accordingly, it is possible to easily construct a capacitance-variable capacitor in which the capacitance appearing between the both terminal electrodes is changed in an analog manner in accordance with the increase in voltage applied to the pair of control electrodes. Further, the capacitor can be formed as one of the thin film-type. Therefore, it is possible to facilitate miniaturization of, for example, parametric amplifiers incorporated with the variable capacitor, automatic frequency control circuits (AFC), and various types of communication instruments.

BRIEF DESCRIPTION OF THE DRAWINGS

FIG. 6A illustrates a state in which a voltage V=0 is applied to the pair of electrodes of the actuator element of the ceramic element (analog displacement type) according to the first embodiment.

FIG. 6B illustrates a state in which a voltage V=V1 is applied to the pair of electrodes of the actuator element.

FIG. 6C illustrates a state in which a voltage V=V2 is applied to the pair of electrodes of the actuator element.

FIG. 6D illustrates a state in which a voltage V=V3 is applied to the pair of electrodes of the actuator element.

FIG. 26 shows a table depicting results obtained in a first illustrative experiment (illustrative experiment to observe the change in displacement-retaining ratio depending on the thickness of the intermediate layer).

FIG. 27 shows a table depicting results obtained in a second illustrative experiment (illustrative experiment to observe the change in displacement-retaining ratio depending on the thickness of the substrate).

FIG. 29 illustrates the hot press method.

FIG. 30A schematically illustrates a first specified technique of the hot press method.

FIG. 30B schematically illustrates a second specified technique of the hot press method.

FIG. 31 shows a table depicting results obtained in a third illustrative experiment (illustrative experiment to observe the change in degree of denseness of the anti-ferroelectric film depending on the hot press load).

FIG. 34 shows a table depicting results obtained in a fourth illustrative experiment (illustrative experiment to observe the change in displacement-retaining ratio depending on the speculative compensation amount).

FIG. 36 shows a table depicting results obtained in a fifth illustrative experiment (illustrative experiment to observe the change in degree of denseness of the film depending on the post-compensation amount for lead component).

FIG. 38 shows a table depicting results obtained in a sixth illustrative experiment (illustrative experiment to observe the change in hysteresis characteristic depending on the difference in specific surface area of $SnO_2$).

FIG. 43 shows a table depicting results of the seventh illustrative experiment.

FIG. 44 shows a table depicting results of an eighth illustrative experiment (illustrative experiment to observe the hysteresis characteristic (voltage-bending displacement characteristic) and the difference in displacement-retaining ratio for each of Example 17 and Comparative Example 16).

FIG. 46 shows a timing chart illustrating an electric potential waveform to be applied to the pair of electrodes in order to measure the voltage-bending displacement characteristic concerning Example 17 and Comparative Example 16.

FIG. 51A illustrates operation (light emission state and light off state) of the display device concerning the applied embodiment.

FIG. 51B illustrates operation (light emission state and light off state) of a display device concerning a comparative example.

FIG. 55A illustrates the embodiment in which a plate spring is in a state of no contact with respect to an opposing terminal plate without displacing the actuator element (switching element) of the relay device concerning the applied embodiment.

FIG. 55B illustrates the embodiment in which the plate spring is in a state of contact with respect to the opposing terminal plate by displacing the actuator element (switching element) of the relay device concerning the applied embodiment.

FIG. 56A illustrates a state in which a voltage V=0 is applied to a pair of control electrodes of a capacitor unit concerning a first applied embodiment wherein the ceramic element according to the first embodiment (analog displacement type) is applied to a capacitance-variable capacitor.

FIG. 56B illustrates a state in which a voltage V=V1 is applied to the pair of control electrodes of the capacitor unit.

DETAILED DESCRIPTION OF THE INVENTION

Three illustrative embodiments of the ceramic element according to the present invention will be explained below with reference to FIGS. 1 to 48. Explanation will be further made with reference to FIGS. 49 to 58 for a display device concerning an applied embodiment, a relay device concerning an applied embodiment, and a capacitance-variable capacitor concerning an applied embodiment.

Figure 1:
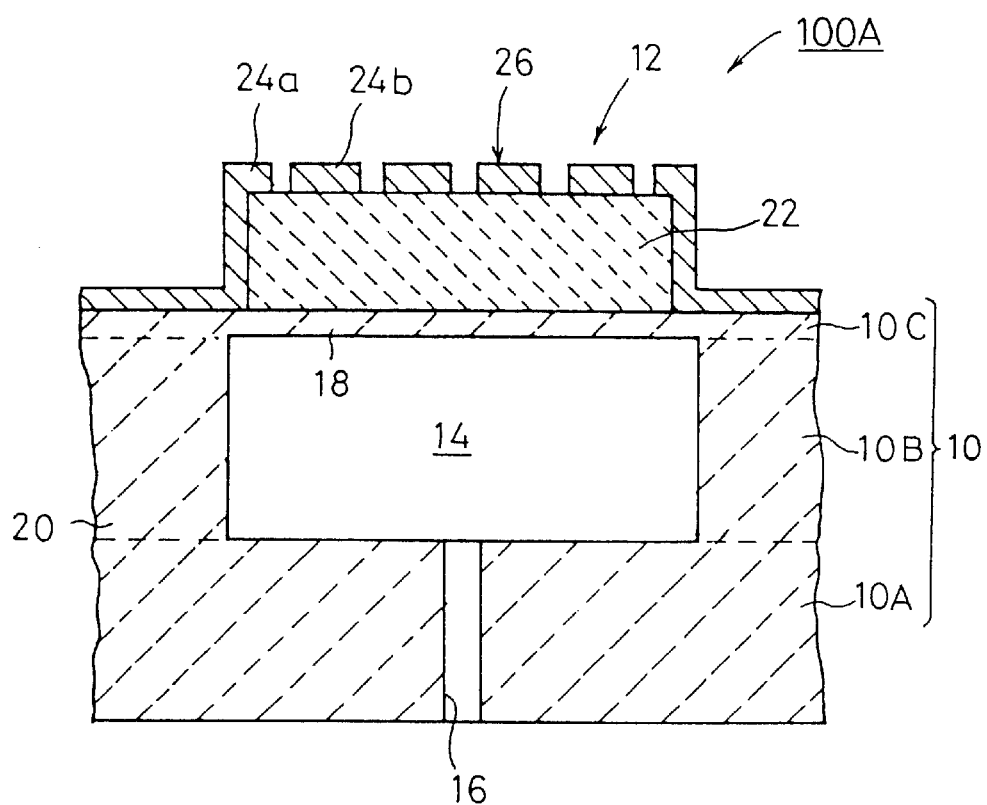
FIG. 1 shows a sectional view illustrating a structure of a ceramic element according to a first embodiment.

At first, as shown in FIG. 1, a ceramic element 100A according to the first embodiment has a substrate 10 composed of, for example, a ceramic. An actuator element 12 is arranged at a predetermined position on the substrate 10.

The substrate 10 has a first principal surface which is a continuous surface (flushed surface). A hollow space 14 is provided at a position corresponding to the actuator element 12. Each of the hollow spaces 14 communicates with the outside through a through-hole 16 having a small diameter provided through a second end surface of the substrate 10.

A portion of the substrate 10, at which the hollow space 14 is formed, is thin-walled. The other portion of the substrate 10 is thick-walled. The thin-walled portion has a structure which tends to undergo vibration in response to an external stress, and thus it functions as a vibrating section 18. The portion other than the hollow space 14 is thick-walled, and it functions as a fixed section 20 for supporting the vibrating section 18.

That is, the substrate 10 has a stacked structure comprising a base plate 10A as a lowermost layer, a spacer plate 10B as an intermediate layer, and a closing plate 10C as an uppermost layer. The substrate 10 can be recognized as an integrated structure in which the hollow space 14 is formed at the position corresponding to the picture element in the spacer plate 10B. The base plate 10A functions as a reinforcing substrate, and it also functions as a substrate for wiring. The substrate may be produced by means of the integrated sintering, or it may be produced by joining individually produced components.

As shown in FIG. 1, the actuator element 12 comprises the vibrating section 18 and the fixed section 20 as described above. The actuator element 12 further comprises a main actuator element 26 including an anti-ferroelectric film 22 formed directly on the vibrating section 18, and a pair of electrodes (a first electrode 24a and a second electrode 24b) formed on an upper surface of the anti-ferroelectric film 22.

Figure 2:
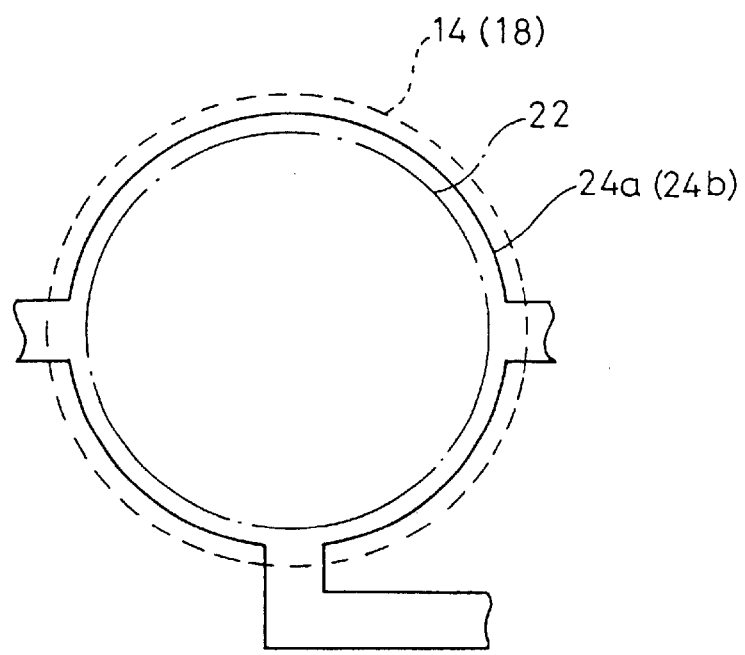
FIG. 2 shows a plan view illustrating a planar configuration of a vibrating section, a planar configuration of an anti-ferroelectric, and an outer circumferential configuration formed by a pair of electrodes for constructing a main actuator element of the ceramic element according to the first embodiment.

Shapes of the respective members will now be explained with reference to FIGS. 2 to 5C. At first, as shown in FIG. 2, the hollow space 14, which is formed in the substrate 10 (see FIG. 1), has a circumferential surface, for example, having a circular planar configuration. That is, the vibrating section 18 has, for example, a circular planar configuration (see broken lines). The anti-ferroelectric film 22 also has a circular planar configuration (see chain lines). The pair of electrodes 24a, 24b form an outer circumferential configuration which is circular as well (see solid lines). In this embodiment, the vibrating section 18 is designed to have the largest size. The outer circumferential configuration of the pair of electrodes 24a, 24b is designed to have the second largest size. The planar configuration of the anti-ferroelectric film 22 is designed to have the smallest size. Alternatively, it is allowable to make design so that the outer circumferential configuration of the pair of electrodes 24a, 24b is largest.

Figure 3:
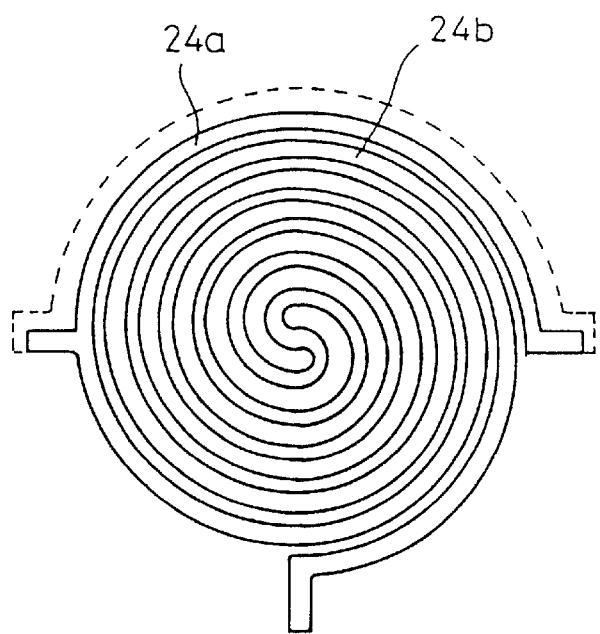
FIG. 3 shows a plan view illustrating a planar configuration (spiral configuration) of the pair of electrodes formed on the anti-ferroelectric film of the ceramic element according to the first embodiment.

The pair of electrodes 24a, 24b formed on the anti-ferroelectric film 22 have, for example, a spiral planar configuration as shown in FIG. 3, in which the pair of electrodes 24a, 24b are parallel to one another and they are separated from each other to form a spiral structure composed of several turns. The number of turns of the spiral is actually not less than 5 turns. However, FIG. 3 illustratively shows 3 turns in order to avoid complicated illustration.

Figure 4:
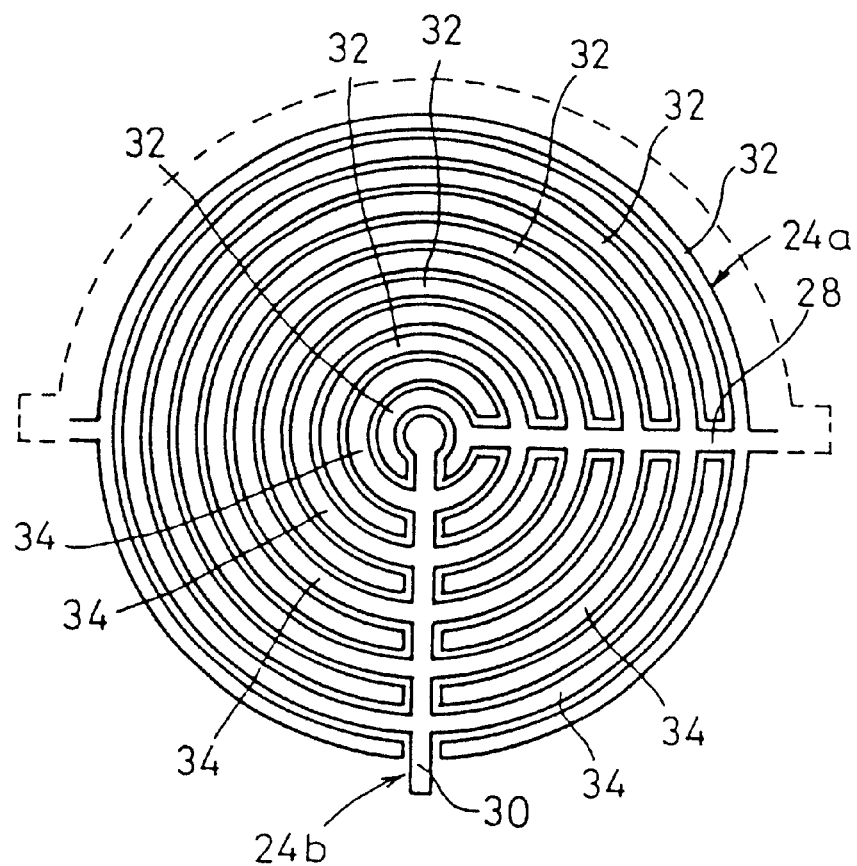
FIG. 4 shows a plan view illustrating a planar configuration (branched configuration) of the pair of electrodes formed on the anti-ferroelectric film of the ceramic element according to the first embodiment.

The planar configuration of the pair of electrodes 24a, 24b is not limited to the spiral configuration as shown in FIG. 3. The planar configuration may be a configuration as shown in FIG. 4. Specifically, each of the pair of electrodes 24a, 24b has a configuration composed of a trunk 28, 30 which extends toward the center of the anti-ferroelectric film 22, and a lot of branches 32, 34 branched from the trunk 28, 30. In this configuration, the pair of electrodes 24a, 24b are separated from each other, and they are arranged complementarily (hereinafter referred to as "branched configuration" for convenience).

The foregoing embodiment has been explained as one having the circular planar configuration of the vibrating section 18, the circular planar configuration of the anti-ferroelectric film 22, and the circular outer circumferential configuration formed by the pair of electrodes 24a, 24b. Alternatively, those usable as the planar configurations and the outer circumferential configuration include oblong configurations and elliptic configurations. Further alternatively, both of the planar configuration of the vibrating section 18 and the planar configuration of the anti-ferroelectric film 22 may be rectangular configurations with smoothed corners. Further alternatively, both of the planar configuration of the vibrating section 18 and the planar configuration of the anti-ferroelectric film 22 may be polygonal configurations (for example, octagonal configurations) with respective apex angle portions having rounded shapes.

The configuration of the vibrating section 18, the planar configuration of the anti-ferroelectric film 22, and the outer circumferential configuration formed by the pair of electrodes 24a, 24b may be combinations of circular and elliptic configurations, or combinations of rectangular and elliptic configurations, without any special limitation.

Figure 5A:
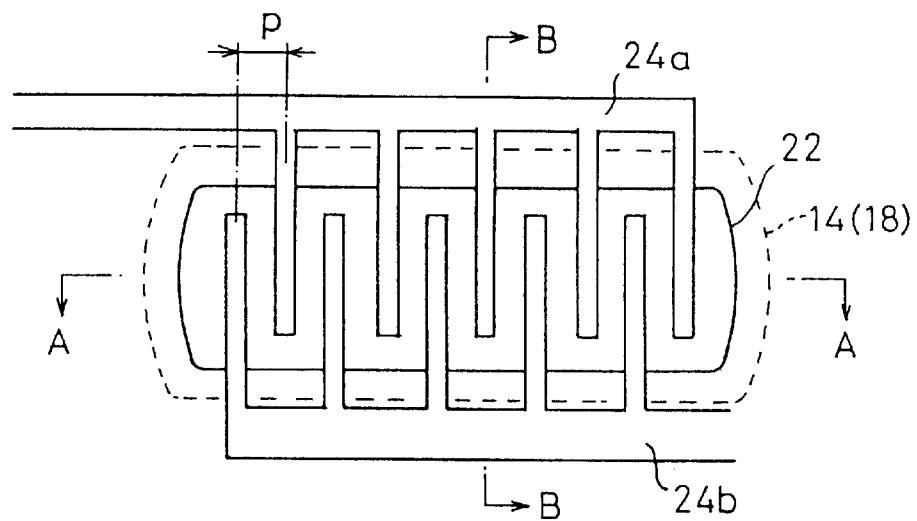
FIG. 5A shows a plan view illustrating a structure in which a pair of comb-shaped electrodes are formed on the anti-ferroelectric film of the ceramic element according to the first embodiment.

The planar configuration of the pair of electrodes 24a, 24b is not limited to the spiral configuration and the branched configurations as described above. The planar configuration may be a comb-shaped configuration as shown in FIG. 5A. In this embodiment, it is preferable that the vibrating section 18 has a configuration with a length-to-width ratio (aspect ratio) of not more than 0.25 or not less than 4.0 to form a pair of comb-shaped electrodes 24a, 24b so that a large number of comb teeth are arranged in a direction along the longitudinal direction of the vibrating section 18.

The following fact has been revealed for the ceramic element 100A according to the first embodiment. That is, when the average film thickness of the anti-ferroelectric film 22 and the pitch between the pair of electrodes 24a, 24b are specified, there are given the analog displacement type in which the displacement amount of the actuator element 12 is changed in an analog manner depending on the voltage (applied voltage) applied to the pair of electrodes 24a, 24b, and the digital displacement type in which the displacement amount of the actuator element 12 is suddenly changed at a point of time at which the applied voltage becomes to have a certain voltage value to arrive at the maximum displacement amount almost instantaneously. It is noted that the applied voltage is represented by an absolute value of the positive or negative voltage.

Figure 5B:
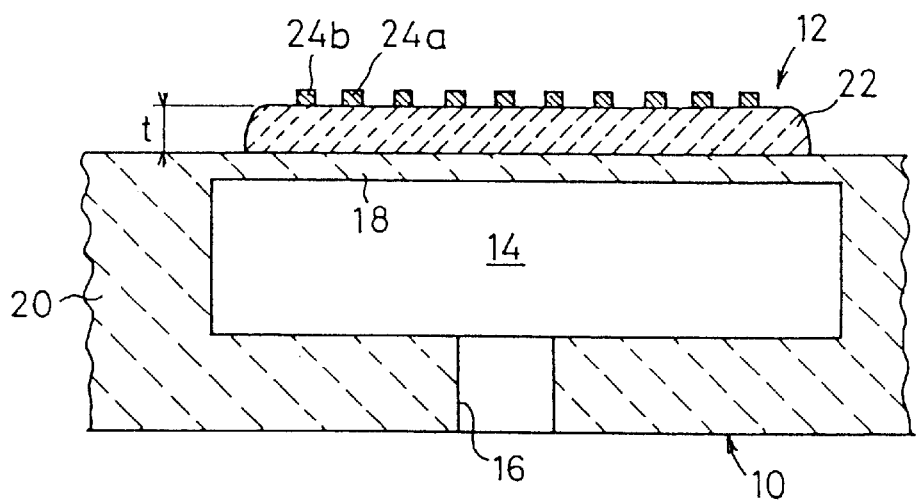
FIG. 5B shows a sectional view taken along a line A—A shown in FIG. 5A.
Figure 5C:
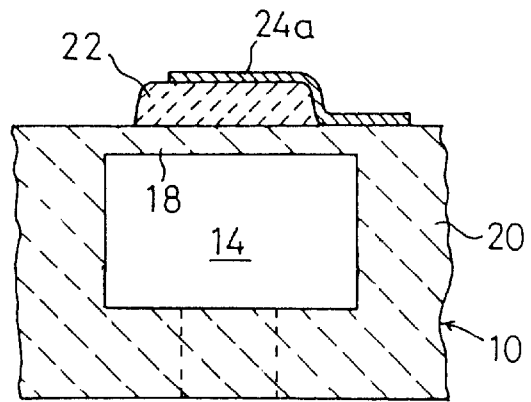
FIG. 5C shows a sectional view taken along a line B—B shown in FIG. 5A.

Specifically, for example, as shown in FIGS. 5A and 5B, assuming that the average film thickness of the anti-ferroelectric film 22 of the actuator element 12 is "t" (see FIG. 5B), and the pitch between the pair of electrodes 24a, 24b is "p" (see FIG. 5A), the following fact has been revealed. That is, the analog displacement type is given if $p/t \leq 2.5$ is satisfied, and the digital displacement type is given if $p/t < 2.5$ is satisfied. According to these relational expressions, it is understood that on condition that the pitch p between the pair of electrodes 24a, 24b is constant, the analog displacement type is given if the average film thickness t is thick, and on the contrary, the digital displacement type is given if the average film thickness t is thin.

The operation principles of the analog displacement type and the digital displacement type will be explained with reference to FIGS. 6A to 8D.

FIGS. 6A to 6D and FIGS. 8A to 8D illustrate embodiments in which each of the pair of electrodes 24a, 24b is provided as one individual respectively in order to simplify the explanation. The embodiments shown in FIGS. 6A to 6D and 8A to 8D illustrate the operation performed after the anti-ferroelectric film 22 is subjected to the polarization treatment by previously applying a predetermined electric field to the anti-ferroelectric film 22. The phase transition region (region indicated by oblique lines) Zt shown in FIGS. 6A to 6D and 8A to 8D does not depict the strict distribution, which persistently represents a conceptual image.

At first, the operation principle of the analog displacement type will be explained with reference to the conceptual illustrations of operation shown in FIGS. 6A to 6D.

At first, as shown in FIG. 6A, when the first electrode 24a and the second electrode 24b are allowed to have, for example, the ground electric potential respectively to make the applied voltage V between the pair of electrodes 24a, 24b to be zero, no electric field is generated in the actuator element 12. Therefore, the initial state is given, i.e., no bending displacement is generated in the first direction (direction for the pair of electrodes 24a, 24b formed on the anti-ferroelectric film 22 to face the free space).

Next, observation is made for the case in which the voltage value (level) of the voltage V applied to the pair of electrodes 24a, 24b is gradually increased to be V1, V2, and V3. At first, as shown in FIG. 6B, when there is given the applied voltage V=V1 (>0V), i.e., when the applied voltage V is the voltage V1 which is smaller than a predetermined voltage Vd (hereinafter simply referred to as "predetermined voltage Vd") required to the cause the phase transition in the anti-ferroelectric film 22, then the electric field generated in the actuator element 12 is weak. Therefore, no phase transition occurs in the anti-ferroelectric film 22. Accordingly, the bending displacement in the first direction is not caused in the actuator element 12 (see bending displacement amount at the voltage V1 shown in FIG. 7).

As shown in FIG. 6C, the electric field intensity is sufficient to cause the phase transition in a region in which the distance between the pair of electrodes 24a, 24b is shortest and in a region which is nearest to the pair of electrodes 24a, 24b, at and after the stage in which the applied voltage V exceeds the predetermined voltage Vd. The phase transition occurs in such regions (occurrence of the phase transition region Zt). The mechanical displacement is generated in accordance with the phase transition. The displacement is amplified by the vibrating section 18. Thus, the actuator element 12 is displaced in the first direction (see bending displacement amount at the voltage V2 shown in FIG. 7).

As shown in FIG. 6D, the region, in which the electric field intensity is sufficient to cause the phase transition, is gradually widened as the applied voltage V is further increased. The phase transition is also caused in a region in which the distance between the pair of electrodes 24a, 24b is long and in a region which is far from the pair of electrodes 24a, 24b (spread of the phase transition region Zr). In this situation, the mechanical displacement of the actuator element 12 is increased in accordance with the spread of the phase transition region Zt (see bending displacement amount at the voltage V3 shown in FIG. 7).

Figure 7:
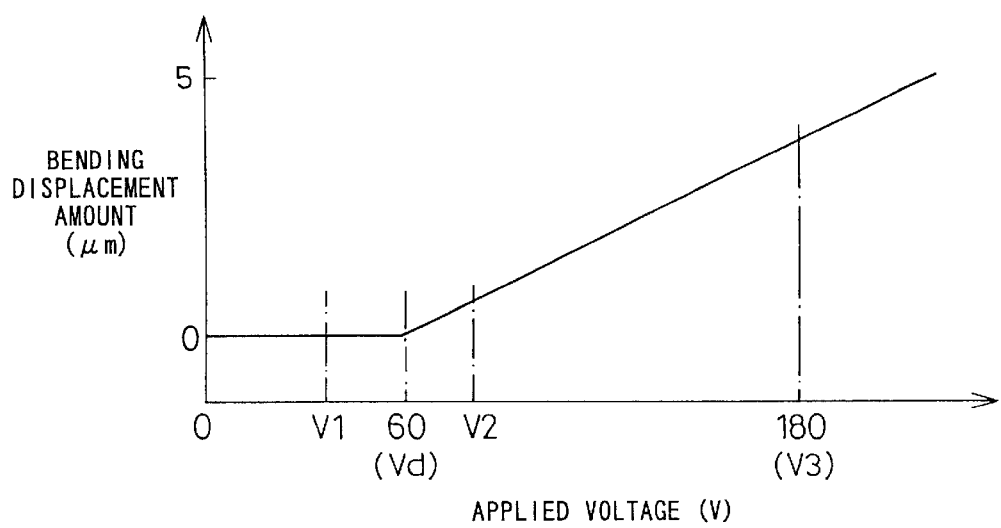
FIG. 7 shows a characteristic curve illustrating an example of the bending displacement characteristic of the analog displacement type of the ceramic element according to the first embodiment.

As described above, in the case of the analog displacement type, the bending displacement amount of the actuator element 12 is changed in an analog manner in accordance with the increase in applied voltage V. FIG. 7 shows an example of the bending displacement characteristic of the analog displacement type. The ceramic element, which exhibits the bending displacement characteristic shown in FIG. 7, is an element which makes displacement in an analog manner with respect to the applied voltage V of 60 V to 180 V. The average film thickness t of the anti-ferroelectric film 22 is 30 μm, and the pitch p between the pair of electrodes 24a, 24b is 15 μm. The dimension of the vibrating section 18 resides in a circular planar configuration having a diameter of 1 mm, in which the thickness is 0.01 mm.

Next, the operation principle of the digital displacement type will be explained with reference to the conceptual illustrations of operation shown in FIGS. 8A to 8D.

Figure 8A:
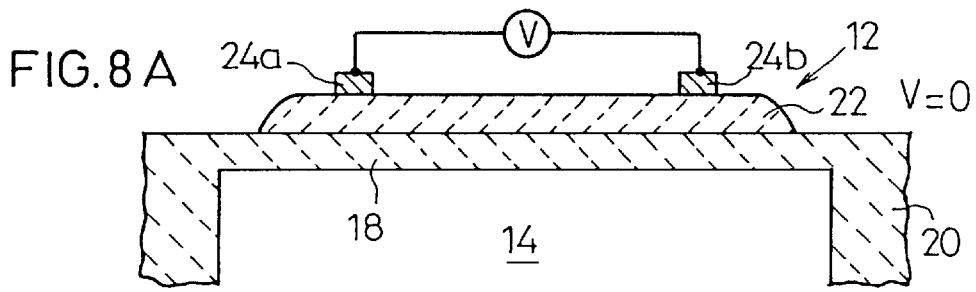
FIG. 8A illustrates a state in which a voltage V=0 is applied to the pair of electrodes of the actuator element of the ceramic element (digital displacement type) according to the first embodiment.

At first, as shown in FIG. 8A, when the first electrode 24a and the second electrode 24b are allowed to have, for example, the ground electric potential respectively to make the applied voltage between the pair of electrodes 24a, 24b to be zero, no electric field is generated in the actuator element 12. Therefore, the initial state is given, i.e., no bending displacement is generated in the first direction.

Figure 8B:
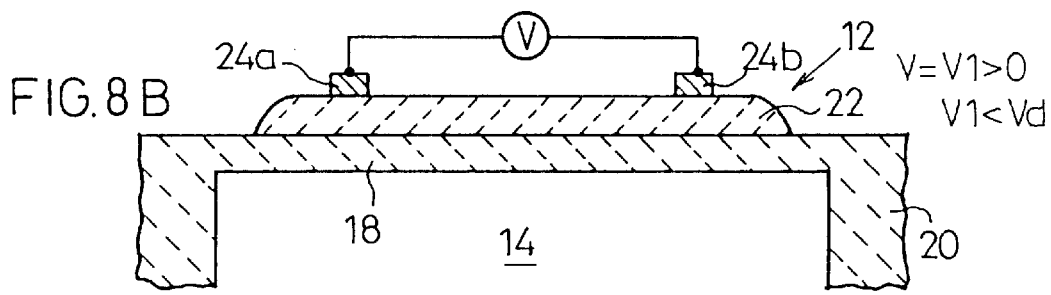
FIG. 8B illustrates a state in which a voltage V=V1 is applied to the pair of electrodes of the actuator element.

Next, observation is made for the case in which the voltage value (level) of the voltage V applied to the pair of electrodes 24a, 24b is gradually increased to be V1, V2, and V3. At first, as shown in FIG. 8B, when there is given the applied voltage V=V1 (>0V), i.e., when the applied voltage V is the voltage V1 which is smaller than the predetermined voltage Vd, then the electric field generated in the actuator element 12 is weak. Therefore, no phase transition occurs in the anti-ferroelectric film 22. Accordingly, the bending displacement in the first direction is not caused in the actuator element 12.

Figure 8C:
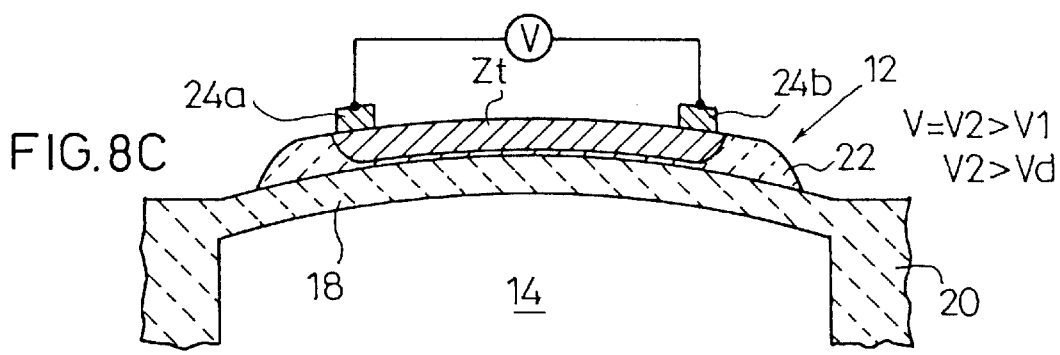
FIG. 8C illustrates a state in which a voltage V=V2 is applied to the pair of electrodes of the actuator element.

As shown in FIG. 8C, the actuator element 12 is suddenly displaced in the first direction at the stage in which the applied voltage V exceeds the predetermined voltage Vd, for example, at the stage in which there is given the applied voltage V=V2, because of the following reason. That is, the relationship of $p/t > 2.5$ is given for the average film thickness t of the anti-ferroelectric film 22 and the pitch p between the pair of electrodes 24a, 24b, and the electric field distribution generated by the applied voltage V (=V2) is uniform. Accordingly, when the voltage is slightly increased, almost all regions undergo the phase transition to give the phase transition region Zt. Therefore, at the point of time at which the applied voltage V exceeds the predetermined voltage Vd, the actuator element 12 makes sudden displacement in the first direction in response to a slight voltage change, as expected from its bending displacement characteristic. Thus, the actuator element 12 is displaced in the first direction up to the maximum displacement amount only by applying a voltage which is slightly higher than the voltage V2.

Figure 8D:
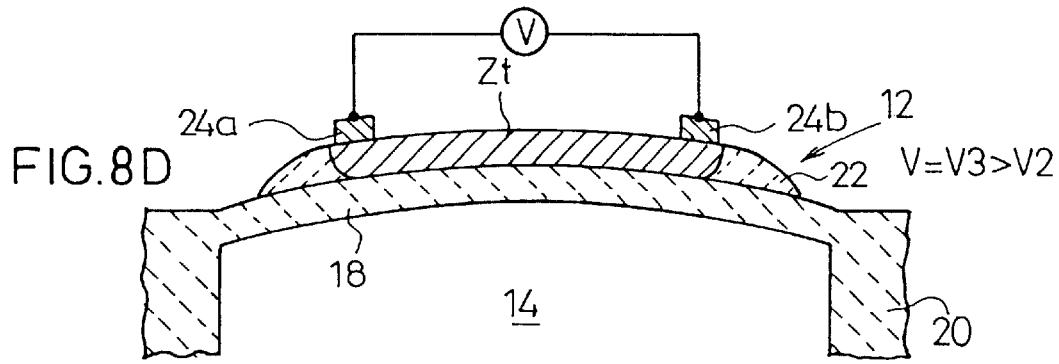
FIG. 8D illustrates a state in which a voltage V=V3 is applied to the pair of electrodes of the actuator element.

As shown in FIG. 8D, the electric field generated in the actuator element 12 is intense at the point of time at which the applied voltage V is increased to be, for example, a voltage V3 higher than the voltage V2. Therefore, all of the region of the anti-ferroelectric film 22 interposed between the pair of electrodes 24a, 24b is the phase transition region Zt. Moreover, the actuator element 12 does not undergo further increase in bending displacement at this stage, because it is displaced to the maximum displacement amount in response to the voltage slightly exceeding the voltage V2.

As described above, the characteristic of the digital displacement type is not one in which the bending displacement amount of the actuator element 12 is gradually increased in accordance with the increase in applied voltage V. The actuator element 12 is suddenly displaced in the first direction at the point of time at which the applied voltage V exceeds the predetermined voltage Vd required to cause the phase transition in the anti-ferroelectric film 22. The actuator element 12 is displaced up to the maximum displacement amount when the voltage is slightly increased from the predetermined voltage Vd.

Next, explanation will be made with reference to FIGS. 9A to 9C and FIGS. 10A to 10C for the function associated with the displacement in the first direction of the actuator element 12 of the analog displacement type, together with a comparative example. The embodiment or the example shown in FIGS. 9A to 9C and FIGS. 10A to 10C represents process of the displacement in the first direction of the actuator element shown in FIG. 5A along the cross section taken along the line B—B.

In the comparative example, a piezoelectric/electrostrictive film 36 is used in place of the anti-ferroelectric film 22 according to the embodiment of the present invention as shown in FIG. 7A. The element concerning the comparative example exhibits a bending displacement characteristic similar to that obtained by the digital displacement type.

Figure 9A:
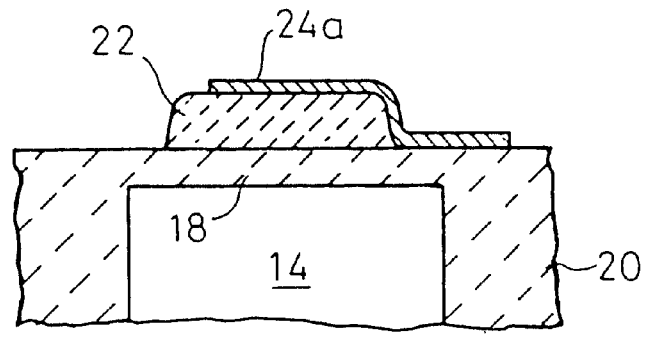
FIG 9A illustrates an initial state of the actuator element of the ceramic element (analog displacement type and digital displacement type) according to the first embodiment.

At first, as shown in FIG. 9A, no voltage (difference in electric potential) is generated between the pair of electrodes 24a, 24b in the initial state. Therefore, no elongation occurs in the anti-ferroelectric film 22, and the displacement of the actuator element 12 is maintained to be zero. This situation is also given for the comparative example (see FIG. 10A).

Figure 9B:
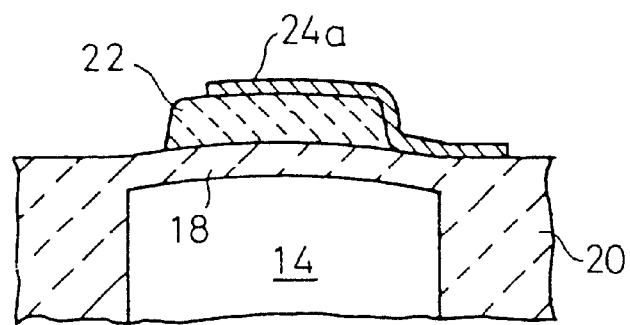
FIG. 9B illustrates a state in which a voltage is applied to the pair of electrodes of the actuator element to displace the actuator element.

Next, when the voltage V is applied to the pair of electrodes 24a, 24b of the actuator element 12, the actuator element 12 starts to make displacement in the first direction at the point of time at which the applied voltage V exceeds the predetermined voltage Vd. The displacement amount is increased as the applied voltage is increased. FIG. 9B shows a bending displacement state in which the applied voltage V to the pair of electrodes 24a, 24b is the voltage V3.

Figure 10A:
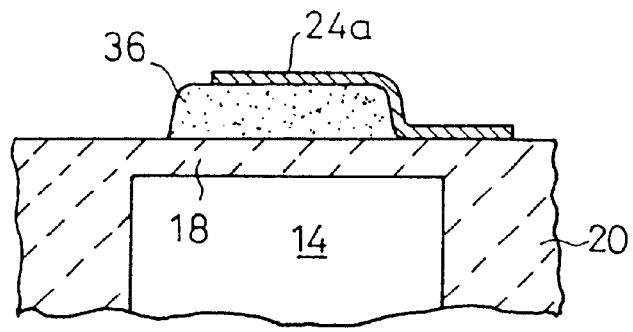
FIG. 10A illustrates an initial state of an actuator element of a comparative piezoelectric/electrostrictive film-type element.
Figure 10B:
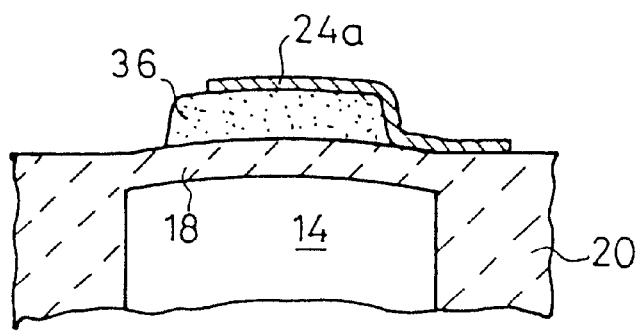
FIG. 10B illustrates a state in which a voltage is applied to a pair of electrodes of the actuator element to displace the actuator element.

On the other hand, in the case of the comparative example as shown in FIG. 10B, the actuator element 12 is suddenly displaced up to the maximum displacement amount in a digital manner at the point of time at which the applied voltage V to the pair of electrodes 24a, 24b is the predetermined voltage Vd.

Figure 9C:
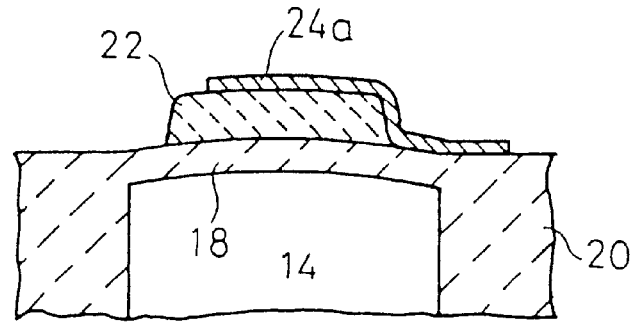
FIG. 9C illustrates a state in which the voltage application to the pair of electrodes of the actuator element is stopped (no voltage-loaded state).
Figure 10C:
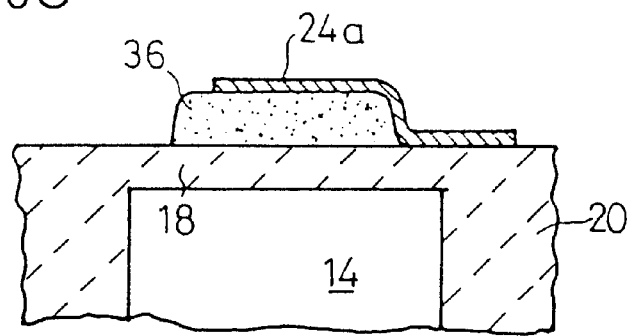
FIG. 10C illustrates a state in which the voltage application to the pair of electrodes of the actuator element is stopped (no voltage-loaded state).

Next, when the voltage application to the pair of electrodes 24a, 24b is stopped so that the voltage between the pair of electrodes 24a, 24b is 0 V, then as shown in FIG. 9C, the displacement, which has been once generate, is maintained as it is owing to the "effect to store the strain state of the ferroelectric phase (shape memory effect)" of the anti-ferroelectric film 22. On the other hand, in the case of the comparative example, as shown in FIG. 10C, when the voltage between the pair of electrodes 24a, 24b is 0 V to give the no voltage-loaded state, then the displacement, which has been generated by the voltage application, is returned to the state of zero (i.e., the initial state) upon the stop of voltage application performed thereafter.

In other words, the ceramic element 100A according to the first embodiment has the structure comprising the main actuator element 26 having the anti-ferroelectric film 22 formed on the vibrating section 18 which is vibratingly supported by the fixed section 20. Accordingly, when the voltage V is applied to the pair of electrodes 24a, 24b, the anti-ferroelectric film 22 of the main actuator element 26 undergoes the phase transition caused by the external electric field brought about the applied voltage V. The mechanical displacement is generated in accordance with the phase transition. The displacement is amplified by the vibrating section 18, and thus the actuator element 12 is displaced in the first direction.

Once the actuator element 12 is displaced in the first direction, the displacement is maintained as it is, even when the voltage application to the pair of electrodes 24a, 24b is stopped (for example, electric field=0). Accordingly, even when it is necessary to maintain the displacement generated in the actuator element 12 for a certain period of time, it is unnecessary to continuously apply the voltage to the pair of electrodes 24a, 24b. In order to restore the displacement generated in the actuator element 12 to the original state, a small reverse bias voltage may be applied to the pair of electrodes 24a, 24b. Specifically, it is sufficient to apply a voltage to cause the phase transition from the ferroelectric phase to the anti-ferroelectric phase.

As described above, in the ceramic element 100A according to the first embodiment, the mechanical displacement amount is changed in the analog manner or in the digital manner in accordance with the voltage V applied to the pair of electrodes 24a, 24b. Further, the displacement amount, which is equivalent to that obtained when the voltage is applied, can be maintained in the no voltage-loaded state after completion of the application of the applied voltage V.

Figure 11A:
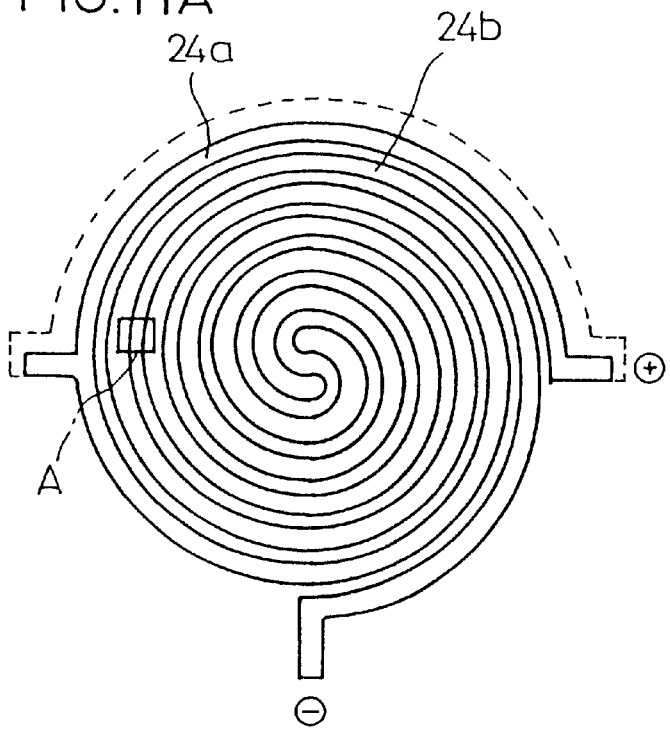
FIG. 11A illustrates the directions of expansion of the anti-ferroelectric film and the piezoelectric/electrostrictive film when the pair of electrodes have the spiral planar configuration.
Figure 11B:
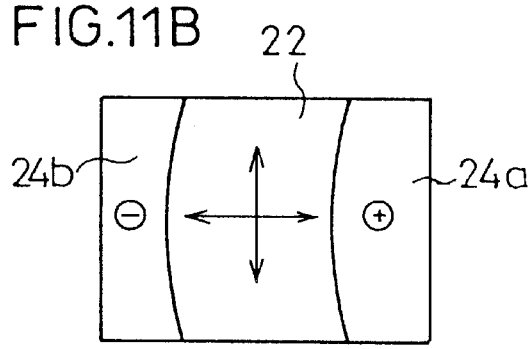
FIG. 11B shows a magnified view illustrating the direction of expansion of the anti-ferroelectric film concerning a portion enclosed by a rectangle shown in FIG. 11A.

Further, as shown in FIG. 11A, the ceramic element 100A according to the first embodiment has the following feature, as exemplified by the case in which the planar configuration of the pair of electrodes 24a, 24b is, for example, the spiral configuration. That is, when the voltage V, which is not less than the predetermined voltage Vd, is applied to the pair of electrodes 24a, 24b, then the portion of the surface of the anti-ferroelectric film 22, which is disposed between the pair of electrodes 24a, 24b, makes expansion in the superficial direction as shown in FIG. 11B. Therefore, the actuator element 12 (see FIG. 1) makes large bending displacement in the first direction in a stable manner.

Figure 11C:
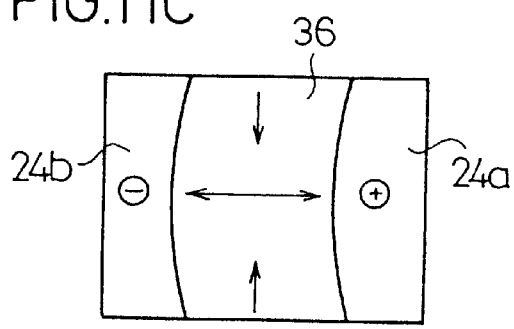
FIG 11C shows a magnified view illustrating the direction of expansion of the piezoelectric/electrostrictive film concerning a portion enclosed by the rectangle shown in FIG. 11A.

On the other hand, in the case of the comparative example, when the voltage V, which is not less than the predetermined voltage Vd, is applied to the pair of electrodes 24a, 24b, then the portion of the surface of the piezoelectric/electrostrictive film 36 between the pair of electrodes 24a, 24b makes expansion in an anisotropic manner as shown in FIG. 11C (expansion occurs in the direction along the pair of electrodes 24a, 24b, but contraction occurs in the direction perpendicular thereto). Therefore, the bending displacement amount of the actuator element 12 is small, and the displacement is caused in various directions in an unstable manner.

As described above, in the ceramic element 100A according to the first embodiment, the mechanical displacement amount is changed in the analog manner or in the digital manner in accordance with the voltage V applied to the pair of electrodes 24a, 24b. Further, the displacement amount, which is equivalent to that obtained when the voltage is applied, can be maintained in the no voltage-loaded state or in the low voltage-loaded state after completion of the application of the applied voltage V. Accordingly, the magnitude of the displacement amount can be precisely controlled corresponding to the applied voltage V. Moreover, the large displacement-generating force, which exceeds those obtained by the piezoelectric/electrostrictive element, can be obtained even when a minute element is used.

In the ceramic element 100A according to the first embodiment, the displacement amount, which is approximately equivalent to that obtained when the voltage is applied, can be maintained in the no voltage-loaded state or in the low voltage-loaded state after completion of the application of the applied voltage V as described above. Accordingly, when the ceramic element is applied to a variety of applications (for example, display devices and filters), then the electric wiring for driving the element can be simplified, and the production cost can be effectively reduced.

Figure 12A:
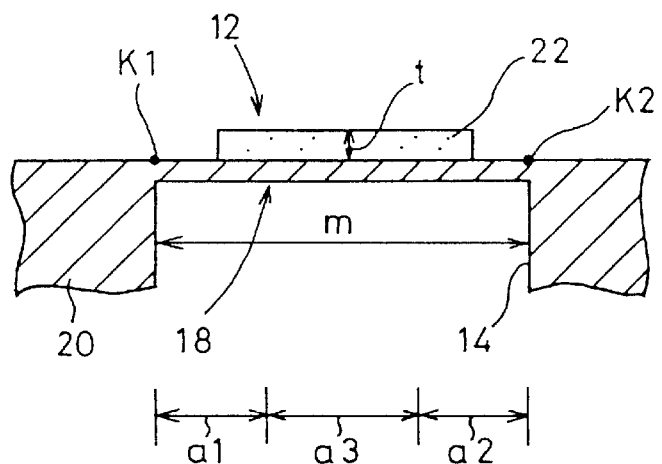
FIG. 12A shows a sectional view illustrating, with partial omission, a cross-sectional configuration of the actuator element relative to a shortest dimension.
Figure 12B:
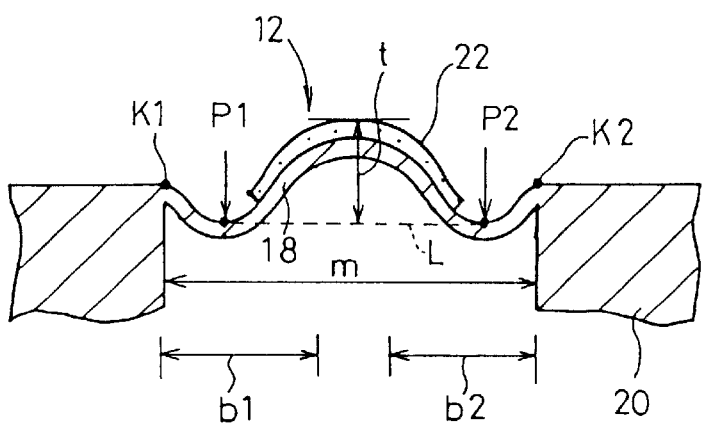
FIG. 12B shows a sectional view illustrating, with partial omission, a case in which one outermost local minimum point and the other outermost local minimum point exist below the upper surface of the fixed section.
Figure 12C:
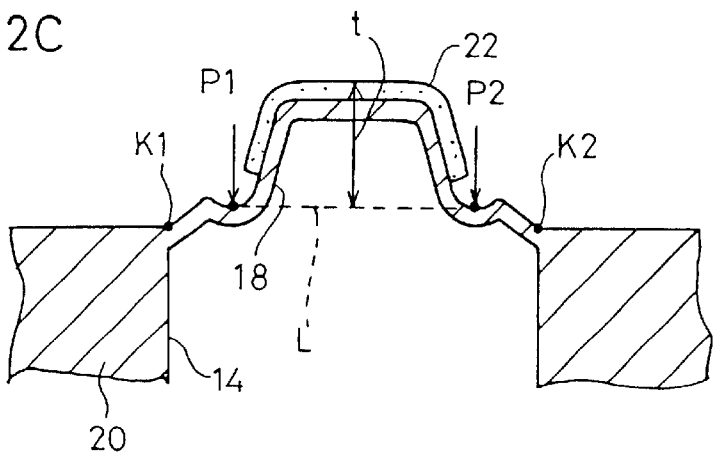
FIG. 12C shows a sectional view illustrating, with partial omission, a case in which one outermost local minimum point and the other outermost local minimum point exist above the upper surface of the fixed section.
Figure 13:
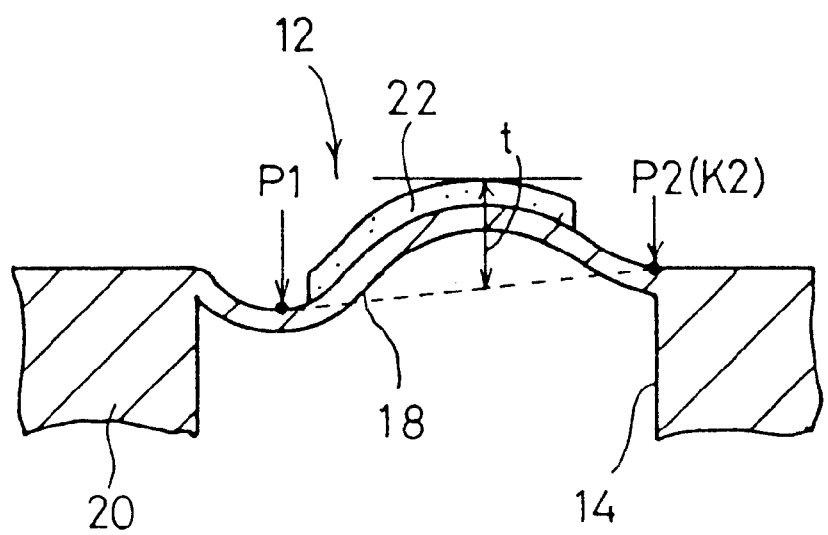
FIG. 13 shows a sectional view illustrating, with partial omission, an example of a case in which the other outermost local minimum point does not exist in the other local minimum point-existing region in the cross-sectional configuration relative to the shortest dimension of the actuator element, and the other boundary point is regarded as the other outermost local minimum point.

As shown in FIGS. 12A to 13, in the ceramic element 100A according to the first embodiment, it is preferable that the cross-sectional configuration concerning the shortest dimension m passing through the center of the vibrating section 18 satisfies the following condition. In FIGS. 12A to 13, the pair of electrodes 24a, 24b are not depicted in order to avoid complicated illustration.

That is, as shown in FIG. 12B, at least a part of the upper surface of the anti-ferroelectric film 22 in the vicinity of its center makes, in the no voltage-loaded state (state of the electric field E=0), protrusion in a direction directed oppositely to the vibrating section 18 from a reference line L formed by connecting one outermost local minimum point P1 and the other outermost local minimum point P2 adjacent to the fixed section 20.

The vicinity of the center of the anti-ferroelectric film 22 is herein defined as follows as shown in FIG. 12A. Concerning the shortest dimension m, boundary portions between the upper surface of the fixed section 20 and the upper surface of the vibrating section 18 are defined as one boundary point K1 and the other boundary point K2 respectively. When the shortest dimension m is regarded to be 100, the vicinity of the center of the anti-ferroelectric film 22 is indicated by a central range a3 of 40%, except for a range al of 30% ranging from the one boundary point K1 toward the center of the shortest dimension m, and a range a2 of 30% ranging from the other boundary point K2 toward the center of the shortest dimension m.

The one outermost local minimum point P1 is defined as follows as shown in FIG. 12B. Concerning the shortest dimension m, a plurality of local minimum points are formed on a projection line concerning the upper surface of the vibrating section 18 (or the first principal surface of the anti-ferroelectric film 22 in some cases) with respect to the plane of the shortest dimension. Among the plurality of the local minimum points, the one outermost local minimum point P1 corresponds to a local minimum point which is closest to the one boundary point K1. Among the plurality of the local minimum points, the other outermost local minimum point P2 corresponds to a local minimum point which is closest to the other boundary point K2.

In this case, on condition that the shortest dimension m is regarded to be 100, the one outermost local minimum point P1 is acknowledged to be a local minimum point which exists within a range of 40% (one local minimum point-existing region b1) ranging from the one boundary point K1 toward the center of the shortest dimension m, and which is closest to the one boundary point K1. The other outermost local minimum point P2 is acknowledged to be a local minimum point which exists within a range of 40% (the other local minimum point-existing region b2) ranging from the other boundary point K2 toward the center of the shortest dimension m, and which is closest to the other boundary point K2.

As shown in FIG. 12B, the outermost local minimum points P1, P2 may exist under the upper surface of the fixed section 20. As shown in FIG. 12C, the outermost local minimum points P1, P2 may exist over the upper surface of the fixed section 20.

As shown in FIG. 13, for example, when the other outermost local minimum point P2 does not exist in the other local minimum point-existing region a2, the other boundary point K2 is acknowledged to be the other outermost local minimum point P2. Such acknowledgment is made in the same manner for the one outermost local minimum point P1.

Under the foregoing condition, i.e., under the condition that "at least a part of the upper surface in the vicinity of the center of the anti-ferroelectric film 22 makes, in the no voltage-loaded state, protrusion in a direction directed oppositely to the vibrating section 18 from a reference line L", it is more preferable that the amount of protrusion t satisfies $m/1000 \leq t \leq m/10$ provided that the length of the shortest dimension is m.

By satisfying the foregoing condition, the produced actuator elements 12 is allowed to necessarily make large displacement in the first direction, making it possible to achieve improvement in yield when it is used for various electronic instruments and the like.

Further, the actuator element 12 having the shape as shown in FIGS. 12B, 12C, and 13 is formed such that it is bent at the portions of the outermost local minimum points P1, P2 of the upper surface of the vibrating section 18. Therefore, the flexural rigidity of the vibrating section 18 is large as compared with the actuator element 12 having the shape as shown in FIG. 12. As a result, when an identical displacement amount is generated, the stress generated in the vibrating section 18 is favorably small, giving an advantage that the strength of the vibrating section 18 and the margin of reliability are improved. The shape described above is especially effective for the characteristic of the ceramic element 100A according to the first embodiment which makes it possible to obtain the large displacement.

Next, a modified embodiment (100Aa) of the ceramic element 100A according to the first embodiment will be explained with reference to FIGS. 14A to 15B. Components or parts corresponding to those shown in FIGS. 5A and 5B are designated by the same reference numerals, duplicate explanation of which will be omitted.

Figure 14A:
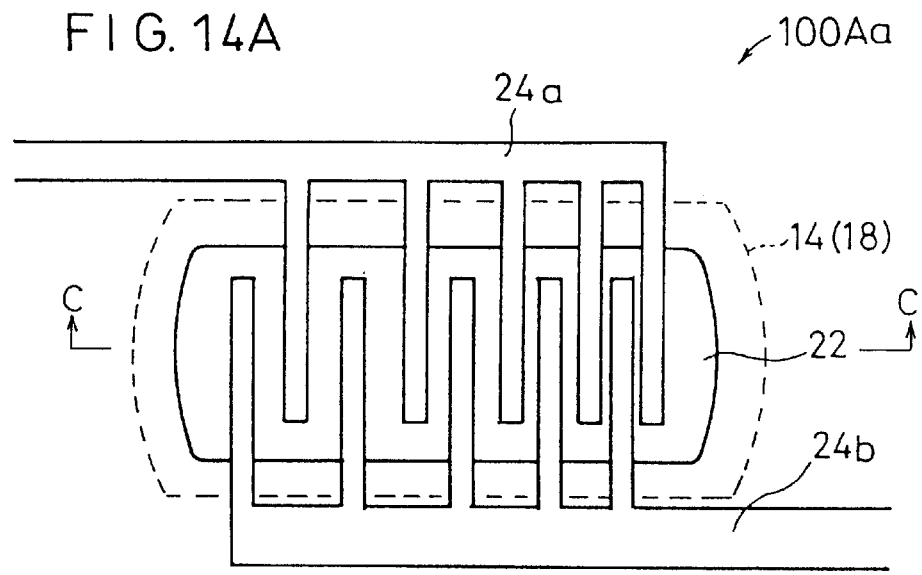
FIG. 14A shows a plan view illustrating a modified embodiment of the ceramic element according to the first embodiment.
Figure 14B:
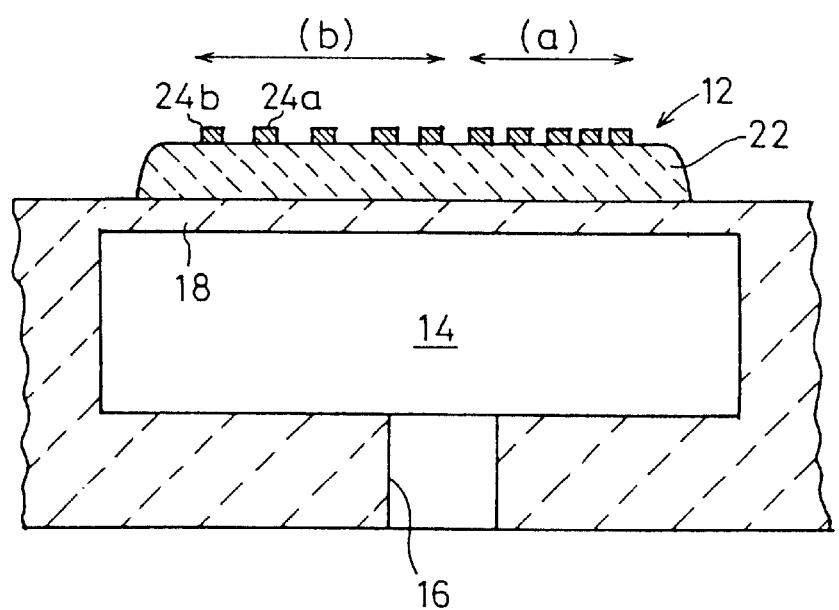
FIG. 14B shows a sectional view taken along a line C—C shown FIG. 14A.

As shown in FIGS. 14A and 14B, the ceramic element 100Aa according to the modified embodiment is constructed in approximately the same manner as the ceramic element 100A according to the first embodiment described above. However, the former is different from the latter in that the former has a region (a) in which the arrangement pitch of the comb teeth of the pair of electrodes 24a, 24b is dense, and a region (b) in which the arrangement pitch is sparse. In the region (a) in which the arrangement pitch is dense, the distance between the pair of electrodes 24a, 24b is small. Therefore, when a constant voltage is applied to the pair of electrodes 24a, 24b, a higher electric field is always generated in this region as compared with the region (b) in which the arrangement pitch is sparse (the distance between the pair of electrodes 24a, 24b is large).

Figure 15A:
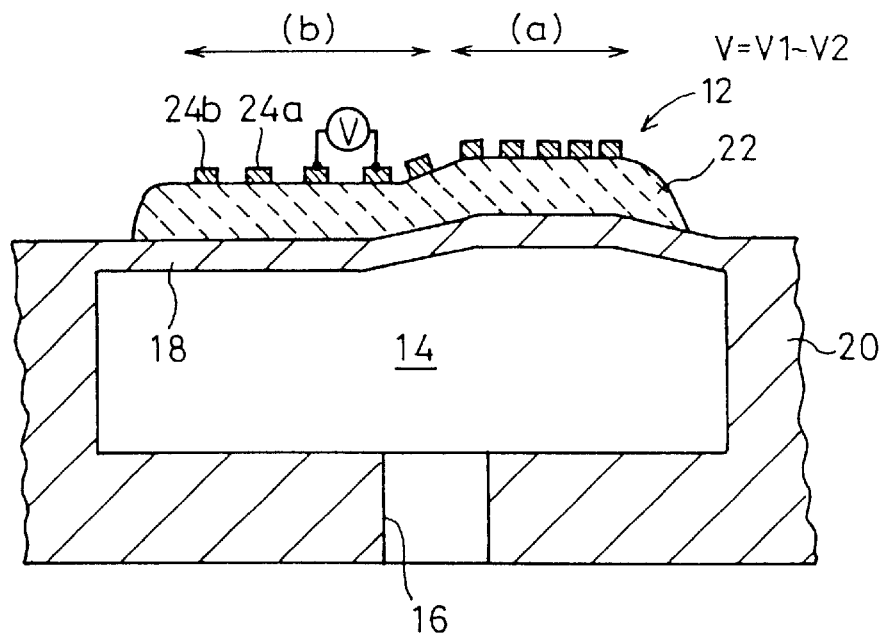
FIG. 15A illustrates a form of displacement in a state in which a voltage in a low voltage range (voltage level V1 to V2) is applied to the pair of electrodes of the ceramic element according to the modified embodiment.
Figure 15B:
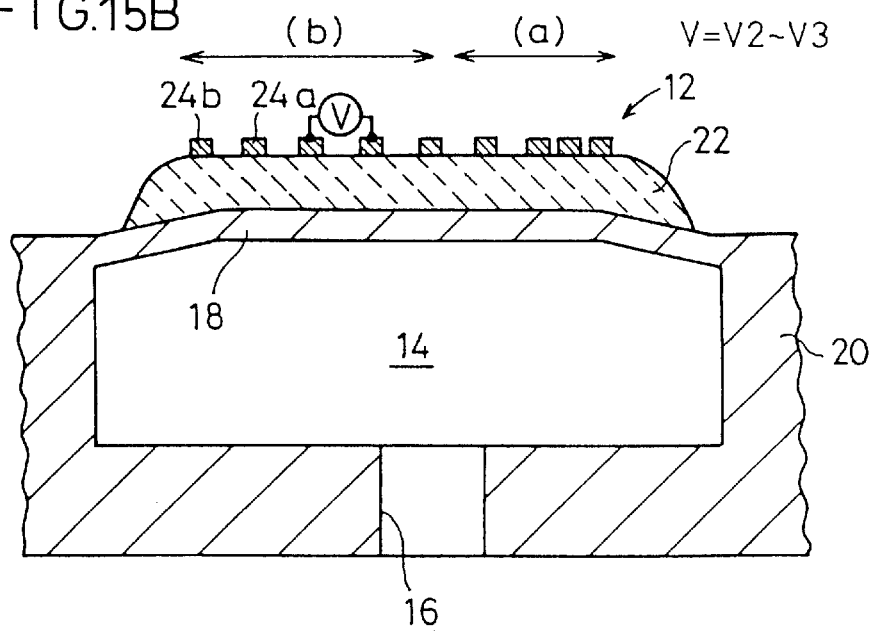
FIG. 15B illustrates a form of displacement in a state in which a voltage in a high voltage range (voltage level V2 to V3) is applied to the pair of electrodes of the ceramic element according to the modified embodiment.

Accordingly, when the voltage V applied to the pair of electrodes 24a, 24b is low, as shown in FIG. 15A, the phase transition region is expanded in accordance with the increase in the applied voltage V only in the portion corresponding to the region (a) in which the arrangement pitch is dense, of the anti-ferroelectric film 22, in a certain voltage range (voltage levels V1 to V2), and the bending displacement occurs in the first direction in a displacement amount corresponding to the level of the applied voltage V.

Next, when the applied voltage V is in a voltage range (voltage levels V2 to V3) higher than the voltage range described above, as shown in FIG. 15B, the phase transition region is expanded in accordance with the increase in the applied voltage V also in the region corresponding to the region (b) in which the arrangement pitch is sparse. Therefore, this region also undergoes the bending displacement in the first direction in a displacement amount corresponding to the level of the applied voltage V, together with the region (a) in which the arrangement pitch is dense.

As a result, the ceramic element 100Aa according to this modified embodiment makes it possible to obtain the actuator element 12 in which the displacement form differs in a plurality of regions which are spatially separated from each other.

Next, a ceramic element 100B according to the second embodiment will be explained with reference to FIGS. 16 to 21. Components or parts corresponding to those shown in FIG. 1 are designated by the same reference numerals, duplicate explanation of which will be omitted.

Figure 16:
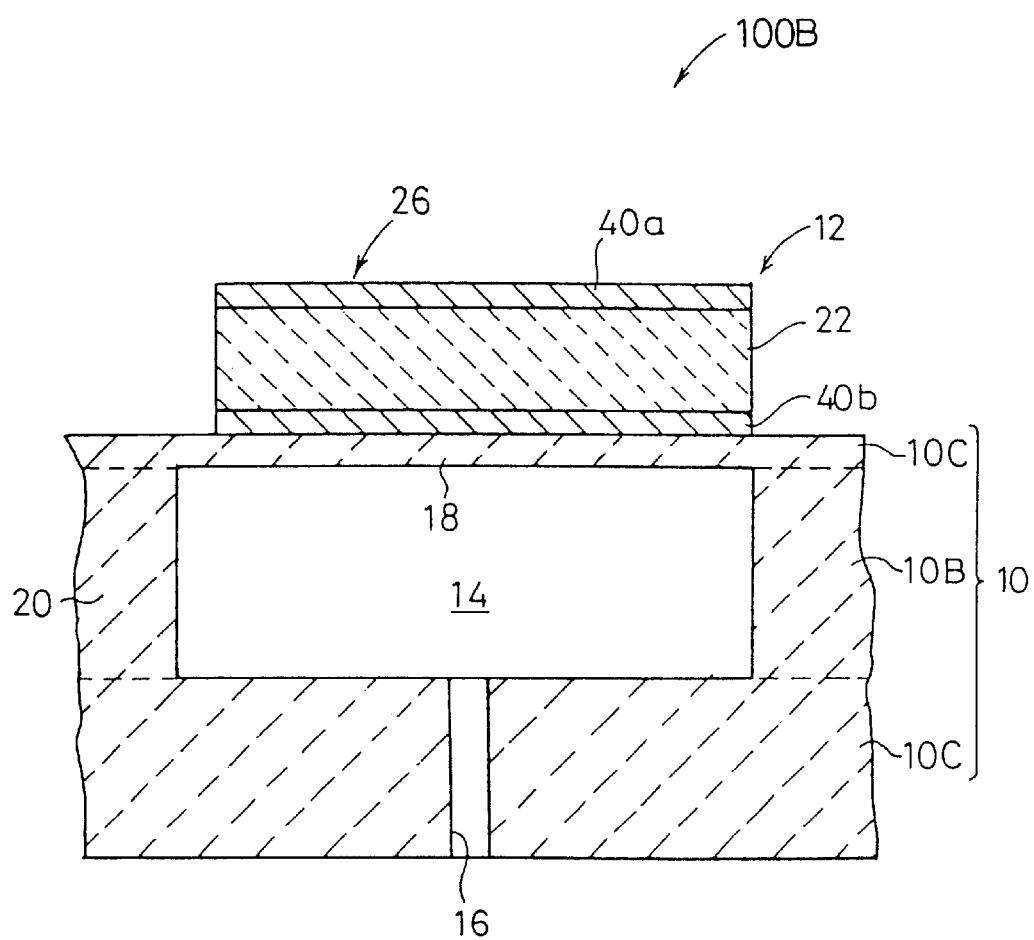
FIG. 16 shows a sectional view illustrating a structure of a ceramic element according to a second embodiment.

As shown in FIG. 16, the ceramic element 100B according to the second embodiment is constructed in approximately the same manner as the ceramic element 100A according to the first embodiment described above. However, the former is different from the latter in that the main actuator element 26 is provided with an anti-ferroelectric film 22 and an upper electrode 40a and a lower electrode 40b formed on upper and lower surfaces of the anti-ferroelectric film 22 respectively.

It has been revealed for the ceramic element 100B according to the second embodiment that there are provided the analog displacement type in which the displacement amount of the actuator element 12 is changed in an analog manner in accordance with the voltage (applied voltage) applied between the upper electrode 40a and the lower electrode 40b, and the digital displacement type in which the displacement amount of the actuator element 12 is suddenly changed at the point of time at which the applied voltage V becomes to have a certain voltage value to arrive at the maximum displacement amount almost instantaneously, by defining the respective areas of the upper electrode 40a and the lower electrode 40b, or the film thickness distribution of the anti-ferroelectric film 22 interposed between the upper electrode 40a and the lower electrode 40b. It is noted that the applied voltage V is represented by an absolute value of the positive or negative voltage.

Specifically, assuming that the area of the upper electrode 40a of the actuator element 12 is A, and the area of the lower electrode 40b is B, the following fact has been revealed. That is, if the relationship of (A/B)≧2 or (A/B)≦0.5 is satisfied, or if the film thickness distribution of the anti-ferroelectric film 22 has a dispersion of not less than 20%, then the analog displacement type is provided. If the relationship of 0.5<(A/B)<2 is satisfied, or if the film thickness distribution of the anti-ferroelectric film 22 has a dispersion of less than 20%, then the digital displacement type is provided.

Figure 19A:
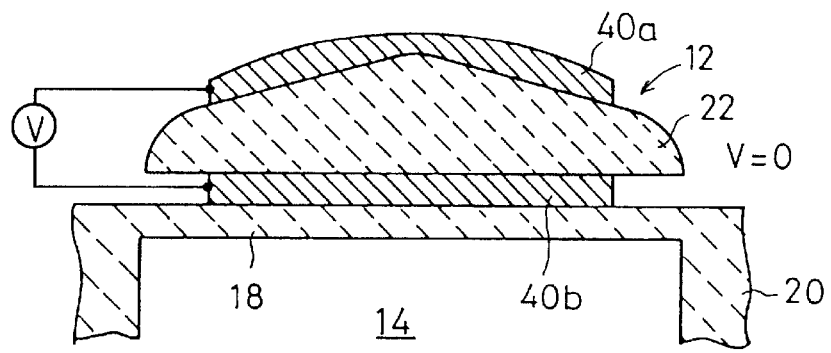
FIG. 19A illustrates a state in which a voltage V=0 is applied to the pair of electrodes of the actuator element of the ceramic element (second analog displacement type) according to the second embodiment.
Figure 19B:
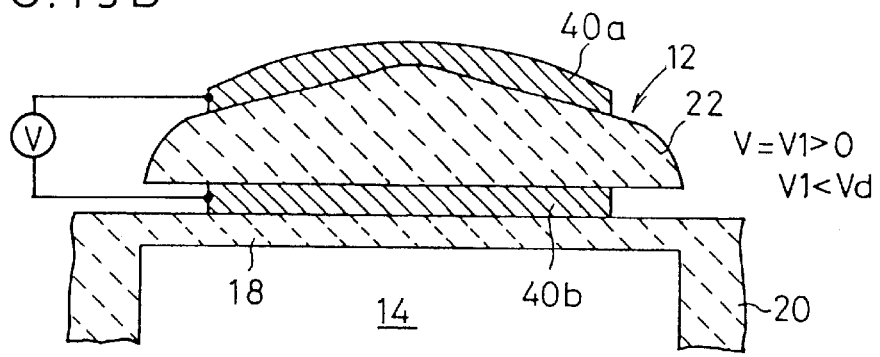
FIG. 19B illustrates a state in which a voltage V=V1 is applied to the pair of electrodes of the actuator element.
Figure 20A:
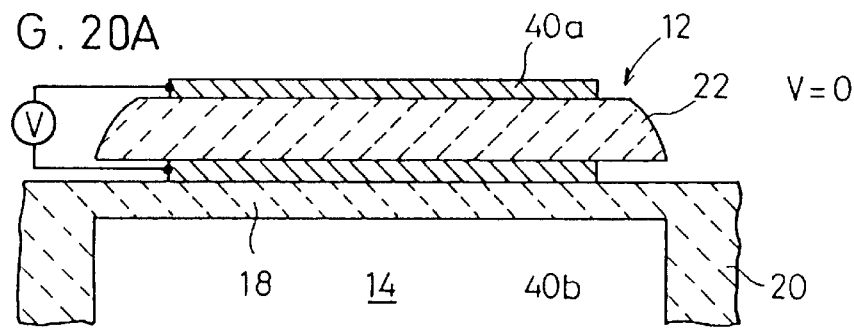
FIG. 20A illustrates a state in which a voltage V=0 is applied to the pair of electrodes of the actuator element of the ceramic element (digital displacement type) according to the second embodiment.

That is, for example, when the dispersion of the film thickness distribution of the anti-ferroelectric film 22 is less than 20%, the analog displacement type is provided by satisfying the relationship of (A/B)≧2 or (A/B)≦0.5 (see FIG. 17), or the digital displacement type is provided by satisfying the relationship of 0.5<(A/B)<2 (see FIG. 20A). When the area A of the upper electrode 40A and the area B of the lower electrode 40b have the relationship of 0.5<(A/B)<2, the analog displacement type is provided if the dispersion of the film thickness distribution of the anti-ferroelectric film 22 is not less than 20% (see FIG. 19A), or the digital displacement type is provided if the dispersion of the film thickness distribution of the anti-ferroelectric film 22 is less than 20% (see FIG. 20A).

Figure 17A:
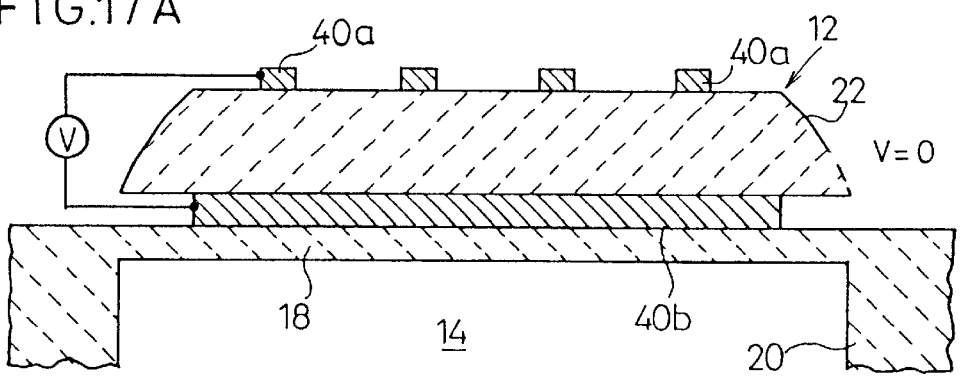
FIG. 17A illustrates a state in which a voltage V=0 is applied to the pair of electrodes of the actuator element of the ceramic element (analog displacement type) according to the second embodiment.
Figure 17B:
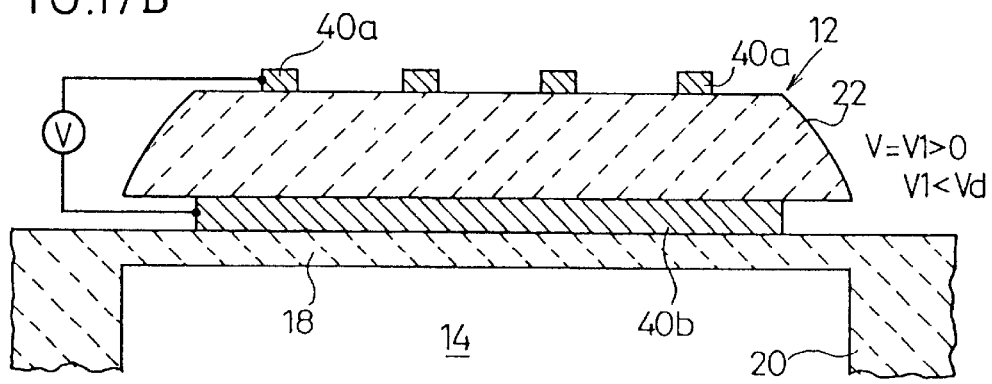
FIG. 17B illustrates a state in which a voltage V=V1 is applied to the pair of electrodes of the actuator element.
Figure 18A:
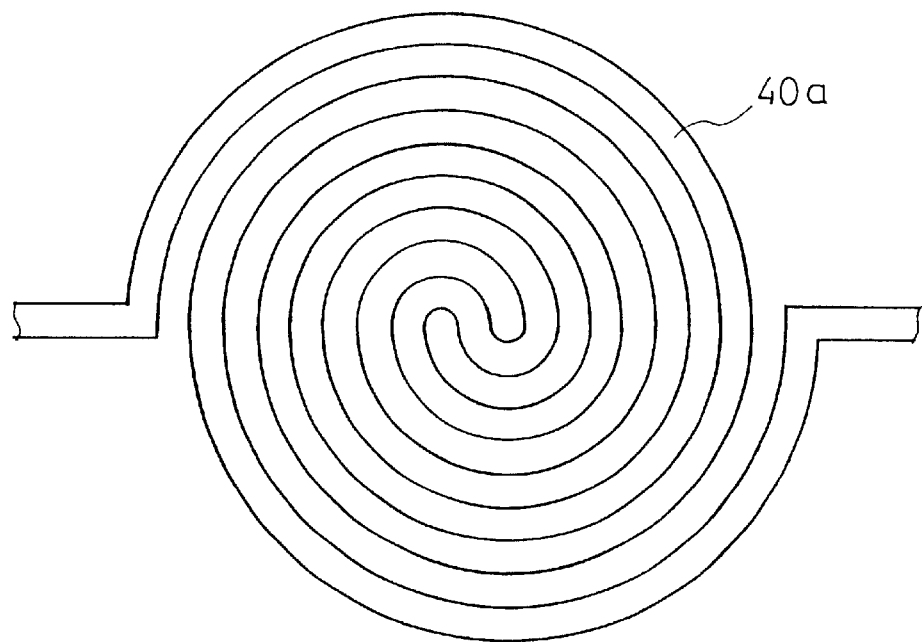
FIG. 18A shows a plan view illustrating an example of the planar configuration (spiral configuration) of the upper electrode of the ceramic-element (first analog displacement type) according to the second embodiment.
Figure 18B:
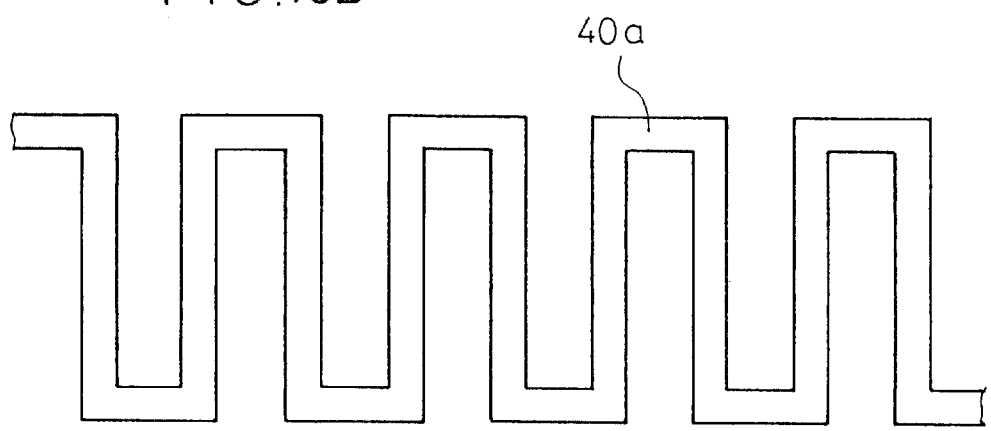
FIG. 18B shows a plan view illustrating another example (zigzag configuration).

As shown in FIG. 17A, the first analog displacement type of the ceramic element 100B according to the second embodiment is constructed such that the dispersion of the film thickness distribution of the anti-ferroelectric film 22 is less than 20%, and the relationship of (A/B)≦0.5 is satisfied. In this embodiment, the planar configuration of the upper electrode 40a includes, for example, one continuous spiral configuration as shown in FIG. 18A and one continuous zigzag configuration as shown in FIG. 18B.

The operation principle of the first analog displacement type of the ceramic element 100B according to the second embodiment will now be explained with reference to FIGS. 17A to 17D.

At first, when the upper electrode 40a and the lower electrode 40b are allowed to have, for example, the ground electric potential respectively to make the applied voltage V between the upper electrode 40a and the lower electrode 40b to be zero, no electric field is generated in the actuator element 12. Therefore, the initial state is given, i.e., no bending displacement is generated in the first direction (direction for the upper electrode 40a formed on the anti-ferroelectric film 22 to face the free space).

Next, observation is made for the case in which the voltage value (level) of the voltage V applied between the upper electrode 40a and the lower electrode 40b is gradually increased to be V1, V2, and V3. At first, when there is given the applied voltage V=V1 (>0 V), i.e., when the applied voltage V is the voltage V1 which is smaller than the predetermined voltage Vd, the electric field generated in the actuator element 12 is weak. Therefore, no phase transition occurs in the anti-ferroelectric film 22. Accordingly, the bending displacement in the first direction is not caused in the actuator element 12.

Figure 17C:
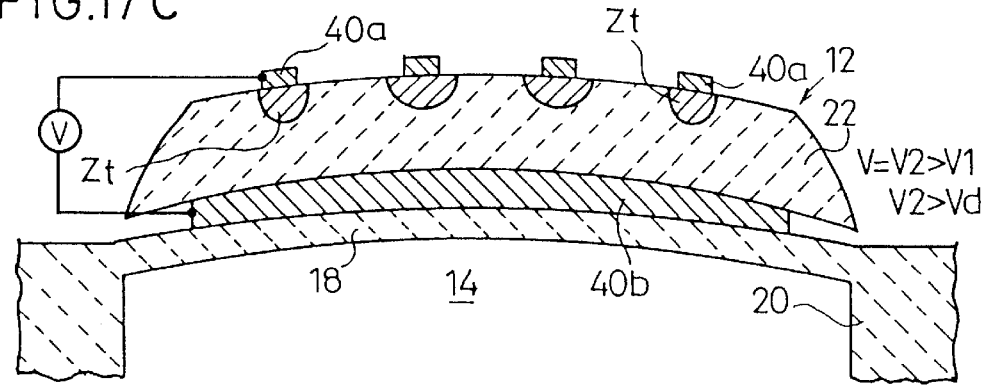
FIG. 17C illustrates a state in which a voltage V=V2 is applied to the pair of electrodes of the actuator element.

As shown in FIG. 17C, the phase transition occurs in the portion corresponding to the strong electric field (for example, the region nearest to the upper electrode 40) in the electric field distribution generated in the anti-ferroelectric film 22, at and after the stage in which the applied voltage V exceeds the predetermined voltage Vd (occurrence of the phase transition region Zt). The mechanical displacement is generated in the anti-ferroelectric film 22 in accordance with the phase transition of the strong electric field portion. The displacement is amplified by the vibrating section 18. Thus, the actuator element 12 is displaced in the first direction.

Figure 17D:
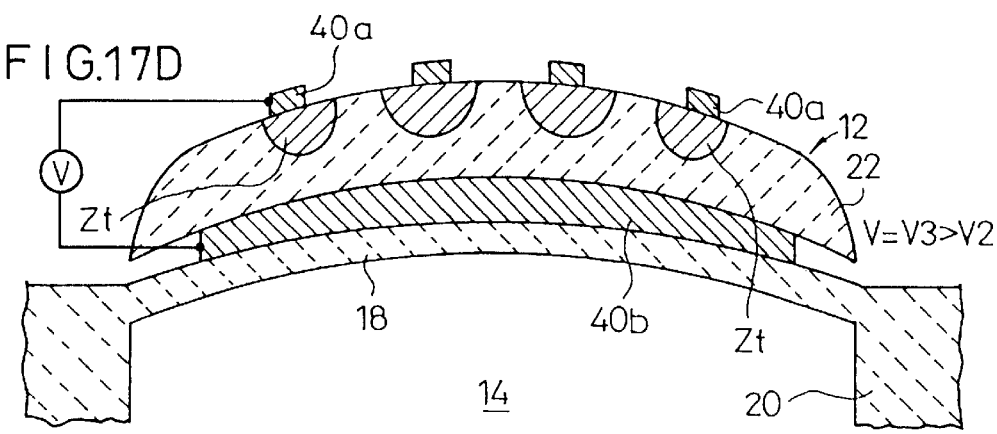
FIG. 17D illustrates a state in which a voltage V=V3 is applied to the pair of electrodes of the actuator element.

As shown in FIG. 17D, the region, in which the electric field intensity is sufficient to cause the phase transition, is gradually widened as the applied voltage V is increased. The phase transition is also caused in the region far from the upper electrode 40 (spread of the phase transition region Zr). In this case, the mechanical displacement of the actuator element 12 is also increased in accordance with the spread of the phase transition region Zt.

As described above, in the case of the first analog displacement type of the ceramic element 100B according to the second embodiment, the bending displacement amount of the actuator element 12 is also changed in an analog manner in accordance with the increase in applied voltage V, in the same manner as the ceramic element 100A (analog displacement type) according to the first embodiment described above.

Next, as shown in FIG. 19A, the second analog displacement type of the ceramic element 100B according to the second embodiment is constructed such that the area A of the upper electrode 40a and the area B of the lower electrode 40b have the relationship of 0.5<(A/B)<2, and the dispersion of the film thickness distribution of the anti-ferroelectric film 22 is not less than 20%.

The operation principle of the second analog displacement type will now be explained with reference to FIGS. 19A to 19D.

At first, when the upper electrode 40a and the lower electrode 40b are allowed to have, for example, the ground electric potential respectively to make the applied voltage V between the upper electrode 40a and the lower electrode 40b to be zero, no electric field is generated in the actuator element 12. Therefore, the initial state is given, i.e., no bending displacement is generated in the first direction.

Next, observation is made for the case in which the voltage value (level) of the voltage V applied between the upper electrode 40a and the lower electrode 40b is gradually increased to be V1, V2, and V3. At first, when there is given the applied voltage V=V1 (>0 V), i.e., when the applied voltage V is the voltage V1 which is smaller than the predetermined voltage Vd, the electric field generated in the actuator element 12 is weak. Therefore, no phase transition occurs in the anti-ferroelectric film 22. Accordingly, the bending displacement in the first direction is not caused in the actuator element 12.

Figure 19C:
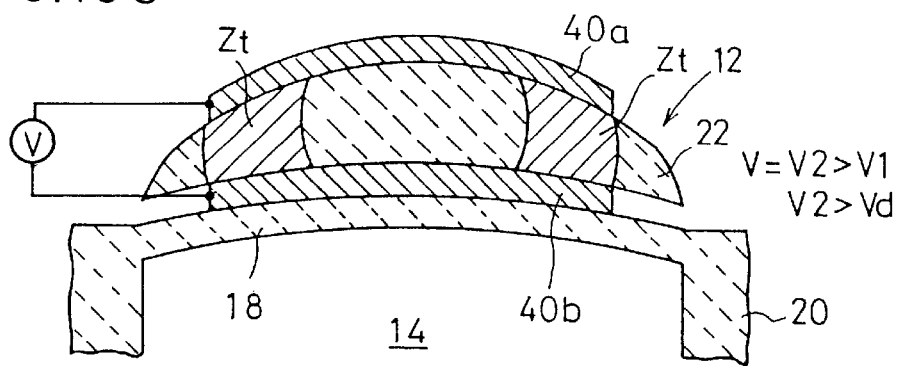
FIG. 19C illustrates a state in which a voltage V=V2 is applied to the pair of electrodes of the actuator element.

As shown in FIG. 19C, the phase transition occurs in the portion corresponding to the strong electric field (for example, the region in which the spacing distance between the upper electrode 40a and the lower electrode 40b is narrow) in the electric field distribution generated in the anti-ferroelectric film 22, at and after the stage in which the applied voltage V exceeds the predetermined voltage Vd (occurrence of the phase transition region Zt). The mechanical displacement is generated in the anti-ferroelectric film 22 in accordance with the phase transition of the strong electric field portion. The displacement is amplified by the vibrating section 18. Thus, the actuator element 12 is displaced in the first direction.

Figure 19D:
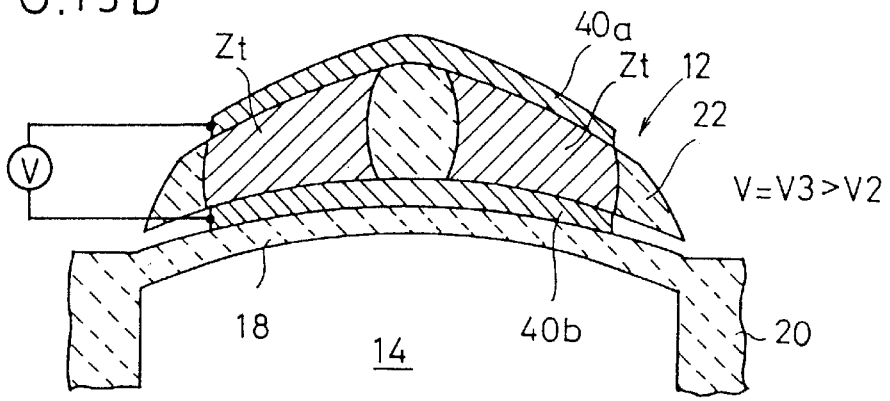
FIG. 19D illustrates a state in which a voltage V=V3 is applied to the pair of electrodes of the actuator element.

As shown in FIG. 19D, the region, in which the electric field intensity is sufficient to cause the phase transition, is gradually widened as the applied voltage V is increased. The phase transition is also caused in the region in which the spacing distance between the upper electrode 40a and the lower electrode 40b is wide (spread of the phase transition region Zr). In this case, the mechanical displacement of the actuator element 12 is also increased in accordance with the spread of the phase transition region Zt.

As described above, in the case of the second analog displacement type of the ceramic element 100B according to the second embodiment, the bending displacement amount of the actuator element 12 is also changed in an analog manner in accordance with the increase in applied voltage V, in the same manner as the first analog displacement type described above. Next, the operation principle of the digital displacement type will be explained with reference to the conceptual illustrations of operation shown in FIGS. 20A to 20D and the bending displacement characteristic shown in FIG. 21.

At first, as shown in FIG. 20A, when the upper electrode 40a and the lower electrode 40b are allowed to have, for example, the ground electric potential respectively to make the applied voltage V between the upper electrode 40a and the lower electrode 40b to be zero, no electric field is generated in the actuator element 12. Therefore, the initial state is given, i.e., no bending displacement is generated in the first direction.

Figure 20B:
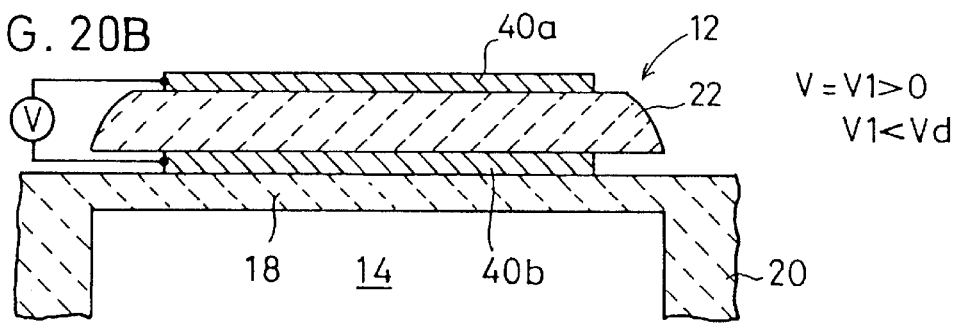
FIG. 20B illustrates a state in which a voltage V=V1 is applied to the pair of electrodes of the actuator element.

Next, observation is made for the case in which the voltage value (level) of the voltage V applied between the upper electrode 40a and the lower electrode 40b is gradually increased to be V1, V2, and V3. At first, as shown in FIG. 20B, when there is given the applied voltage V=V1 (>0V), i.e., when the applied voltage V is the voltage V1 which is smaller than the predetermined voltage Vd (for example, 110 V), then the electric field generated in the actuator element 12 is weak. Therefore, no phase transition is caused in the anti-ferroelectric film 22. Accordingly, the bending displacement in the first direction is not caused in the actuator element 12 (see the bending displacement amount at the voltage V1 shown in FIG. 21).

Figure 20C:
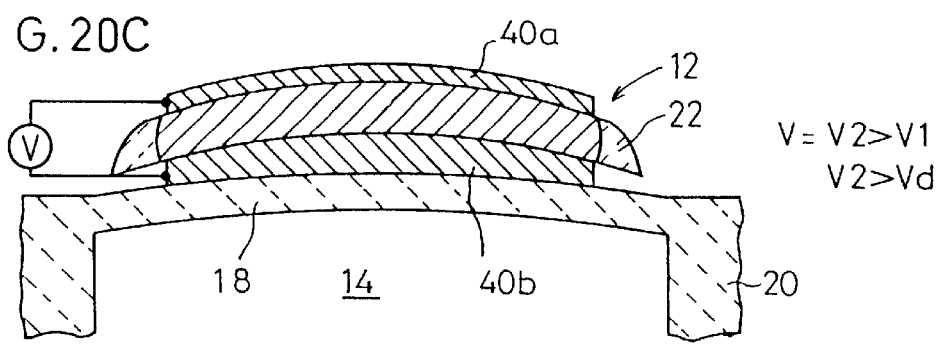
FIG. 20C illustrates a state in which a voltage V=V2 is applied to the pair of electrodes of the actuator element.
Figure 21:
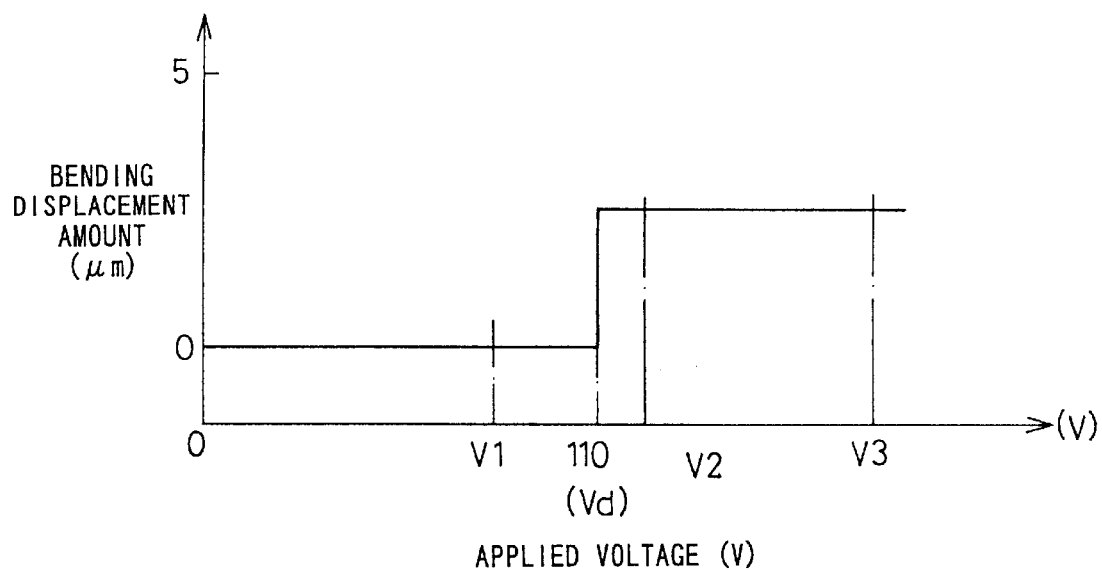
FIG. 21 shows a characteristic curve illustrating an example of the bending displacement characteristic of the digital displacement type of the ceramic element according to the second embodiment.

As shown in FIG. 20C, the actuator element 12 is suddenly displaced in the first direction at the stage in which the applied voltage V exceeds the predetermined voltage Vd, for example, at the stage in which there is given the applied voltage V=V2 (see the bending displacement amount at the voltage V2 shown in FIG. 21), because of the following reason. That is, the area A of the upper electrode 40a and the area B of the lower electrode 40b have the relationship of 0.5<(A/B)<2, the dispersion of the film thickness distribution of the anti-ferroelectric film 22 has the relationship of less than 20%, and the electric field distribution generated by the applied voltage V is uniform. Accordingly, when the voltage is slightly increased, almost all regions become the phase transition region Zt. Therefore, at the point of time at which the applied voltage V exceeds the predetermined voltage Vd, the actuator element 12 makes sudden change up to the maximum displacement amount.

Figure 20D:
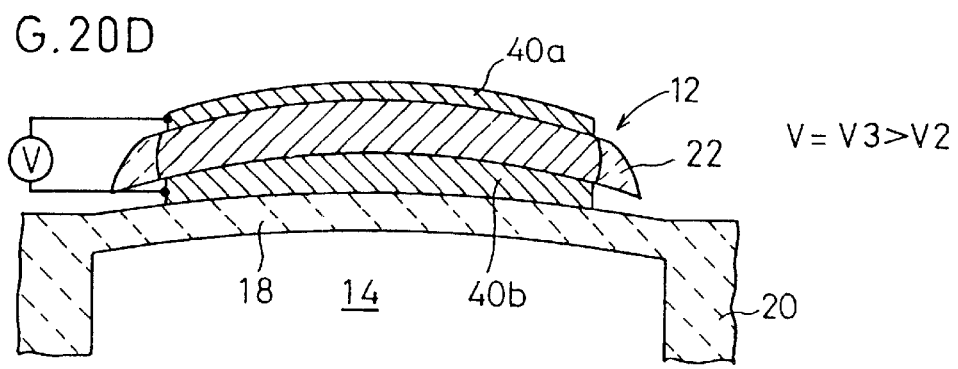
FIG. 20D illustrates a state in which a voltage V=V3 is applied to the pair of electrodes of the actuator element.

As shown in FIG. 20D, the electric field generated in the actuator element 12 is intense at the point of time at which the applied voltage V is increased to be, for example, a voltage V3 higher than the voltage V2. Therefore, all of the region of the anti-ferroelectric film 22 interposed between the upper electrode 40a and the lower electrode 40b becomes the phase transition region Zt. The displacement amount in the first direction of the actuator element 12 has been changed to the maximum displacement amount at the stage at which the applied voltage V exceeds the predetermined voltage Vd. Therefore, the displacement amount is unchanged, although the electric field is intense (see the bending displacement amount at the voltage V3 shown in FIG. 21).

As described above, the characteristic of the digital displacement type is not one in which the bending displacement amount of the actuator element 12 is gradually increased in accordance with the increase in applied voltage V. The actuator element 12 suddenly makes change in the digital manner up to the maximum displacement at the point of time at which the applied voltage V exceeds the predetermined voltage Vd.

FIG. 21 shows an example of the bending displacement characteristic of the digital displacement type. The ceramic element, which exhibits the bending displacement characteristic shown in FIG. 21, is an element which makes displacement in a digital manner up to the maximum displacement amount at the point of time at which the applied voltage V is about 110 V. The average film thickness t of the anti-ferroelectric film 22 is 15 μm. The dimension of the vibrating section 18 resides in a circular planar configuration having a diameter of 1 mm, and the thickness is 0.01 mm.

In a macroscopic viewpoint, the ceramic element 100B according to the second embodiment (the first and second analog displacement types and the digital displacement type) also provides the same function and effect as those obtained by the ceramic element 100A according to the first embodiment described above (see FIGS. 6A to 6C). The mechanical displacement amount is changed in the analog manner or in the digital manner in accordance with the voltage V applied to the upper electrode 40a and the lower electrode 40b. Further, the displacement amount, which is equivalent to that obtained upon the voltage application, can be maintained in the no voltage-loaded state after completion of the application of the applied voltage V.

Next, a modified embodiment (100Ba) of the ceramic element 100B according to the second embodiment will be explained with reference to FIGS. 22 to 23B.

Figure 22:
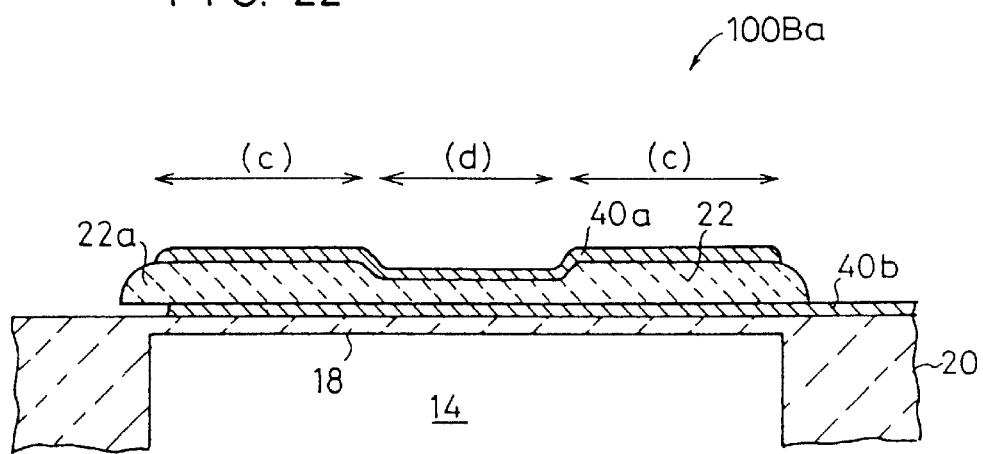
FIG. 22 shows a sectional view illustrating a modified embodiment of the ceramic element according to the second embodiment.

As shown in FIG. 22, the ceramic element 100Ba according to the modified embodiment is constructed in approximately the same manner as the ceramic element 100B according to the second embodiment described above. However, the former is different from the latter in that the former has a region (c) in which the spacing distance between the upper electrode 40a and the lower electrode 40b is wide and a region (d) in which the spacing distance is narrow. This arrangement can be achieved by selectively forming the film thickness distribution of the anti-ferroelectric film 22.

The distance between the upper electrode 40a and the lower electrode 40b is small in the region (d) in which the spacing distance between the upper electrode 40a and the lower electrode 40b is narrow. Therefore, when a constant voltage is applied between the upper electrode 40a and the lower electrode 40b, an electric field is always generated in the region (d), which is higher than that generated in the region (c) in which the spacing distance between the upper electrode 40a and the lower electrode 40b is wide (the distance between the upper electrode 40a and the lower electrode 40b is large).

Figure 23A:
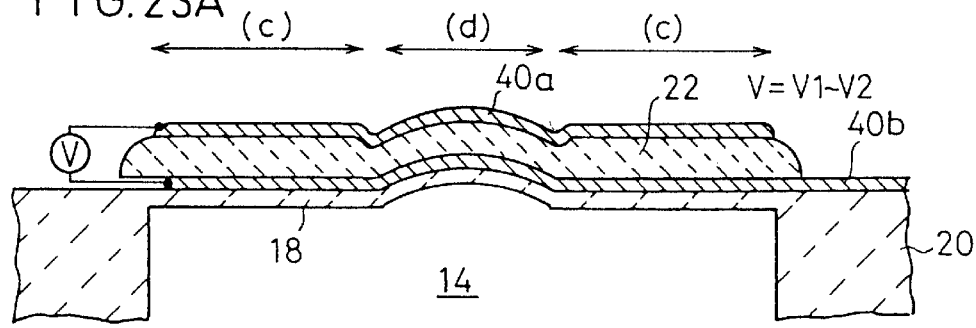
FIG. 23A illustrates a form of displacement in a state in which a voltage in a low voltage range (voltage level V1 to V2) is applied to the pair of electrodes of the ceramic element according to the modified embodiment.

Accordingly, when the voltage applied between the upper electrode 40a and the lower electrode 40b is low, as shown in FIG. 23A, the phase transition region is spread in accordance with the increase in applied voltage only at the portion of the anti-ferroelectric film 22 corresponding to the region (d) in which the spacing distance between the upper electrode 40a and the lower electrode 40b is narrow, in a certain voltage range (voltage levels V1 to V2). Thus, the bending displacement occurs in the first direction in a displacement amount corresponding to the level of the applied voltage V.

Figure 23B:
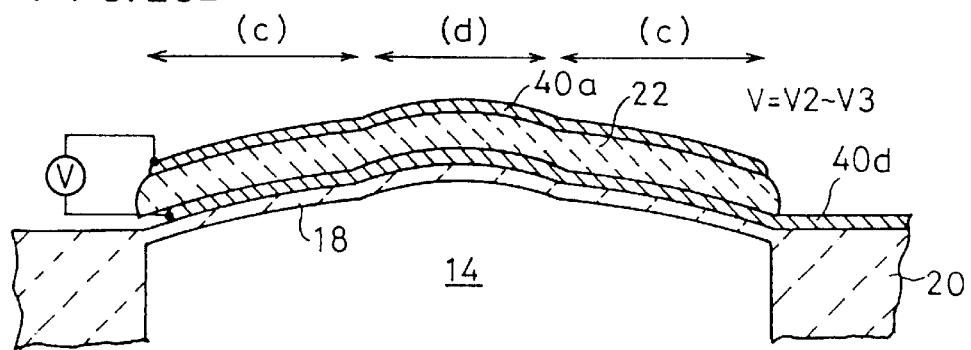
FIG. 23B illustrates a form of displacement in a state in which a voltage in a high voltage range (voltage level V2 to V3) is applied to the pair of electrodes of the ceramic element according to the modified embodiment.

Next, as shown in FIG. 23B, when the applied voltage V is in a voltage range (voltage levels V2 to V3) higher than the voltage range described above, the phase transition region is also spread in the portion corresponding to the region in which spacing distance between the upper electrode 40a and the lower electrode 40b is wide, in accordance with the increase in the applied voltage V. Accordingly, the bending displacement also occurs in the first direction in the concerning portion in a displacement amount corresponding to the level of the applied voltage V together with the portion (d) in which the spacing distance between the upper electrode 40a and the lower electrode 40b is narrow.

As a result, the modified embodiment 100Ba of the ceramic element according to the second embodiment also makes it possible to obtain the actuator element 12 in which the displacement form differs in a plurality of spatially separated regions respectively, in the same manner as the modified embodiment 100Aa of the ceramic element according to the first embodiment described above.

In the case of the ceramic element 100A according to the first embodiment (including the modified embodiment 100Aa), the electrode pattern formed for the actuator element 12 comprises the pair of electrodes 24a, 24b which are formed on the surface of the anti-ferroelectric film 22. In the case of the ceramic element 100B according to the second embodiment (including the modified embodiment 100Ba), the electrode pattern formed for the actuator element 12 comprises the upper electrode 40a and the lower electrode 40b which are formed on the upper and lower surfaces of the anti-ferroelectric film 22 respectively. Alternatively, the electrode pattern may be formed as follows. That is, a region having an electrode pattern similar to the electrode pattern of the ceramic element 100A according to the first embodiment and a region having an electrode pattern similar to the electrode pattern of the ceramic element 100B according to the second embodiment may coexit in one ceramic element or in one continuous anti-ferroelectric film 22.

It is also possible to adopt an arrangement in which the analog displacement type and the digital displacement type coexist in one ceramic element or in one continuous anti-ferroelectric film 22.

Next, explanation will be made for the respective constitutive components of the actuator element 12 of the ceramic elements 100A, 100B according to the first and second embodiments, for example, especially for selection of materials for the respective constitutive components.

At first, those usable as the ceramic for constructing the vibrating section 18 include, for example, zirconium oxide, aluminum oxide, magnesium oxide, titanium oxide, spinel, mullite, aluminum nitride, silicon nitride, glass, and mixtures thereof.

Stabilized zirconium oxide is especially preferred because of, for example, high mechanical strength obtained even when the thickness of the vibrating section 18 is thin, and high toughness. The term "stabilized zirconium oxide" includes stabilized zirconium oxide and partially stabilized zirconium oxide. As a stabilizer to obtain stabilized zirconium oxide, calcium oxide, magnesium oxide, yttrium oxide, scandium oxide, ytterbium oxide, cerium oxide, or other oxides of rare earth metals may be contained in an amount of 1 to 30 mole %. Especially, in order to enhance the mechanical strength of the vibrating section 18, it is preferable to contain yttrium oxide in an amount of 1.5 to 6 mole %, and more preferably 2 to 5 mole %.

When the vibrating section 18 containing the major component of partially stabilized zirconium is used, it is desirable to further contain and appropriately add 0.1 to 5 mole % of aluminum oxide, 0.1 to 10 mole % of titanium oxide, or a mixture of titanium oxide and aluminum oxide, in order to increase the relative displacement amount and control the reactivity and the tight adherence between the vibrating section 18 and the anti-ferroelectric film 22.

That is, for example, the following composition is used for the anti-ferroelectric film 22. When it is intended to improve the tight adherence between the vibrating section 18 and the anti-ferroelectric film 22, it is preferable to add 0.1 mole % of aluminum oxide.

$$Pb_{0.99}Nb_{0.02}\{[Zr_xSn_{1-x}]_{1-y}Ti_y\}_{0.98}O_3$$

wherein $0.5<x<0.6$, $0.05<y<0.063$, $0.01<Nb<0.03$.

This composition is especially preferred for the ceramic element having the structure in which the second principal surface of the anti-ferroelectric film 22 makes tight adherence to the vibrating section 18, and the pair of electrodes 24a, 24b are formed on the opposing first principal surface, as in the ceramic element 100A according to the first embodiment.

On the contrary, when it is intended to inhibit the tight adherence between the vibrating section 18 and the anti-ferroelectric film 22, it is preferable to add 0.1 to 10 mole % of titanium oxide. This composition is especially preferred for the ceramic element having the structure in which the lower electrode 40b is formed on the vibrating section 18, the anti-ferroelectric film 22 is formed thereon, and the upper electrode 40a is further formed thereon, as in the ceramic element 100B according to the second embodiment, because of the following reason. That is, for example, as shown in FIG. 22, it is possible to avoid the decrease in displacement amount which would be otherwise caused by the restriction of a joined portion (joined portion between the anti-ferroelectric film 22 and the vibrating section 18) brought about when the vibrating section 18 makes tight adherence and joining with respect to the outer edge section 22a of the anti-ferroelectric film 22 extending (or protruding) outwardly from the lower electrode 40b.

Concerning the vibrating section 18 containing aluminum oxide, when it is intended to inhibit tight adherence between the vibrating section 18 and the anti-ferroelectric film 22, the following procedure is also preferred. That is, the amount of aluminum oxide is not more than 2 mole %. When the anti-ferroelectric film 22 is formed by the thick film-forming method, a paste to be converted into the anti-ferroelectric film 22 after sintering is applied in accordance with the thick film-forming method, and then heating is performed in an oxidizing atmosphere before sintering to apply a binder-removing treatment. After that, the anti-ferroelectric film 22 is sintered in a predetermined atmosphere.

Aluminum oxide and titanium oxide described herein may be mixed and added to the stabilized zirconium oxide material. However, a more homogeneous raw material powder is obtained by mixing and adding the component by means of, for example, the coprecipitation method during the process of preparing the stabilized zirconium oxide material. Consequently, it is possible to obtain the vibrating section 18 which has a homogeneous texture and which is more excellent in, for example, mechanical strength and durability.

The vibrating section 18 is composed of a large number of ceramic crystals. In order to increase the mechanical strength of the vibrating section 18, the crystal grains desirably have an average grain diameter of 0.05 to 2 μm.

The spacer plate 10B and the closing plate 10C are joined and integrated into one unit as the vibrating section 18 and the fixed section 20 by stacking, sintering, and integrating the green sheets. Therefore, they are desirably made of the same type ceramic.

However, as for the amount of addition of alumina or the like, it is desirable to make adjustment to give an adding amount different from that for the vibrating section 18, if necessary, in order to mitigate strain such as waviness of the substrate 10 after the stacking, sintering, and integrating steps.

Clay or the like is generally added as a sintering aid for the ceramic in some cases. However, it is necessary to adjust the aid component in order that the composition and the characteristic of the anti-ferroelectric film 22 are not changed by excessively increasing the reactivity with the anti-ferroelectric film 22. That is, it is desirable to restrict, for example, silicon oxide in the substrate 10 to be not more than 3%, more preferably not more than 1% in a weight ratio.

Those desirably used as the material for the anti-ferroelectric film 22 include those containing a major component of lead zirconate, those containing major components composed of lead zirconate and lead stannate, those obtained by adding lanthanum oxide to lead zirconate, and those obtained by adding lead titanate and lead niobate to a component composed of lead zirconate and lead stannate.

Especially, when the anti-ferroelectric film 22, which contains the component composed of lead zirconate and lead stannate as represented by the following composition, is applied for the film-type element such as the ceramic elements 10A, 100B according to the first and second embodiments, the element can be driven at a relatively low voltage, which is especially preferred.

$$Pb_{0.99}Nb_{0.02}\{[Zr_xSn_{1-x}]_{1-y}Ti_y\}_{0.98}O_3$$

wherein $0.5<x<0.6$, $0.05<y<0.063$, $0.01<Nb<0.03$.

The anti-ferroelectric film 22 may be porous. When the anti-ferroelectric film 22 is porous, it is desirable that the porosity is not more than 30%.

It is preferable that the anti-ferroelectric powder to be used as the raw material for the anti-ferroelectric film 22 is subjected to dry milling or grinding by using, for example, a dry vibrating mill or a dry attriter before preparing a printing paste, in order to obtain the anti-ferroelectric film 22 which is more dense and which has excellent bending displacement characteristics.

In this embodiment, it is especially preferable that Ag is contained in the composition described above in an amount of 1 to 10% by weight as converted into an amount of silver oxide, as the material for the anti-ferroelectric film 22, in order to obtain the more dense and large displacement and in order to obtain more stable shape memory characteristics.

The following means may be used to contain Ag. That is, Ag may be added in a form of oxide together with other raw material powders during the process of preparing the anti-ferroelectric film 22. Alternatively, Ag may be added as silver oxide or as an aqueous solution of silver nitrate to a previously prepared powder of the anti-ferroelectric material. Further alternatively, Ag may be mixed in a form of silver oxide powder or in a form of organic metal compound of Ag when the printing paste is prepared.

It is desirable that the thickness of the anti-ferroelectric film 22 and the thickness of the vibrating section 18 have the same dimension, because of the following reason. That is, if the thickness of the vibrating section 18 is extremely thicker than the anti-ferroelectric film 22 (by one or more digits), the vibrating section 18 restricts the contraction of the anti-ferroelectric film 22 during the sintering step for the anti-ferroelectric film 22 to cause the contraction. For this reason, the extremely thick thickness may cause factors such that the anti-ferroelectric film 22 tends to peel off from the vibrating section 18, the densifying process for the anti-ferroelectric film 22 is inhibited, and the residual stress remains in the anti-ferroelectric film 22 after the sintering, resulting in deterioration of the characteristic.

On the contrary, if the dimension of the thickness is in approximately the same degree, the vibrating section 18 follows the contraction during the sintering step for the anti-ferroelectric film 22, making it easy to cause deformation. It is possible to obtain the anti-ferroelectric film 22 which is dense and which has excellent displacement characteristics.

Specifically, the thickness of the vibrating section 18 is preferably 1 to 50 $\mu$m, and more preferably 3 to 20 $\mu$m. On the other hand, the average thickness of the anti-ferroelectric film 22 is preferably 1 to 100 $\mu$m, more preferably 3 to 5 $\mu$m, and most preferably 5 to 40 $\mu$m.

Preferably, the electrodes 24a, 24b (40a, 40b) are thin as compared with the vibrating section 18 and the anti-ferroelectric film 22, because the force to restrict the displacement action of the actuator element 12 is weakened. Specifically, the thickness is preferably 0.01 to 10 $\mu$m, and more preferably 0.01 to 5 $\mu$m.

It is preferable that the material for the electrodes 24a, 24b (40a, 40b) is solid at room temperature, and it is composed of a conductive substance. Those usable for the electrodes include, for example, metal simple substances or alloys containing, for example, aluminum, titanium, chromium, iron, cobalt, nickel, copper, zinc, niobium, molybdenum, ruthenium, rhodium, silver, stannum, tantalum, tungsten, iridium, platinum, gold, lead, and beryllium. It is needless to say that these elements may be contained in an arbitrary combination.

In the case of the ceramic element having the structure in which the lower electrode 40b intervenes between the vibrating section 18 and the anti-ferroelectric film 22 as in the ceramic element 100B according to the second embodiment, it is desirable to have the heat resistance to withstand the sintering temperature for the anti-ferroelectric film 22. It is also preferable to select a material which is excellent is corrosion resistance, if necessary.

Next, the method for producing the ceramic elements 100A, 100B according to the first and second embodiment will be explained.

The substrate 10, which includes the vibrating section 18 and the fixed section 20, can be made into an integrated unit by stacking formed layers provided as green sheets or green tapes by means of thermal pressing and gluing, followed by sintering. For example, the substrate 10 shown in FIG. 1 is preferably obtained by stacking three layers of green sheets or green tapes, in which a window having a predetermined shape to form the hollow space 14 is previously provided in the second layer of the three layers before the stacking process. Alternatively, for example, a molded layer may be produced by means of, for example, pressing, casting, or injection molding based on the use of a mold so that the hollow space (window) 14 and other components may be formed therein by means of mechanical processing such as cutting, cutting processing, laser processing, and punching by press processing. The three-layered structure is shown in FIG. 1. However, four-layered or five-layered structure may be used so that the rigidity of the substrate 10 may be improved, or a layer to be used as a back wiring board may be simultaneously stacked and formed.

Next, the main actuator element 26 is formed on the vibrating section 18 of the substrate 10. In this procedure, two methods are available including a film-forming method described later on and a method in which the anti-ferroelectric film 22 is formed in accordance with, for example, a press molding method based on the use of a mold or a tape-forming method based on the use of a slurry material, the anti-ferroelectric film 22 before sintering is stacked on the vibrating section 18 of the substrate 10 before sintering by means of thermal pressing and gluing, and they are simultaneously sintered to form the anti-ferroelectric film 22 on the vibrating section 18 of the substrate 10.

In the film-forming method, the anti-ferroelectric film 22 and the pair of electrodes 24a, 24b are stacked on the vibrating section 18 in this order. Those appropriately usable as the film-forming method include, for example, thick film methods such as screen printing, application methods such as dipping, and thin film methods such as ion beam, sputtering, vacuum deposition, ion plating, chemical vapor deposition (CVD), and plating. The wiring arrangements and terminal pads, which are connected to the pair of electrodes 24a, 24b, are also formed by using the thick film method and the thin film method described above.

For example, the following illustrative production method is adopted for the ceramic element 100A according to the first embodiment. At first, the anti-ferroelectric film 22 is formed on the vibrating section 18 of the substrate 10 by means of the screen printing method. After that, sintering is performed to join the anti-ferroelectric film 22 onto the vibrating section 18 of the substrate 10. In this procedure, in order to improve the joining performance between the substrate 10 and the anti-ferroelectric film 22 and advantageously integrate the substrate 10 and the anti-ferroelectric film 22 into one unit, it is preferable to carry out sintering for the anti-ferroelectric film 22 in an atmosphere of the anti-ferroelectric material in a tightly sealed vessel. More preferably, it is desirable to increase the atmosphere concentration.

The atmosphere sintering is performed, for example, in accordance with the following method.

(1) Powder composed of the same components as those of the anti-ferroelectric material, which is used as an evaporation source, is placed together in the tightly sealed vessel.

(2) The composition of the anti-ferroelectric material is allowed to previously contain an excessive amount of lead components.

(3) A plate made of the anti-ferroelectric material is used as a setter.

The sintering temperature is preferably 900 to 1400° C., and more preferably 1100 to 1400° C.

Figure 50:
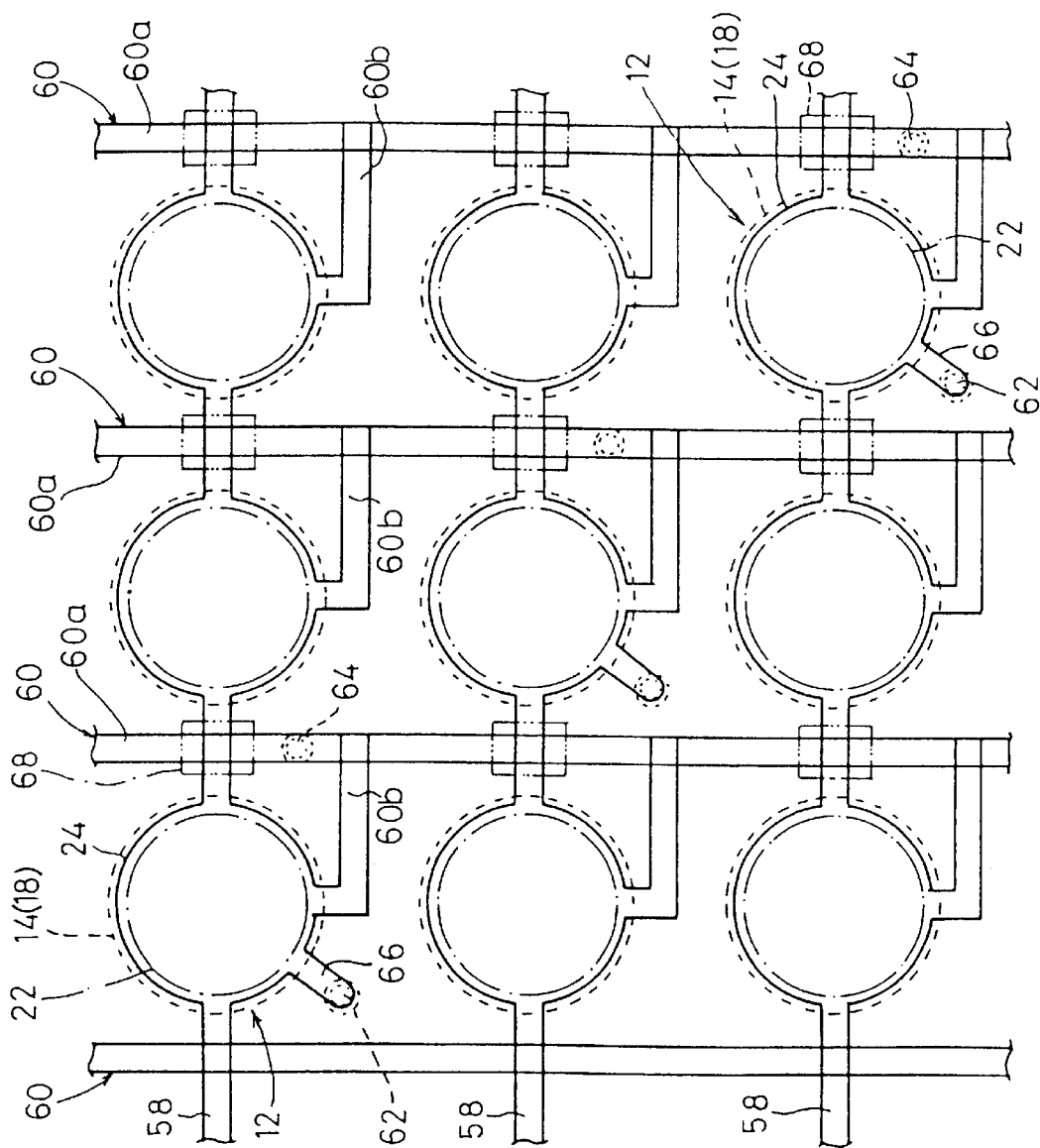
FIG. 50 shows a magnified plan view illustrating an arrangement of actuator elements (picture elements or image pixels) of the display device concerning the applied embodiment.

After completion of the joining of the substrate 10 to the anti-ferroelectric film 22, a wiring layer including the pair of electrodes 24a, 24b is formed by means of the screen printing. The pattern of the wiring layer includes, for example, a pattern for the vertical selection lines 58, a pattern for the signal lines 60, and an electrode pattern, as shown in FIG. 50. At this stage (stage of the screen printing), the electrode pattern has a simple circular configuration which is not the spiral configuration as shown in FIG. 3 or the branched configuration as shown in FIG. 4.

After that, portions of the circular electrode pattern to be processed are evaporated off by using, for example, an excimer laser. Thus, patterning is performed to provide the spiral configuration as shown in FIG. 3 or the branched configuration as shown in FIG. 4 so that the pair of electrodes 24a, 24b are produced.

A heat treatment is performed after completion of the patterning by means of the excimer laser to complete the formation of the main actuator element 26 on the substrate 10. When the pair of electrodes 24a, 24b are formed in accordance with the thin film method, the heat treatment is not necessarily required.

Next, explanation will be made for the production of the ceramic element 100B according to the second embodiment. In this case, a method as the film-forming method is adopted to stack the lower electrode 40b, the anti-ferroelectric film 22, and the upper electrode 40a on the vibrating section 18 in this order. Specifically, for example, the following illustrative method is adopted.

At first, aluminum oxide is previously added in an amount of 1 mole % to form the vibrating section 18 of the substrate 10. A paste containing major components of a platinum powder and an organic binder is applied by printing onto the vibrating section 18 by means of the screen printing method, followed by a drying step and sintering. Thus, the lower electrode 40b is formed.

After that, a paste containing major components of an anti-ferroelectric powder and an organic binder is applied by printing by means of the screen printing method in the same manner as described above. After drying, a degreasing treatment is performed for 1 hour at 500 to 600° C. in an oxidizing atmosphere.

Subsequently, the atmosphere sintering is performed in the same manner as performed in the first embodiment to form the anti-ferroelectric film 22. After that, a paste principally composed of a solvent and an organic metal compound containing gold is applied by printing by means of the screen printing method, followed by drying and sintering to form the upper electrode 40a.

Next, a ceramic element 100C according to the third embodiment will be explained with reference to FIGS. 24 to 48.

The ceramic element 100C according to the third embodiment resides in the ceramic element comprising the anti-ferroelectric film 22 formed on the vibrating section 18 as in the ceramic elements 100A, 100B according to the first and second embodiments described above, wherein the shape memory effect is further enhanced in the ceramic element 100C.

Figure 25:
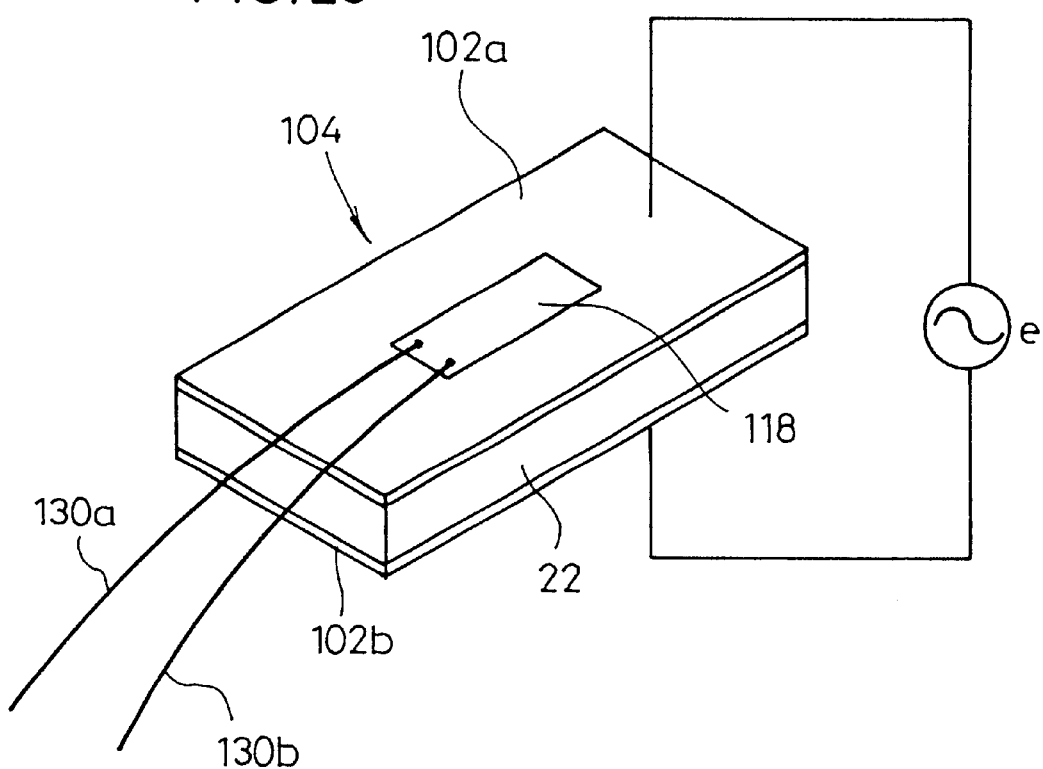
FIG. 25 shows a perspective view illustrating a bulk-type element.

In order to produce the ceramic element 100C according to the third embodiment, the present inventors have confirmed the shape memory effect for a so-called bulk-type element 104 comprising electrodes 102a, 102b formed on both surfaces of the anti-ferroelectric film 22 as shown in FIG. 25, the ceramic element 100A according to the first embodiment comprising the pair of electrodes 24a, 24b formed on the anti-ferroelectric film 22 formed on the vibrating section 18 as shown in, for example, FIG. 1, and the ceramic element 100B according to the second embodiment comprising the lower electrode 40b, the anti-ferroelectric film 22, and the upper electrode 40a successively stacked on the vibrating section 18 as shown in, for example, FIG. 14.

As a result, the following fact has been revealed. That is, the bending displacement is maintained in the bulk-type element 104 shown in FIG. 25 even when the applied voltage is lowered and the element is held for several seconds or more after the voltage to exceed the phase transition electric field is applied. However, in the case of the ceramic elements 100A, 100B described above, the bending displacement is decreased during a holding period of several milliseconds or several tens milliseconds, and the shape memory effect is obtained only for a short period of time when the applied voltage is lowered after the voltage to exceed the phase transition electric field is applied. Especially, it has been revealed that the decreasing rate of the bending displacement is slightly larger in the ceramic element 100A according to the first embodiment than in the ceramic element 100B according to the second embodiment.

It is assumed that such a result has been obtained due to the following factor. That is, the residual stress is generated in the anti-ferroelectric film 22, and any harmful crystal strain is induced, due to the stress restriction exerted on the vibrating section 18 during the sintering process and the cooling process for the anti-ferroelectric film 22. Therefore, if such an element is applied to the display device 20 as described later on, it is feared that the brightness may be decreased, or any fluctuation in brightness may occur due to any variation of voltage when the driving operation is effected for adjacent picture element.

Figure 24:
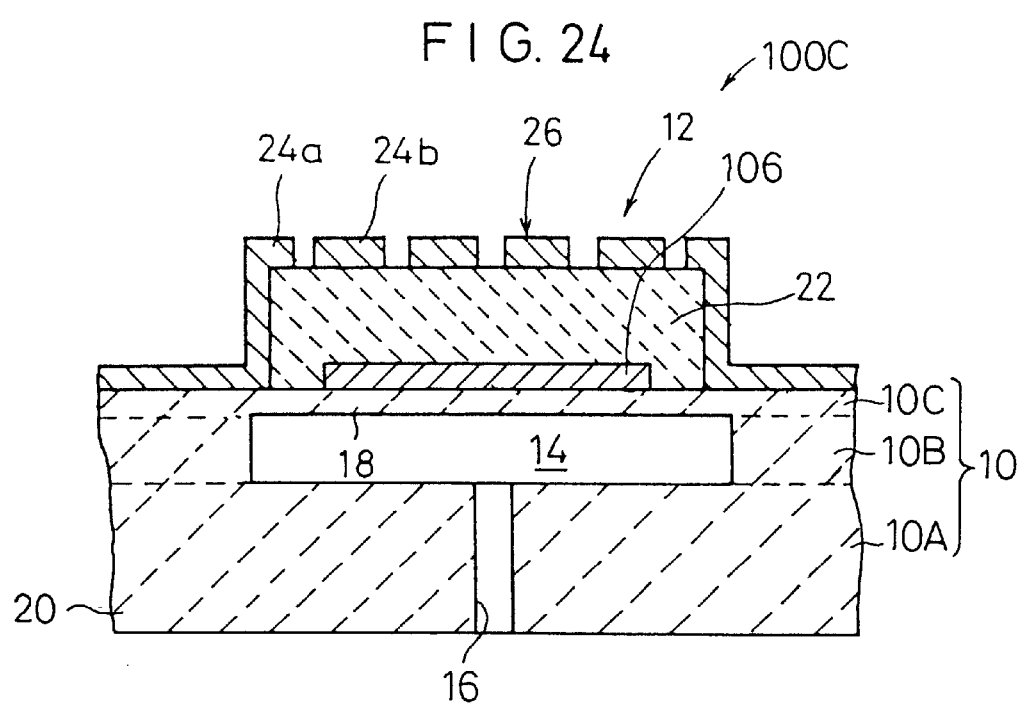
FIG. 24 shows a sectional view illustrating a structure of a ceramic element according to a third embodiment.

Accordingly, the present inventors have investigated the following five conditions in order to dissolve the inconvenience of the ceramic element 100A according to the first embodiment described above:

(1) formation of an intermediate layer 106 (see FIG. 24);
(2) thin film formation for the substrate 10 and the vibrating section 18;
(3) loaded sintering (hot press method, see FIG. 29);
(4) speculative compensation for the composition, post-compensation for the lead component, and pulverization of tin oxide; and
(5) suppression of the depression amount of the vibrating section 18 after the sintering for the anti-ferroelectric film 22.

The ceramic element 100C according to the third embodiment satisfies all of the five conditions described above (see FIG. 24). The effect and the effective range concerning the five conditions will be explained in detail below.

At first, the displacement-retaining ratio is defined as follows. The displacement-retaining ratio represents a percentage of displacement obtained when a predetermined voltage is applied during voltage drop, after applying a certain peak voltage (for example, 130 V) to the anti-ferroelectric film 22 to allow it to perform bending displacement, and then lowering the applied voltage to measure the displacement at the predetermined voltage (for example, 50 V), provided that the displacement amount at the peak voltage is 100%.

Figure 47:
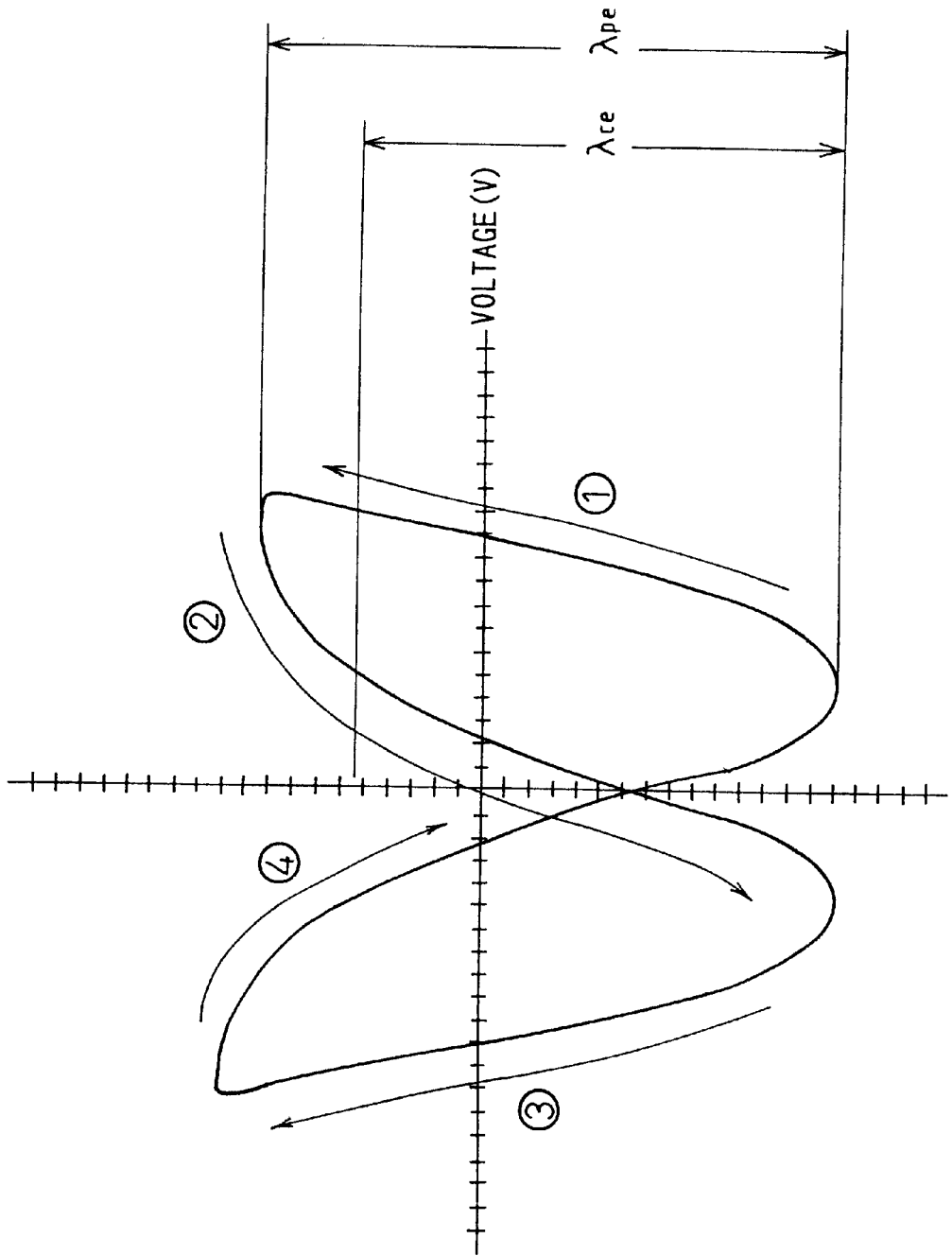
FIG. 47 shows a characteristic curve illustrating the voltage-bending displacement characteristic (hysteresis characteristic) concerning Example 17.

The displacement action is caused in response to the applied voltage as follows as shown, for example, in FIG. 47. That is, for example, the displacement is made along a curve indicated by (1) from the initial value (0 V) to the positive peak voltage (130 V), and the displacement is made along a curve indicated by (2) from the positive peak voltage to the initial value. The displacement is made along a curve indicated by (3) from the initial value to the negative peak voltage (−130 V), and the displacement is made along a curve indicated by (4) from the negative peak voltage to the initial value.

1. Formation of intermediate layer 106 between vibrating section 18 and anti-ferroelectric film 22

The formation of the intermediate layer 106 refers to the formation of a metal film layer (i.e., the intermediate layer 106) between the vibrating section 18 and the anti-ferroelectric film 22 of the ceramic element 100C comprising the pair of electrodes 24a, 24b formed on the upper surface of the anti-ferroelectric film 22, for example, as shown in FIG. 24. The formation of the intermediate layer 106 makes it possible to increase the displacement-retaining ratio to be about 70%.

The reason of the successful increase is estimated as follows. That is, the stress to be generated in the anti-ferroelectric film 22 is mitigated owing to the stress restriction of the vibrating section 18 during the sintering process and the cooling process for the anti-ferroelectric film 22, by allowing the metal film layer (intermediate layer 106) to intervene between the vibrating section 18 and the anti-ferroelectric film 22, the metal film layer being soft at high temperature.

Those preferably used as the material for the intermediate layer 106 include Pt, Pd, and an alloy of the both. The thickness of the intermediate layer 106 is appropriately not less than 1 μm and not more than 10 μm, and preferably not less than 2 μm and not more than 6 μm, because of the following reason.

That is, if the thickness is less than 1 μm, the effect of stress mitigation does not appear. If the thickness exceeds 10 μm, the intermediate layer 106 is peeled off from the vibrating section 18 due to the sintering contraction during the sintering process for the intermediate layer 106.

An illustrative experiment (hereinafter referred to as "first illustrative experiment" for convenience) will now be explained. In the first illustrative experiment, the way of change of the displacement-retaining ratio depending on the thickness of the intermediate layer 106 was confirmed on the basis of Example 1 to Example 3 and Comparative Example 1 to Comparative Example 3.

An intermediate layer 106 of Pt was formed in 4 μm in Example 1. An intermediate layer 106 of Pd was formed in 2 μm in Example 2. An intermediate layer 106 of Pd was formed in 8 μm in Example 3. On the other hand, an intermediate layer 106 of Pt was formed in 15 μm in Comparative Example 1. An intermediate layer 106 of Pt was formed in 0.5 μm in Comparative Example 2. No intermediate layer 106 was formed in Comparative Example 3.

Experimental results are shown in FIG. 26. In the case of Comparative Example 1 in which the intermediate layer 106 was 15 μm, the measurement could not be performed due to peeling off of the intermediate layer. In the case of Comparative Example 2 in which the intermediate layer 106 was 0.5 μm, the displacement-retaining ratio was decreased to be about 58%. Further, in the case of Comparative Example 3 which had no intermediate layer 106, the displacement-retaining ratio was extremely low, i.e., 54%.

Therefore, according to the results, the thickness of the intermediate layer 106 is appropriately not less than 1 μm and not more than 10 μm, and preferably not less than 2 μm and not more than 6 μm.

2. Thin film formation for substrate and vibrating section

The thickness of the vibrating section 18 is made thinner than the thickness of the anti-ferroelectric film 22, and the entire thickness of the substrate 10 is simultaneously made to be thin. By doing so, the stress restriction of the substrate 10 exerted on the anti-ferroelectric film 22 is decreased. Therefore, the effect is obtained in that the sintering performance is enhanced for the anti-ferroelectric film 22, and the stress is mitigated.

An illustrative experiment (hereinafter referred to as "second illustrative experiment" for convenience) will now be explained. In the second illustrative experiment, the change of the displacement-retaining ratio depending on the change of the thickness of the substrate 10 was confirmed on the basis of Example 4 to Example 7. Results are shown in FIG. 27. In the table shown in FIG. 7, numerical values depicted in parentheses concerning the thickness of the substrate 10 represent the thicknesses of the vibrating section 18, the spacer plate 10B, and the base plate 10A in this order (see FIG. 24). In any of Example 4 to Example 7, the intermediate layer 106 was not provided. The loaded sintering, the speculative compensation for the powder, and the post-compensation for the lead component were not performed. The specific surface area of $SnO_2$ was 13 m$^2$/g.

According to the experimental results, it is understood that the displacement-retaining ratio is preferably increased by making the thickness of the vibrating section 18 to be thinner than the thickness of the anti-ferroelectric film 22, and simultaneously making the thickness of the entire substrate 10 to be thin as a film.

Figure 28:
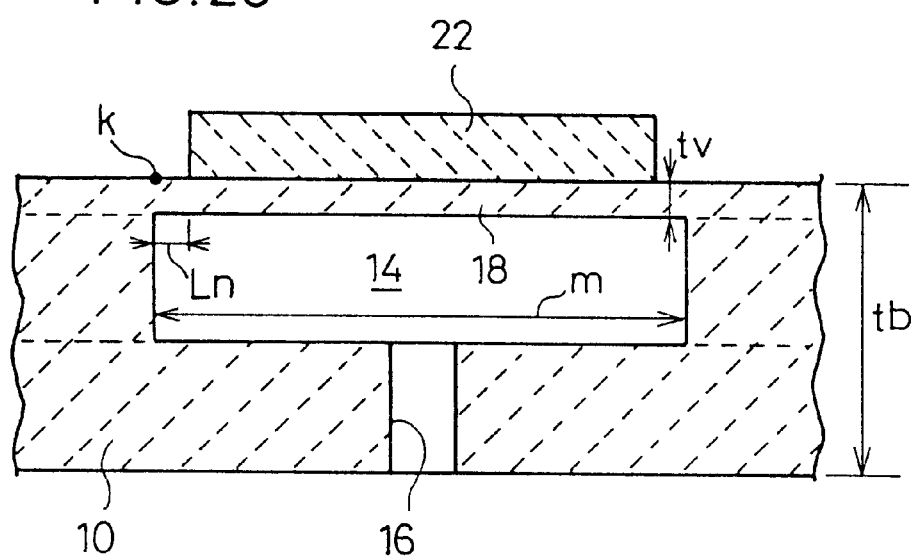
FIG. 28 illustrates the dimensional relation between the substrate and the vibrating section.

As shown in FIG. 28, the embodiment described above is established when Ln<tv×15 is satisfied under the following condition. That is, concerning the shortest dimension m passing through the center of the vibrating section 18, the boundary portion between the upper surface of the fixed section 20 and the upper surface of the vibrating section 18 is defined as "boundary point k". It is assumed that the distance from the boundary point k to the end of formation of the anti-ferroelectric film 22 is Ln (μm), and the thickness of the vibrating section 18 is tv (μm). On this assumption, the thickness tb of the substrate 10 is appropriately tb≦350 μm, preferably tb≦250 μm, more preferably tb≦130 μm, and most preferably tb≦70 μm. On the other hand, if Ln≧tv×15 is satisfied, the thickness of the vibrating section 18 is preferably 1 to 50 μm, and more preferably 3 to 20 μm. Further, the average thickness of the anti-ferroelectric film 22 is preferably 1 to 10 μm, more preferably 3 to 50 μm, and most preferably 5 to 40 μm.

3. Loaded sintering (hot press method)

In this method, as shown in FIG. 29, the anti-ferroelectric film 22 is sintered and treated while applying a load (hot press load) P to the anti-ferroelectric film 22 formed on the substrate 10. The term "sample 108" is hereinafter used, which is at the stage in which the anti-ferroelectric film 22 is formed by printing on the substrate 10.

A specified method is illustrated, for example, in FIG. 30A. In this method, for example, a pedestal 114 is installed in an electric furnace 112 for performing sintering by applying the electric power to a heater 110. The sample 108 is placed on the pedestal 114 so that the bottom surface of the substrate 10 contacts with the upper surface of the pedestal 114. Sintering is performed in a state in which a weight 116 is placed on the sample 108. Another method is shown in FIG. 330B. That is, the sample 108 is placed on the pedestal 114 installed in the electric furnace 112 so that the upper surface of the anti-ferroelectric film 22 contacts with the upper surface of the pedestal 14. Sintering is performed in a state in which the weight 116 is placed on the bottom surface of the substrate 10.

The loaded sintering makes it possible to enhance the sintering performance for the anti-ferroelectric film 22 and obtain a more dense film.

The hot press load P is preferably not less than 0.4 kg/cm$^2$. However, the load is in a degree in which the vibrating section 18 is not destroyed, depending on the thickness of the vibrating section 18, because of the following reason. That is, if the load is too large, it is feared that the vibrating section 18 is cracked at the end s of the spacer plate 10B and the vibrating section 18 (see FIG. 29).

An illustrative experiment (hereinafter referred to as "third illustrative experiment" for convenience) will now be explained. In the third illustrative experiment, the change of the degree of denseness of the anti-ferroelectric film 22 depending on the change of the hot press load P was confirmed on the basis of Example 8 and Comparative Examples 4 to 6. The degree of denseness of the film is represented by "degree of denseness=100%−surface porosity".

Experimental results are shown in FIG. 31. According to the results, the hot press load P is not less than 4 g/cm$^2$, and its upper limit differs depending on the thickness of the vibrating section 18. Preferably, the load is in a degree in which the vibrating section 18 is not destroyed.

4. Speculative compensation for composition, post-compensation for lead component, and pulverization of tin oxide powder a. Speculative Compensation for Composition In order to form the anti-ferroelectric film 22, the anti-ferroelectric ceramic material powder is prepared. During this process, the variation in composition, which is caused by the mutual diffusion between the anti-ferroelectric film 22 and the vibrating section 18 during sintering, is speculated. The powder composition of the anti-ferroelectric ceramic material is prepared by being deviated from the optimum composition.

Specifically, zirconium diffuses and inflows from the vibrating section 18 during the sintering for the anti-ferroelectric film 22, and titanium diffuses and outflows from the anti-ferroelectric film 22 to the vibrating section 18. Therefore, the amount of zirconium is previously decreased, and the amount of titanium is increased beforehand.

The amount of adjustment for each of the components also relates to, for example, the sintering condition, the composition of the vibrating section 18, and the thickness of the anti-ferroelectric film 22. Therefore, it is important to individually determine the optimum adjustment amount.

Next, the difference between the ordinary preparation method in which the speculative compensation is not performed and the concerning preparation method in which the speculative compensation is performed will be explained with reference to block diagrams illustrating the steps shown in FIGS. 32 and 33.

Figure 32:
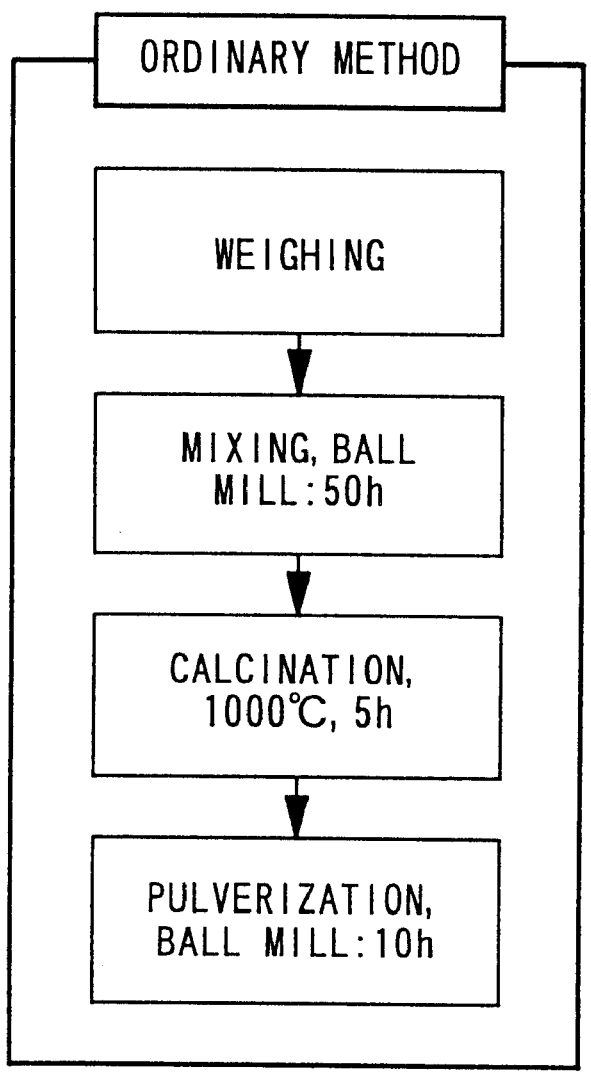
FIG. 32 shows a block diagram illustrating steps of an ordinary method used when a powder of an anti-ferroelectric ceramic material is prepared.

As shown in FIG. 32, in the ordinary preparation method, the powder of the anti-ferroelectric ceramic material is weighed in conformity with the optimum composition, and then the powder is mixed in a ball mill (50 hours). Subsequently, the mixed powder is calcined at 1000° C. for 5 hours, followed by pulverization with a ball mill (10 hours).

Figure 33:
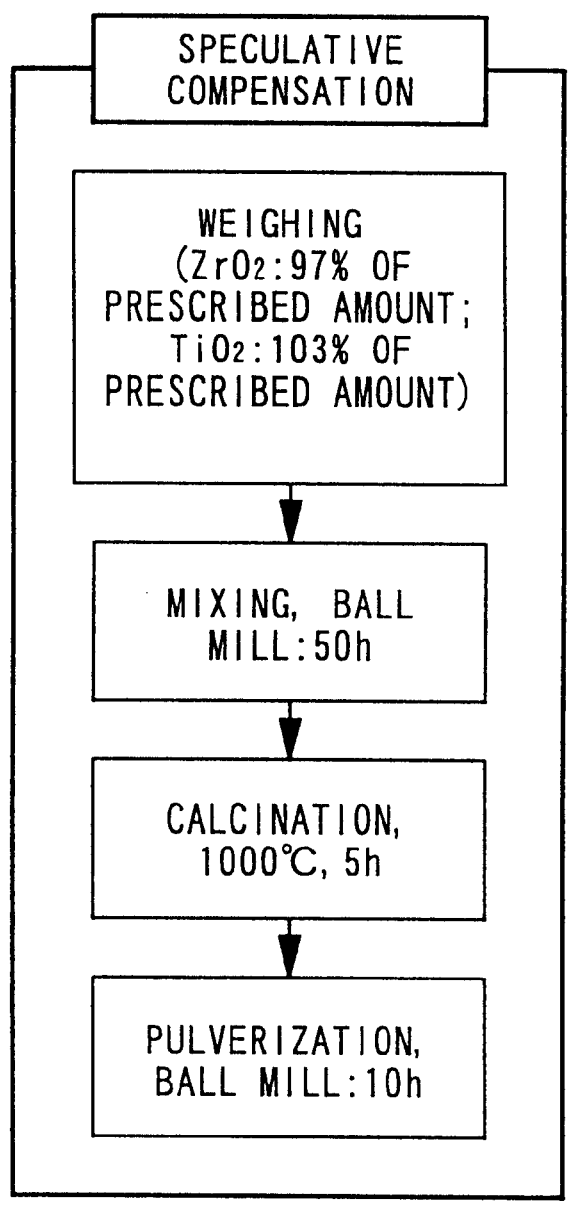
FIG. 33 shows a block diagram illustrating steps of a method for preparing a powder of an anti-ferroelectric ceramic material to be used when speculative compensation is carried out.

As shown in FIG. 33, in the preparation method in which the speculative compensation is performed, the composition of the powder to be weighed is slightly different. However, in an overall viewpoint, the steps are approximately the same as those of the ordinary preparation method. In this case, ZrO$_2$ is weighed in an amount smaller than the optimum composition of the sintered compact, and TiO$_2$ is weighed in an amount larger than the optimum composition of the sintered compact.

An illustrative experiment (hereinafter referred to as "fourth illustrative experiment" for convenience) will now be explained. In the fourth illustrative experiment, the way of the change of the displacement-retaining ratio depending on the speculative compensation amount was confirmed on the basis of Example 9-1, Example 9-2, Example 10-1, Example 10-2, and Comparative Example 7. The speculative compensation amount herein refers to the percentage for each of the amounts of ZrO$_2$ and TiO$_2$ to be added provided that each of the prescribed amounts is 100%.

Experimental results are shown in FIG. 34. According to the results, the amount of ZrO$_2$ is appropriately 95 to 98% provided that the optimum sintered compact composition is regarded as 100%, and/or the amount of TiO$_2$ is appropriately 102 to 104% provided that the optimum sintered compact composition is regarded as 100%.

b. Post-compensation for Lead Component

The anti-ferroelectric film 22 is formed on the vibrating section 18 by means of the screen printing method. When the printing material is prepared, especially when the anti-ferroelectric ceramic material powder is prepared, lead oxide is previously prepared in a composition which is smaller by 10%, and then the amount of shortage of 10% is mixed in a form of lead oxide. An obtained mixed material is used as the printing material for forming the anti-ferroelectric film. In this case, the coexistence of the lead oxide powder in a mixed manner improves the sintering performance for the anti-ferroelectric film 22.

Figure 35:
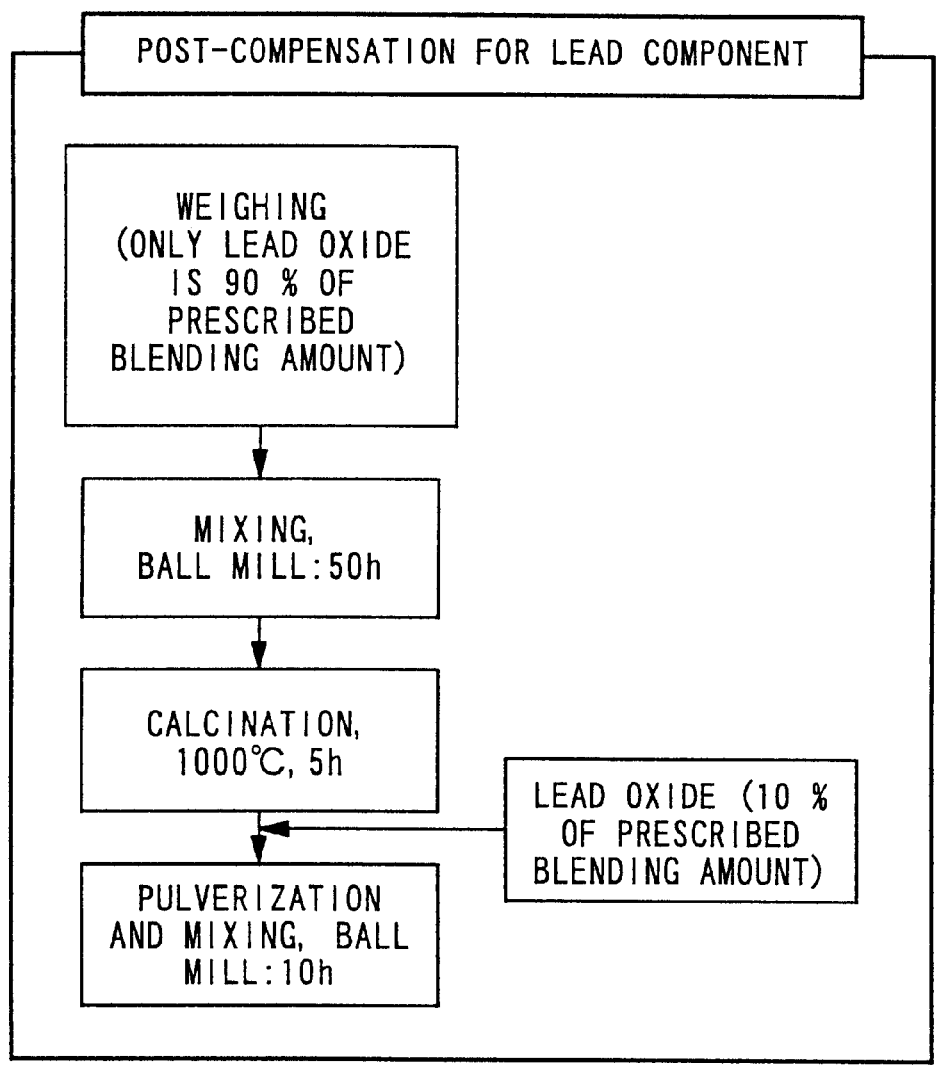
FIG. 35 shows a block diagram illustrating steps of a method for preparing a powder of an anti-ferroelectric ceramic material to be used when post-compensation is carried out for lead component.

In the post-compensation for the lead component, as shown in FIG. 35, the powder of the anti-ferroelectric ceramic material except for lead oxide is weighed in conformity with the optimum composition. Only lead oxide is 90% of the prescribed blending amount. Subsequently, the powders are mixed with a ball mill (50 hours), and then the mixed powder is calcined at 1000° C. for 5 hours. After that, lead oxide is mixed in an amount of 10% of the prescribed blending amount, followed by mixing and pulverization with a ball mill (10 hours).

An illustrative experiment (hereinafter referred to as "fifth illustrative experiment" for convenience) will now be explained. In the fifth illustrative experiment, the way of the change of the degree of denseness of the film depending on the post-compensation amount for the lead component was confirmed on the basis of Example 11 to Example 13 and Comparative Examples 10 and 11. The post-compensation amount for the lead component herein refers to the amount of post-compensation (wt %) with respect to 100% of the lead component.

Experimental results are shown in FIG. 36. According to the results, the post-compensation amount for the lead component is appropriately not less than 3% and not more than 20%, and preferably not less than 5% and not more than 15%.

c. Speculative Compensation for Composition+Post-compensation for Lead Component When the powder of the anti-ferroelectric ceramic material is prepared, the speculative compensation for the composition and the post-compensation for the lead component are combined. Thus, the displacement-retaining ratio can be increased, and the degree of denseness of the anti-ferroelectric film 22 can be increased.

Figure 37:
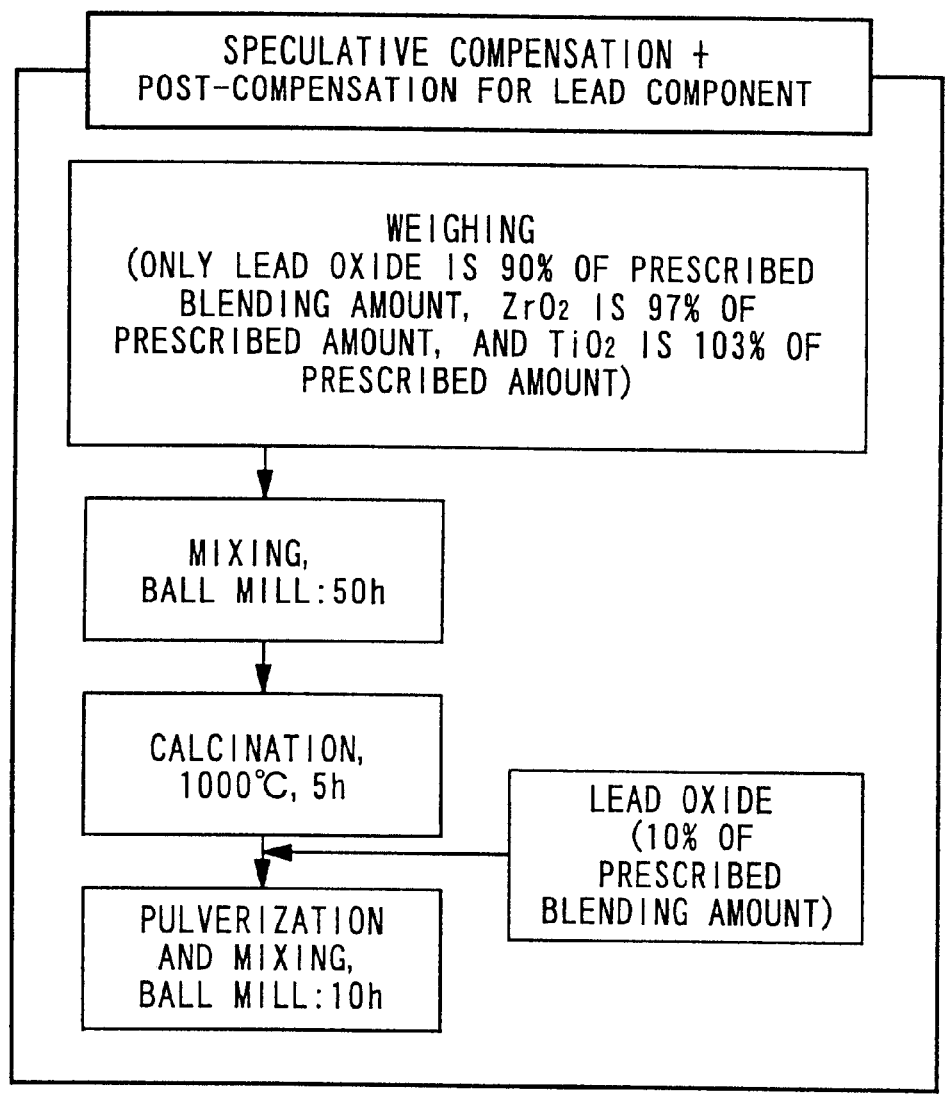
FIG. 37 shows a block diagram illustrating steps of a method for preparing a powder of an anti-ferroelectric ceramic material to be used when speculative compensation and post-compensation for lead component are carried out in combination.

As shown in FIG. 37, in the preparation method based on the combination, lead oxide is 90% of the prescribed blending amount at the stage of weighing. ZrO$_2$ is weighed in an amount smaller than the prescribed amount, and TiO$_2$ is weighed in an amount larger than the prescribed amount. Subsequently, the powders are mixed by using a ball mill (50 hours), and then the obtained mixed powder is calcined at 1000° C. for 5 hours. After that, lead oxide is mixed in an amount of 10% of the prescribed blending amount, followed by mixing and pulverization with a ball mill (10 hours).

d. Pulverization of Tin Oxide Powder

In order to improve the homogeneity and the bending characteristic of the anti-ferroelectric film 22 on the vibrating section 18, the specific surface area of the tin oxide (SnO$_2$) to be used as the raw material is not less than 10 m$^2$/g when the powder of the anti-ferroelectric ceramic material is prepared. The pulverization of tin oxide can be achieved by starting the weighing procedure after only the SnO$_2$ powder is previously pulverized.

An illustrative experiment (hereinafter referred to as "sixth illustrative experiment" for convenience) will now be explained. In the sixth illustrative experiment, the way of the change of the measurement result of the hysteresis characteristic (voltage-strain characteristic) depending on the difference in specific surface area of $SnO_2$ was confirmed on the basis of Example 14 and Comparative Examples 12 and 13.

Experimental results are shown in FIG. 38. In Comparative Example 12 in which the specific surface area was 5 $m^2/g$, $SnO_2$ particles remained. Therefore, the dispersion of the composition was large, and no displacement occurred. In Comparative Example 13 in which the specific surface area was 22 $m^2/g$, $SnO_2$ particles aggregated to one another. Therefore, the dispersion of the composition was large, and no displacement occurred. On the other hand, in Example 14 in which the specific surface area was 13 $m^2/g$, good hysteresis was successfully obtained in the same manner as the characteristic shown in FIG. 48.

Therefore, the specific surface of $SnO_2$ is appropriately not less than 8 $m^2/g$ and not more than 20 $m^2/g$.

Figure 39A:
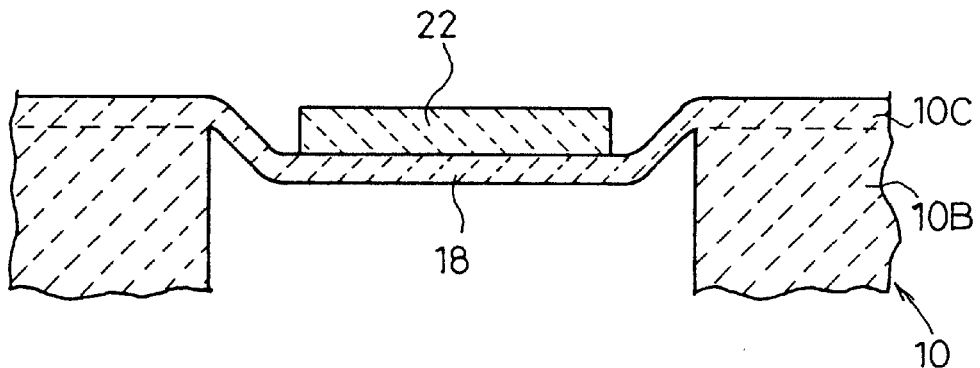
FIG. 39A shows a sectional view illustrating a state in which the vibrating section is depressed.

5. Suppression of depression amount of vibrating section after sintering for anti-ferroelectric film As shown in the condition (2) described above, when the thickness of the anti-ferroelectric film 22 is made thicker than the thickness of the vibrating section 18, the sintering contraction force during the sintering for the anti-ferroelectric film 22 is increased. As shown in FIG. 39A, the flexural displacement in the downward direction of the vibrating section 18 is accelerated, and the depression amount of the vibrating section 18 is increased.

For example, when the thickness of the spacer plate 10B is 150 μm, there is a possibility that the depression amount of the vibrating section 18 is brought about up to 150 μm at the maximum. If the depression amount of the vibrating section 18 is large, then the surface in the vicinity of the center of the anti-ferroelectric film 22 is depressed to be lower than the surface of the substrate 10, and it is feared that the bending displacement to be given by the actuator element 12 may be decreased.

Figure 39B:
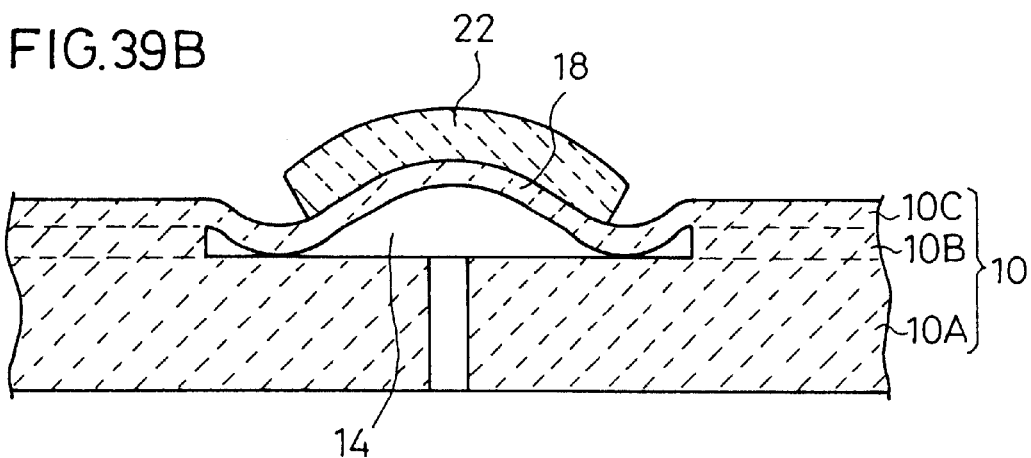
FIG. 39B shows a sectional view illustrating a structure to suppress depression of the vibrating section.

Accordingly, as shown in FIG. 39B, the depth of the space just under the vibrating section 18, i.e., the depth of the hollow space 14 is made to be not more than 10 μm. By doing so, the depression amount of the vibrating section 18 can be suppressed to be not more than 10 μm. Thus, the surface in the vicinity of the center of the anti-ferroelectric film 22 is not depressed to be lower than the surface of the substrate 10. This is also a technique which makes it possible to easily realize the condition shown in FIGS. 12A to 13. It is possible to reliably achieve the displacement of the actuator element 12 in the first direction.

Next, two types of production methods will be explained for the ceramic element in which the depth of the hollow space 14 is 10 μm.

Figure 40:
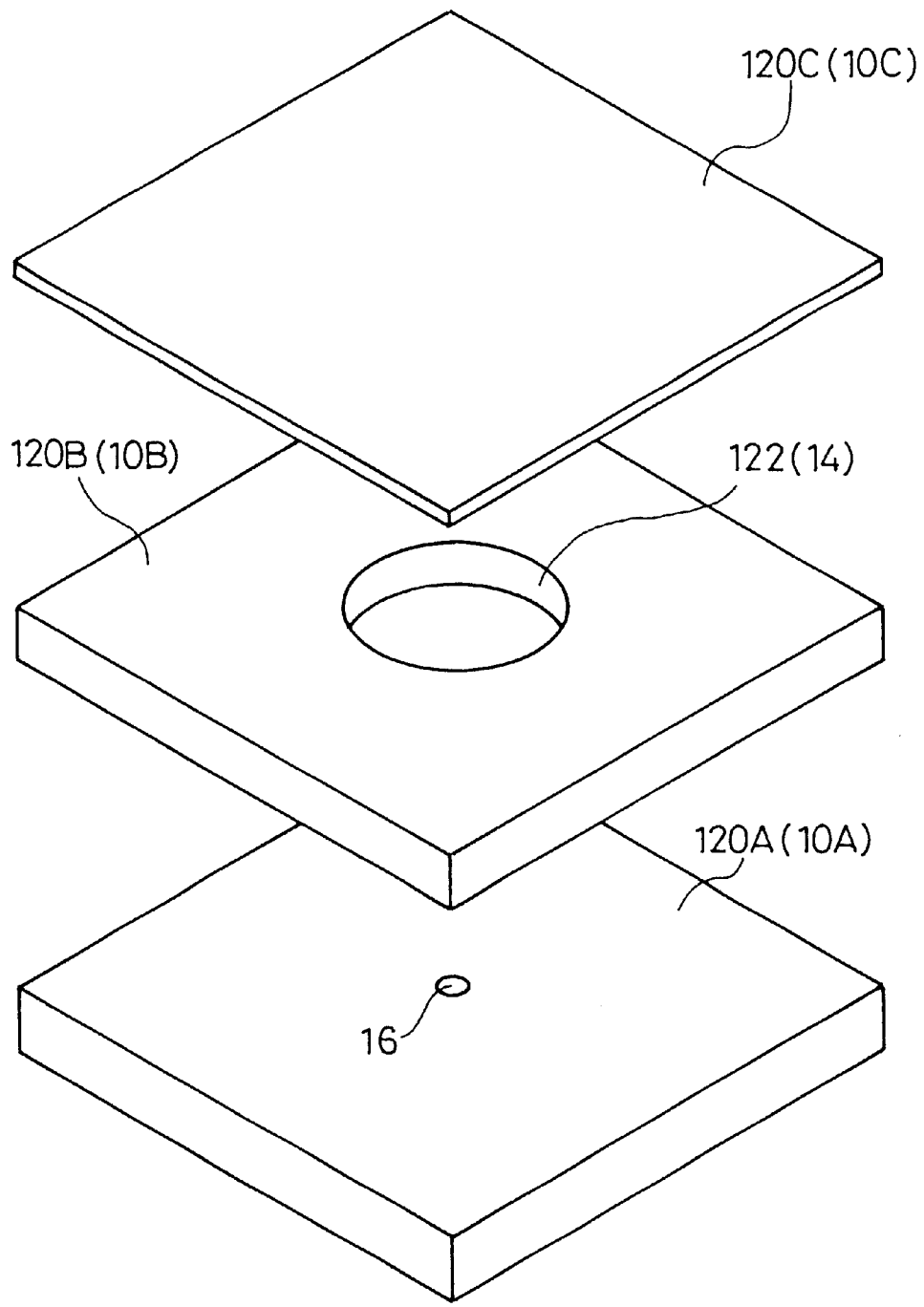
FIG. 40 illustrates a first method for producing a ceramic element in which the depth of a hollow space is 10 $\mu$m.

At first, in the first method, the substrate 10 can be integrated into one unit by stacking formed layers as green sheets or green tapes by means of, for example, thermal adhesion under pressure, followed by sintering. For example, as shown in FIG. 40, three layers of green sheets or green tapes (a layer 120A to form the base plate 10A, a layer 120B to form the spacer plate 10B, and a layer 120C to form the closing plate 10C) are stacked. Among them, a window 122 having a predetermined shape to form the hollow space 14 thereafter is appropriately provided through the second layer (the layer 120B to form the spacer plate 10B) beforehand before stacking the layers.

Alternatively, a molded layer may be produced by means of, for example, pressing, casting, or injection molding based on the use of a mold so that the hollow space 14 (window 122) and other components may be formed therein by means of mechanical processing such as cutting, cutting processing, laser processing, and punching by press processing. In this procedure, it is preferable that the thickness of the second layer 120B is 1 to 15 μm.

Figure 41A:
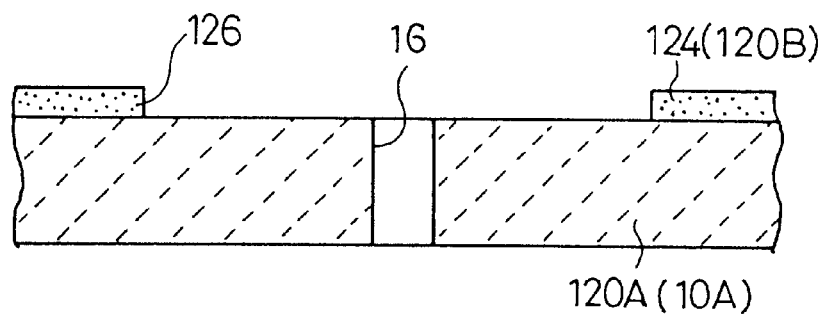
FIG. 41A illustrates a step of a second method for producing a ceramic element in which the depth of a hollow space is 10 $\mu$m, depicting a state in which a paste is formed on a first layer which serves as a base plate so that a second layer is provided.
Figure 41B:
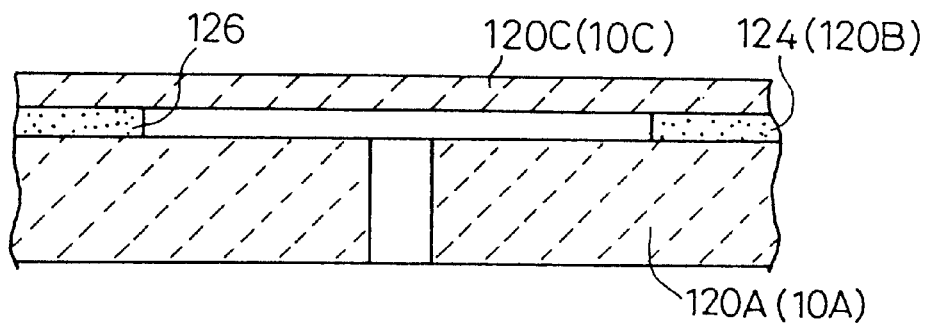
FIG. 41B shows a step illustrating a state in which a third layer which serves as a closing plate is stacked on the second layer.
Figure 41C:
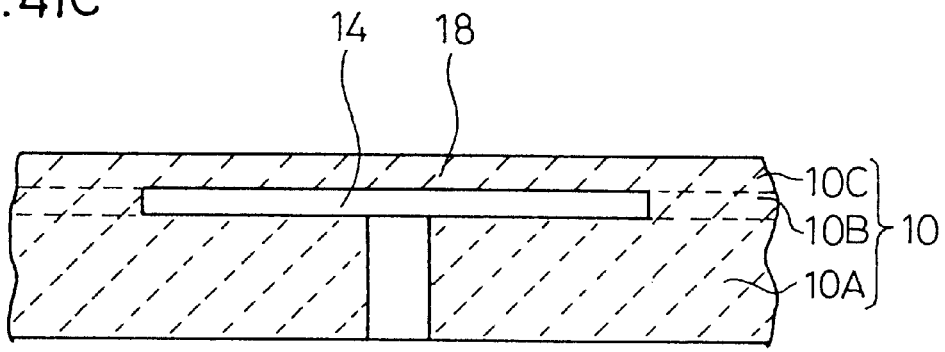
FIG. 41C shows a step illustrating a state in which a stacked compact composed of three layers is sintered and integrated into one unit as a substrate.

In the second method, at first, as shown in FIG. 41A, for example, a paste 124, which is composed of the same material as that for the green sheet or green tape 120A, is applied by the printing method to form a second layer (a layer 120B to form the spacer plate 10B) on the green sheet or green tape 120A to form the base plate 10A. The printing pattern used in this process has a shape in which a window 126 is provided. After that, as shown in FIG. 41B, a third layer (a layer 120C to form the closing plate 10C) is stacked on the entire surface including the second layer 120B, followed by sintering to successfully form the substrate 10 integrated into one unit as shown in FIG. 41C. In this procedure, the hollow space 14 is formed at the portion corresponding to the window 126, and thus the vibrating section 18 is formed. In this embodiment, it is also preferable that the thickness of the printing pattern for the second layer 120B (paste 124 in this embodiment) is 1 to 15 μm.

An illustrative experiment (hereinafter referred to as "seventh illustrative experiment" for convenience) will now be explained. In the seventh illustrative experiment, the way of the change of the depression amount δ of the vibrating section 18 after sintering for the anti-ferroelectric film 22 and the displacement upon application of the peak voltage in an ordinary manner depending on the thicknesses of the second layer (the layer 120B to form the spacer plate 10B) and the anti-ferroelectric film 22 was confirmed on the basis of Examples 15 and 16 and Comparative Examples 14 and 15.

Figure 42:
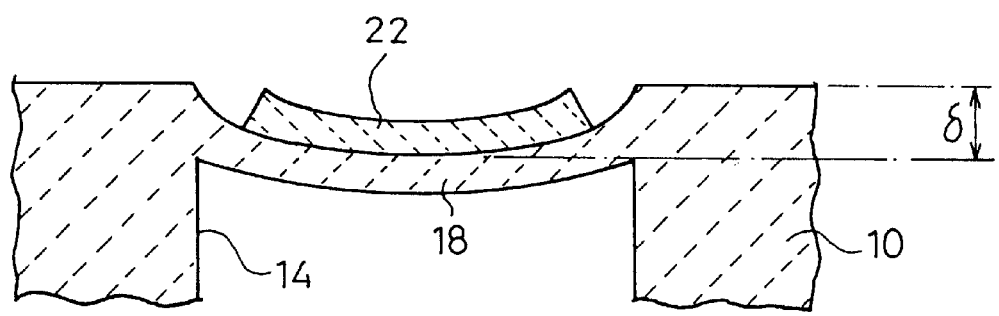
FIG. 42 illustrates the amount of depression of the vibrating section in a seventh illustrative experiment (illustrative experiment to observe the amount of depression of the vibrating section depending on the thickness of the second layer and the anti-ferroelectric film and the change in displacement obtained when the peak voltage is applied in an ordinary manner).

As shown in FIG. 42, the depression amount δ of the vibrating section 18 represents the amount of downward depression from the upper surface of the substrate 10, of the portion corresponding to the central portion of the hollow space 14, of the upper surface of the vibrating section 18 after the sintering for the anti-ferroelectric film 22.

Experimental results are shown in FIG. 43. According to the experimental results, the following fact is acknowledged. That is, when the thickness of the second layer 120B is thin, then the downward depression is suppressed, and the large displacement is obtained. However, when the thickness of the second layer 120B is thick, then the depression is large, and the displacement is small.

The following method may be adopted in addition to the two types of the production methods described above.

That is, an organic paste, which is thermally decomposed and gasified by being heated to several hundreds degrees centigrade, is printed and applied in a pattern of the hollow space shape onto the first principal surface of a green sheet to form the base plate 10A. After that, a green sheet to form the closing plate 10C is stacked on the surface, followed by sintering. Thus, the substrate 10 is obtained, in which the depth of the hollow space 14 is not more than 10 μm. The anti-ferroelectric film 22 and the pair of electrodes 24a, 24b are formed on the substrate 10 as described above. Thus, it is possible to obtain the ceramic element in which the depth of the hollow space 14 is not more than 10 μm. In this embodiment, for example, theobromine ($C_7H_8N_4O_2$) may be adopted as the organic paste.

Still another production method is available. That is, the substrate 10 in which the depth of the hollow space 14 is not more than 10 μm is obtained by radiating a laser beam with a pattern of the hollow space shape onto the first principal surface of a green sheet to form the base plate 10A, decomposing and removing the surface layer, and then stacking a green sheet to form the closing plate 10C onto the surface thereof, followed by sintering. The anti-ferroelectric film 22 and the pair of electrodes 24a, 24b are formed on the substrate 10 as described above. Thus, it is possible to obtain the ceramic element in which the depth of the hollow space 14 is not more than 10 μm. In this embodiment, it is preferable to use, as the laser beam, an excimer laser capable of directly decomposing the chemical bond of the organic substance in the green sheet composition, in view of the fact that the heat is not produced so much on the radiated surface, and it is possible to suppress the deformation and the deterioration of the green sheet associated therewith to the minimum, as compared with the $CO_2$ laser or the like.

Next, explanation will be made on the basis of an illustrative experiment (hereinafter referred to as "eighth illustrative experiment" for convenience) with reference to FIG. 25 and FIGS. 44 to 48, concerning the hysteresis characteristic (voltage-bending displacement characteristic) and the difference in displacement-retaining ratio respectively for Example 17 which resides in the same construction as that of the ceramic element 100C according to the third embodiment and for Comparative Example 16 in which a part of the five conditions are not satisfied. Experimental results obtained in the eighth illustrative experiment are shown in FIG. 44.

Figure 45:
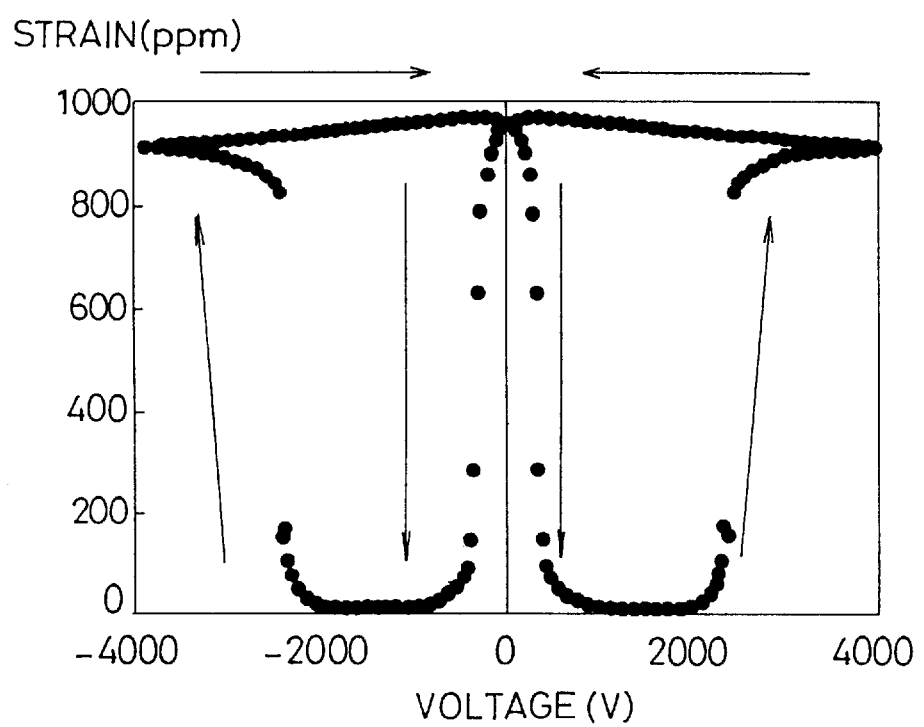
FIG. 45 shows a characteristic curve illustrating the change in strain with respect to the voltage applied to the bulk-type element (hysteresis characteristic).

At first, for the purpose of comparison, explanation will be made for the production condition and the strain-measuring condition for the bulk-type element 104. As shown in FIG. 25, the bulk-type element 104 was produced by molding a calcined powder of an anti-ferroelectric with a uniaxial press, followed by sintering to obtain a sintered product which was processed into 12×3×1 mm to form Ag electrodes 102a, 102b on both principal surfaces. A strain gauge 118 was affixed to one of the Ag electrodes 102a. A voltage e of ±4 kV at a frequency of 0.6 Hz was applied between the both electrodes 102a, 102b. The strain obtained thereby was measured by the aid of lead wires 130a, 130b. Measurement results are shown in FIG. 45. The bulk-type element 104 had a displacement-retaining ratio of 100 to 107% (see FIG. 44).

Subsequently, the ceramic element concerning Example 17 was produced under the following condition. A Pt film having a thickness of 4 μm was formed as the intermediate layer 106 to satisfy the condition of (1) described above. In order to satisfy the conditions of (2) and (5) described above, the substrate 10 having a thickness of 50 μm was used (thickness of the vibrating section 18: 10 μm, thickness of the spacer plate 10B: 10 μm, and thickness of the base plate 10A: 30 μm). In order to satisfy the condition of (3) described above, the hot press load P was 0.6 kg/cm². In order to satisfy the condition of (4) described above, the composition of the anti-ferroelectric film 22 before sintering (i.e., composition after printing) was determined by combining the speculative compensation and the post-compensation for the lead component, and the $SnO_2$ powder had a specific surface area of 11 m²/g.

A sine wave having a frequency of 1 kHz and peak values of ±130 V (see FIG. 46) was applied between the pair of electrodes 24a, 24b on the anti-ferroelectric film 22. The displacement amount obtained thereby was continuously measured by using a laser displacement meter. As a result, for example, a characteristic curve as shown in FIG. 47 was obtained. The following fact is acknowledged in Example 17. That is, according to a displacement λpe at the peak voltage (130 V) and a displacement λce at the predetermined voltage (50 V) during voltage drop, the displacement-retaining ratio is 81 to 95% (see FIG. 44). Thus, the shape memory effect is sufficiently exhibited.

On the other hand, the ceramic element concerning Comparative Example 16 was produced under the following condition. The intermediate layer 106 was not formed. The substrate 10 having a thickness of 310 μm was used (thickness of the vibrating section 18: 10 μm, thickness of the spacer plate 10B: 150 μm, and thickness of the base plate 10A: 150 μm). The loaded sintering was not performed. Neither the speculative compensation nor the post-compensation for the lead component was performed for the composition of the anti-ferroelectric film 22 before sintering (i.e., composition after printing). However, the $SnO_2$ powder had a specific surface area of 13 m²/g, because of the following reason. That is, if the specific surface area of the $SnO_2$ powder is less than 8 m²/g or more than 20 m²/g, the anti-ferroelectric property is not exhibited. Therefore, the specific surface area of the $SnO_2$ powder was within the specified composition range concerning the condition of (4) described above.

Figure 48:
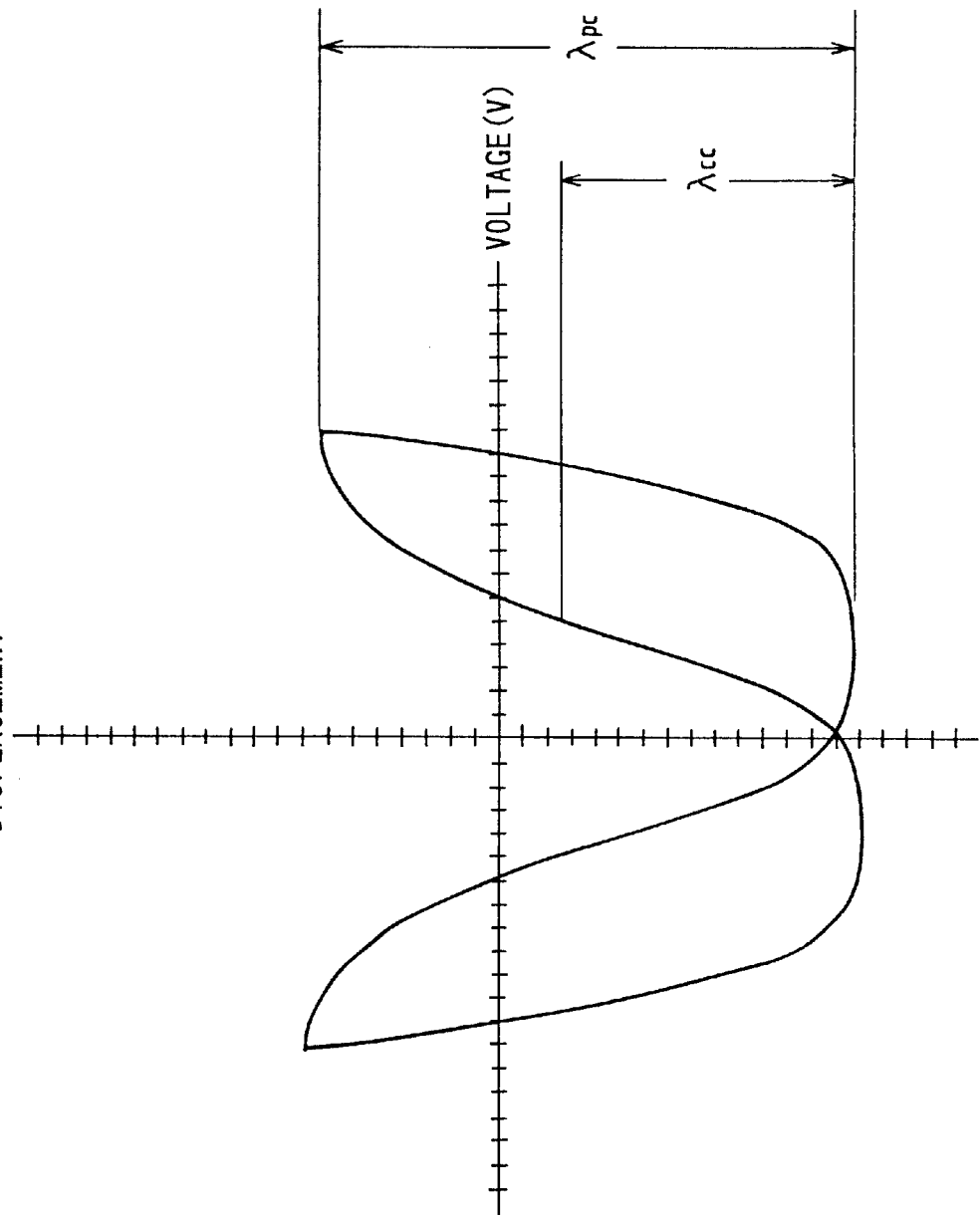
FIG. 48 shows a characteristic curve illustrating the voltage-bending displacement characteristic (hysteresis characteristic) concerning Comparative Example 16.

A sine wave having a frequency of 1 kHz and peak values of ±130 V (see FIG. 46) was applied between the pair of electrodes 24a, 24b on the anti-ferroelectric film 22. The displacement amount obtained thereby was continuously measured by using a laser displacement meter. As a result, a characteristic curve as shown in FIG. 48 was obtained. The following fact is acknowledged in Comparative Example 16. That is, according to a displacement λpc at the peak voltage (130 V) and a displacement λcc at the predetermined voltage (50 V) during voltage drop, the displacement-retaining ratio is 50 to 54% (see FIG. 44). Therefore, the shape memory effect is not sufficient.

The ceramic element 100C according to the third embodiment described above satisfies all of the five conditions described above in order to obtain the high displacement-retaining ratio. However, when it is intended to satisfy the displacement-retaining ratio of not less than about 70%, it is unnecessary to satisfy all of the five conditions. The present invention may be carried out by appropriately selecting the conditions.

Applied Embodiments

Applied Embodiment 1

Next, a display device 200 concerning an applied embodiment will be explained with reference to FIGS. 49 to 52. The display device 200 concerning this applied embodiment is obtained by applying the ceramic element 100A according to the first embodiment (analog displacement type and digital displacement type) to the display device 200. Therefore, components or parts corresponding to those shown in FIG. 1 are designated by the same reference numerals, duplicate explanation of which will be omitted.

Figure 49:
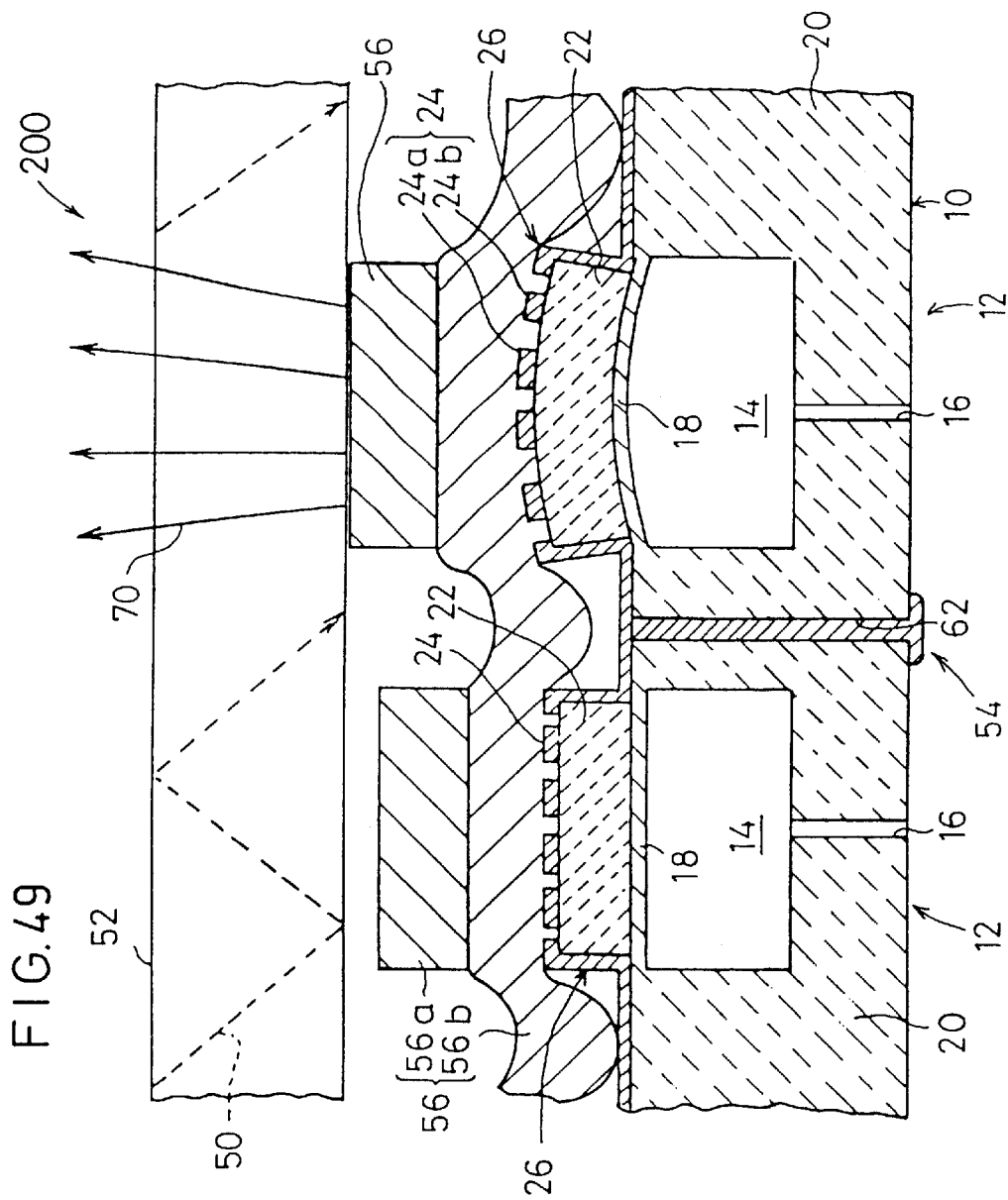
FIG. 49 shows a structure concerning an applied embodiment in which the ceramic element according to the first embodiment (analog displacement type and digital displacement type) is applied to a display device.

As shown in FIG. 49, the display device 200 concerning this applied embodiment comprises an optical waveguide plate 52 for introducing light 50 thereinto, and a driving unit 54 provided opposingly to the back surface of the optical waveguide plate 52 and including a large number of actuator elements 12 arranged corresponding to picture elements.

The driving unit 54 has a substrate 10 composed of, for example, a ceramic, and the actuator elements 12 are arranged at positions on the substrate 10 corresponding to the respective picture elements. The substrate 10 is disposed so that its first principal surface is opposed to the back surface of the optical waveguide plate 52. The first principal surface is a continuous surface (flushed surface). Hollow spaces 14 are provided at positions corresponding to the respective picture elements.

A displacement-transmitting section 56 is connected onto each of the actuator elements 12, for increasing the contact area with respect to the optical waveguide plate 52 to provide an area corresponding to the picture element. The displacement-transmitting section 56 comprises a plate member 56a for specifying a substantial light emission area, and a displacement-transmitting member 56b for transmitting the displacement of the actuator element 12 to the plate member 56a.

The displacement-transmitting member 56b of the displacement-transmitting section 56 preferably has a hardness in a degree to directly transmit the displacement of the actuator element 12 to the optical waveguide plate 52. Therefore, those preferably used as materials for the displacement-transmitting member 56b include, for example, rubber, organic resins, organic adhesive films, and glass. However, it is allowable to use the electrode layer itself, or materials such as the piezoelectric materials and the ceramics described above. Those most preferably used include, for example, organic resins and organic adhesive films based on epoxy compounds, acrylic compounds, silicone compounds, and polyolefin compounds. Further, it is also effective to mix a filler with the foregoing compounds to suppress contraction upon curing.

Those desirably used as materials for the plate member 56a include the materials for the displacement-transmitting member 56b described above, as well as materials obtained by finely dispersing ceramic powder having a high refractive index, such as zirconia powder, titania powder, lead oxide powder, and mixed powder thereof, in an organic resin based on an epoxy, acrylic, or silicone compound, from viewpoints of light emission efficiency and maintenance of flatness. In this case, it is preferable to select a ratio of resin weight-:ceramic powder weight=1: (0.1 to 10). Further, it is preferable to add, to the foregoing composition, glass powder having an average particle diameter of 0.5 to 10 $\mu$m in a ratio of 1: (0.1 to 1.0) with respect to the ceramic powder, because release property and contact property with respect to the surface of the optical waveguide plate 52 are improved.

Preferably, the flatness or the smoothness of the portion (surface) of the plate member 56a to contact with the optical waveguide plate 52 is sufficiently small as compared with the displacement amount of the actuator element 12, which is specifically not more than 1 $\mu$m, more preferably not more than 0.5 $\mu$m, and especially preferably not more than 0.1 $\mu$m. However, the flatness of the portion (surface) of the displacement-transmitting section 56 to contact with the optical waveguide plate 52 is important in order to reduce the clearance generated when the displacement-transmitting section 56 contacts with the optical waveguide plate 52. Accordingly, there is no limitation to the foregoing flatness range, provided that the contact portion makes deformation in a state of contact.

When the material described above is used for the displacement-transmitting section 56, the displacement-transmitting section 56 may be connected to the main actuator element 26 by stacking the displacement-transmitting section 56 composed of the foregoing material by using an adhesive, or by forming the displacement-transmitting section 56 on the upper portion of the main actuator element 26 or on the optical waveguide plate 52, in accordance with, for example, a method for coating a solution, a paste, or a slurry composed of the material described above.

When the displacement-transmitting section 56 is connected to the main actuator element 26, it is preferable to use a material which also serves as an adhesive for the material for the displacement-transmitting section 56. Especially, when an organic adhesive film is adopted, it can be used as an adhesive by applying heat, which is preferred.

The optical waveguide plate 52 has an optical refractive index so that the light 50 introduced into the inside is subjected to total reflection without being transmitted to the outside of the optical waveguide plate 52 through the front and back surfaces. It is necessary for the optical waveguide plate 52 to use those having a uniform and high transmittance in the wavelength region of visible light. The material for the optical waveguide plate 52 is not especially limited provided that it satisfies the foregoing characteristic. However, specifically, those generally used for the optical waveguide plate 52 include, for example, glass, quartz, light-transmissive plastics such as acrylic plastics, light-transmissive ceramics, structural materials comprising a plurality of layers composed of materials having different refractive indexes, and those having a surface coating layer.

As shown in FIG. 50, the wiring arrangement communicating with the respective electrodes 24a, 24b includes vertical selection lines 58 having a number corresponding to a number of rows of a large number of the picture elements, and signal lines 60 having a number corresponding to a number of columns of the large number of the picture elements. Each of the vertical selection lines 58 is electrically connected to the first electrode 24a of each of the picture elements (actuator elements) 12. Each of the signal lines 60 is electrically connected to the second electrode 24b of each of the picture elements 12.

The respective vertical selection lines 58, which are included in one row, are wired in series such that the wiring is led from the first electrode 24a provided for the picture element 12 in the previous column, and then the wiring is connected to the first electrode 24a provided for the picture element 12 in the present column. The signal line 60 comprises a main line 60a extending in the direction of the column, and branch lines 60b branched from the main line 60a and connected to the second electrode 24b of each of the picture elements 12.

The voltage signal is supplied to the respective vertical selection lines 58 from the second principal surface of the substrate 10 via through-holes 62. The voltage signal is also supplied to the respective signal lines 60 from the second principal surface of the substrate 10 via through-holes 64.

Various arrangement patterns may be assumed for the through-holes 62, 64. However, in the illustrative arrangement shown in FIG. 50, the through-holes 62 for the vertical selection lines 58 are formed as follows provided that the number of rows is M, and the number of columns is N. In the case of N=M or N>M, the through-hole 62 is formed in the vicinity of a picture element in the nth row and nth column (n=1, 2 . . . ) and at a position deviated toward the signal line (main line) in the (n−1)th column. In the case of N<M, the through-hole 62 is formed in the vicinity of a picture element in the ($\alpha$N+n)th row and nth column ($\alpha$=0, 1 . . . (quotient of M/N−1)) and at a position deviated toward the signal line (main line) in the (n−1)th column.

The through-hole 62 for the vertical selection line 58 is not formed on the vertical selection line 58, unlike the through-hole 64 for the signal line 60. Accordingly, a mediating conductor 66 is formed between the through-hole 62 and the first electrode 24a, for making electric continuity therebetween.

Insulative films 68 (shown by two-dot chain lines), each of which is composed of, for example, a silicon oxide film, a glass film, or a resin film, are allowed to intervene at portions of intersection between the respective vertical selection lines 58 and the respective signal lines 60, in order to ensure insulation between the mutual wiring arrangements 58, 60.

The display device 200 concerning this applied embodiment is operated such that the three basic operations (ON selection, OFF selection, and NO selection) are effected on the picture elements 12 to display a picture.

Specifically, a group of the picture elements included in one row, for example, those included in 1st row, 2nd row, . . . nth row are successively selected for every one horizontal scanning term in accordance with electric potential supply to the vertical selection lines 58 by using, for example, a vertical shift circuit composed of a shift register, on the basis of input of an image signal into the display device 200. An electric potential is supplied to the signal line 60 corresponding to the picture element 12 which is included in the selected row and which should be subjected to ON selection, at a predetermined selected point of time, for example, from a horizontal shift circuit composed of a shift register. As a result, a predetermined voltage, which is sufficient to cause the phase transition in the anti-ferroelectric film 22, is applied to the picture element 12 subjected to the ON selection by the vertical shift circuit and the horizontal shift circuit. At this time, the actuator element 12 concerning the picture element makes displacement in a convex configuration. In view of the display device, this state is the ON selection state. In the ON selection state, the displacement-transmitting section 56 is displaced toward the optical waveguide plate 52 in accordance with the convex deformation of the actuator element 12, and the displacement-transmitting section 56 contacts with the optical waveguide plate 52.

The displacement-transmitting section 56 contacts with the back surface of the optical waveguide plate 52 in response to the displacement of the actuator element 12. When the displacement-transmitting section 56 contacts with the back surface of the optical waveguide plate 52, for example, the light 50, which has been subjected to total reflection in the optical waveguide plate 52, is transmitted through the back surface of the optical waveguide plate 52, and the light 50 is transmitted to the surface of the displacement-transmitting section 56. The light 50 is scattered and reflected by the surface of the displacement-transmitting section 56.

The displacement-transmitting section 56 is provided in order to scatter and reflect the light having been transmitted through the back surface of the optical waveguide plate 52, and in order to increase the area to contact with the optical waveguide plate 52 to be not less than a predetermined area. That is, the light emission area is specified by the contact area between the displacement-transmitting section 56 and the optical waveguide plate 52.

The contact between the displacement-transmitting section 56 and the optical waveguide plate 52 means that the displacement-transmitting section 56 and the optical waveguide plate 52 are positioned with a distance intervening therebetween, if any, the distance being not more than a wavelength of the light 50 (light introduced into the optical waveguide plate 52).

On the other hand, the picture element 12, which is included in the group of the picture elements concerning the row selected by the vertical shift circuit and which is not subjected to ON selection, i.e., which should be subjected to OFF selection, is operated as follows. That is, the electric potential of the signal line 60 concerning the picture element 12 is made to be an electric potential which is different from the electric potential for ON selection, at the predetermined selection point of time. In this case, there is given a voltage (reverse bias voltage) sufficient to restore the convex displacement of the actuator element 12 to the original state. At this time, the actuator element 12 corresponding to the concerning picture element is restored to the original state. This state is the OFF selection state in view of the display device 200. In the OFF selection state, the displacement-transmitting section 56 is separated from the optical waveguide plate 52 in accordance with the displacement action of the actuator element 12.

All of the picture element groups concerning the rows not selected by the vertical shift circuit are in the NO selection state. In this case, the voltage application to the pair of electrodes 24a, 24b is stopped.

Next, the operation of the display device 200 according to the applied embodiment of the present invention will be explained with reference to FIG. 49. At first, the light 50 is introduced, for example, from the end of the optical waveguide plate 52. In this embodiment, all of the light 50 is subjected to total reflection at the inside of the optical waveguide plate 52 without being transmitted through the front and back surfaces of the optical waveguide plate 52 by controlling the magnitude of the refractive index of the optical waveguide plate 52. In this state, when a certain actuator element 12 is allowed to be in the excited state, and the displacement-transmitting section 56 corresponding to the actuator element 12 contacts with the back surface of the optical waveguide plate 52 with a distance of not more than the wavelength of the light, then the light 50, which has been subjected to total reflection, is transmitted to the surface of the displacement-transmitting section 56 which contacts with the back surface of the optical waveguide plate 52.

The light 50, which has once arrived at the surface of the displacement-transmitting section 56, is reflected by the surface of the displacement-transmitting section 56, and it behaves as scattered light 70. A part of the scattered light 70 is reflected again in the optical waveguide plate 52. However, the greater part of the scattered light 70 is transmitted through the front surface of the optical waveguide plate 52 without being reflected by the optical waveguide plate 52.

That is, the presence or absence of emission of light (leakage light) from the front surface of the optical waveguide plate 52 can be controlled in accordance with the presence or absence of the contact of the displacement-transmitting section 56 disposed at the back of the optical waveguide plate 52. Especially, in the display device 200 according to the applied embodiment of the present invention, one unit for making the displacement movement of the displacement-transmitting section 56 in the direction to make contact or separation with respect to the optical waveguide plate 52 is used as one picture element. Further, a large number of the picture elements 12 are arranged in a matrix form or in a zigzag configuration concerning the respective rows. Accordingly, when the displacement movement of each of the picture elements 12 is controlled in accordance with an attribute of an inputted image signal, a picture (for example, characters and graphics) can be displayed on the front surface of the optical waveguide plate 52 in response to the image signal, in the same manner as the cathode-ray tube and the liquid crystal display device.

As described above, in the display device 200 according to the applied embodiment of the present invention, the main actuator element 26 for selectively displacing the displacement-transmitting section 56 comprises the anti-ferroelectric film 22, and the pair of electrodes 24a, 24b formed on the anti-ferroelectric film 22. In this arrangement, when the predetermined voltage is applied to the pair of electrodes 24a, 24b, the electric field is generated in the main actuator element 26 in response to the applied voltage.

The generated electric field allows the anti-ferroelectric film 22 to make displacement, for example, in the first direction. The displacement of the anti-ferroelectric film 22 in the first direction causes the displacement-transmitting section 56 to make displacement toward the optical waveguide plate 52. Thus, the generation of leakage light from the optical waveguide plate 52 is induced as described above.

Especially, as described above, once the displacement occurs, the anti-ferroelectric film 22 maintains the displacement even when the no voltage-loaded state is given. Therefore, when the voltage is applied to the necessary picture element to display an image, and the main actuator element 26 concerning the necessary picture element 12 is displaced, then the displacement is maintained over the period until the displacement is counteracted even when the voltage application to the pair of electrodes 24a, 24b concerning the necessary picture element 12 is stopped. Thus, the light emission for the necessary picture element 12 is continued.

The difference in light-emitting operation between the display device 200 concerning the applied embodiment of the present invention and the display device concerning a comparative example will now be explained with reference to FIGS. 51A and 51B. The display device concerning the comparative example is based on the use of the piezoelectric/electrostrictive film 36 (see FIG. 10A) in place of the anti-ferroelectric film 22 of the display device 200 concerning the applied embodiment of the present invention.

In the display device concerning the comparative example, the predetermined voltage is applied to the pair of electrodes 24a, 24b in relation to the selected row (the row selected by the vertical shift circuit). Therefore, the picture element 12 subjected to the ON selection causes light emission. However, the voltage application is in the stopped state for the picture elements 12 concerning the rows other than the selected row, i.e., the picture elements 12 concerning the non-selected rows. Therefore, the displacement of all of the actuator elements 12 of the picture element group concerning the non-selected rows is restored to the original state, and hence the light emission state upon the selection is not maintained. This situation is shown in FIG. 51B. FIG. 51B shows a state in which all of the picture elements 12 concerning the non-selected rows are in the light off state, and only the picture elements 12 subjected to ON selection on the selected row make light emission.

On the other hand, in the display device 200 concerning the applied embodiment of the present invention, the predetermined voltage is applied to the pair of electrodes 24a, 24b concerning those included in the selected row. Therefore, the picture element 12 subjected to the ON selection makes light emission, and the picture element 12 subjected to the OFF selection are turned off. The light emission state is maintained as it is owing to the "effect to store the strain state of the ferroelectric phase (shape memory effect)" of the anti-ferroelectric film 22 even when the voltage application to the pair of electrodes 24a, 24b is stopped. This situation is shown in FIG. 51A. In FIG. 51A, the light emission state corresponding to the image signal concerning the present horizontal scanning line is given for the selected row. The light emission state selected just before is maintained for rows disposed over the selected row, and the light emission state given in the previous field period (or the previous frame period) is maintained for rows disposed under the selected row.

That is, in the case of individual formation of the signal wiring and the common wiring, the predetermined voltage may be applied for a shorter period of time with respect to the period of time during which the displacement of the actuator element 12 is intended to be maintained. Therefore, it is possible to save the electric power as compared with the display device concerning the comparative example based on the use of the piezoelectric/electrostrictive film 36.

Further, in the case of formation of the vertical selection line 58 and the signal line 60, if the piezoelectric/electrostrictive film 36 is used as in the display device concerning the comparative example, only the actuator elements 12 in the selected row, of all of the actuator elements 12 can be simultaneously displaced in all cases. However, in the display device 200 concerning the applied embodiment of the present invention, the actuator elements 12 in the selected row maintain the displacement even at the timing for selecting the next row. Therefore, at the point of time at which all of the rows are completely selected, all of the actuator elements 12 in all of the rows can be simultaneously maintained for their displacement at the maximum.

In the case of a system which is capable of displaying a complicated image, the system necessarily includes a large number of picture elements, in accordance with which it is necessary for the system to form the vertical selection lines 58 and the signal lines 60. However, in the case of the display device concerning the comparative example based on the use of the piezoelectric/electrostrictive film 36, only the actuator elements 12 in the selected row, of all of the actuator elements 12 can be simultaneously displaced in all cases, and only the picture elements in the selected row can be subjected to light emission. However, in the case of the display device 200 concerning the applied embodiment of the present invention, the actuator elements 12 in the selected row maintain the displacement even at the timing for selecting the next row. Therefore, at the point of time at which all of the rows are completely selected, all of the actuator elements 12 in all of the rows can be simultaneously maintained for their displacement, and it is possible to cause light emission for all of the picture elements at the maximum. Thus, it is possible to increase the light emission amount within a certain period of time in a degree of several times or several tens times or more.

In view of the fact described above, when the picture elements are subjected to display in conformity with, for example, the horizontal scanning line for image display, the voltage may be applied to only the column of picture elements (group of picture elements) corresponding to the horizontal scanning line. Therefore, it is unnecessary to consider any voltage application to the other columns of picture elements (group of picture elements). As a result, when the driving electric wiring is arranged, it is unnecessary to make individual wiring for the picture elements one by one, making it possible to realize simplified electric wiring. This results in reduction of the load on the driving voltage supply system. Thus, it is possible to simplify the mechanical structure and the circuit system and reduce the production cost.

Figure 52:
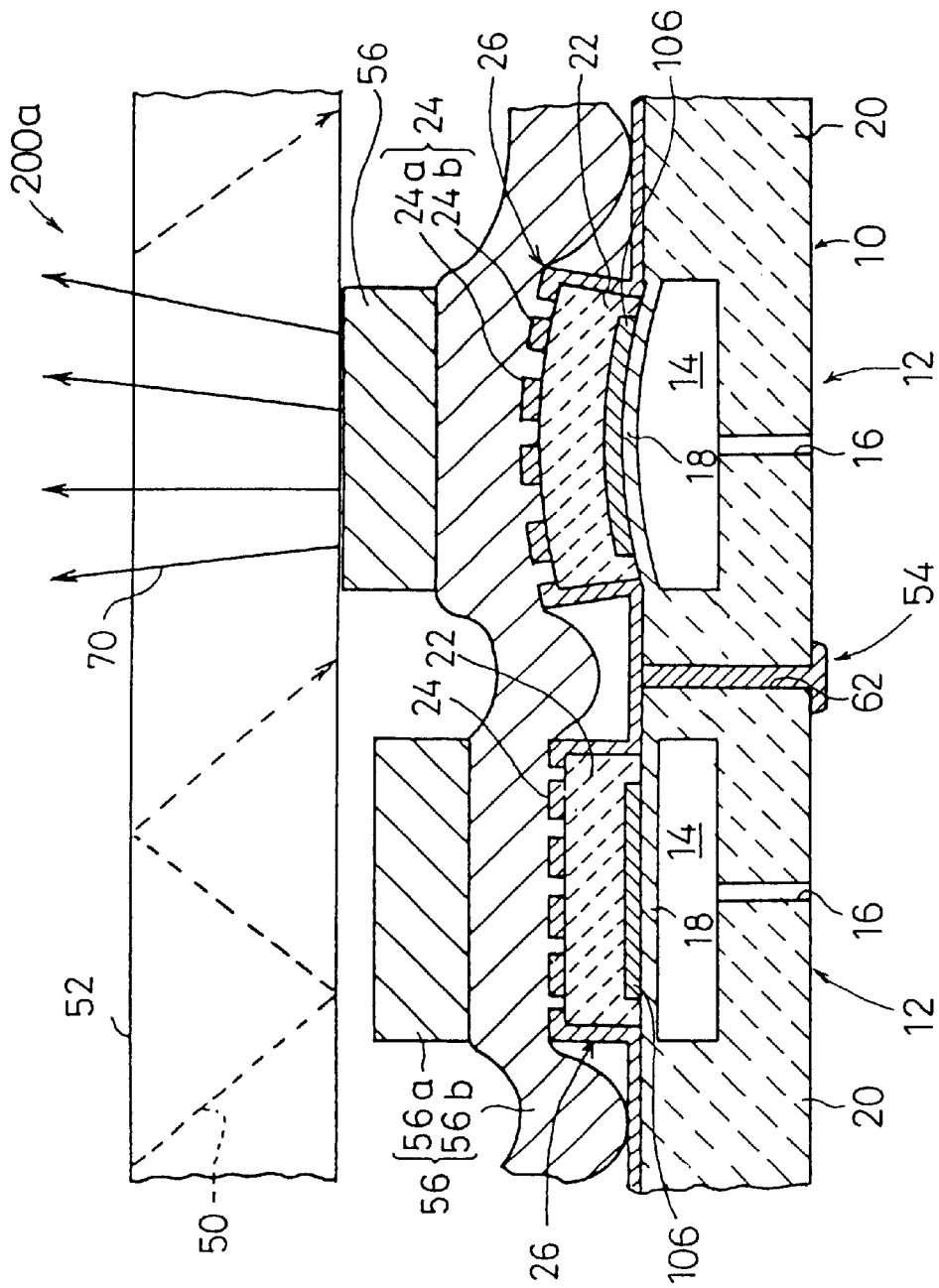
FIG. 52 shows a structure concerning an applied embodiment in which the ceramic element according to the third embodiment is applied to a display device.

Especially, as shown in FIG. 52, when the ceramic element 100C according to the third embodiment (see FIG. 24) is applied to construct a display device 200a, the displacement-retaining ratio of the actuator element 12 is high. Therefore, for example, the brightness is not lowered, and the fluctuation of brightness does not occur, which would be otherwise caused by fluctuation of voltage during the driving operation for adjacent picture elements. Thus, a high quality image can be displayed.

Applied Embodiment 2

Next, explanation will be made with reference to FIGS. 53 to 55B for a relay device 210 concerning an applied embodiment in which the ceramic element 100A according to the first embodiment (see FIG. 1) is applied to the relay device. Components or parts corresponding to those shown in FIG. 1 are designated by the same reference numerals, duplicated explanation of which will be omitted.

Figure 53:
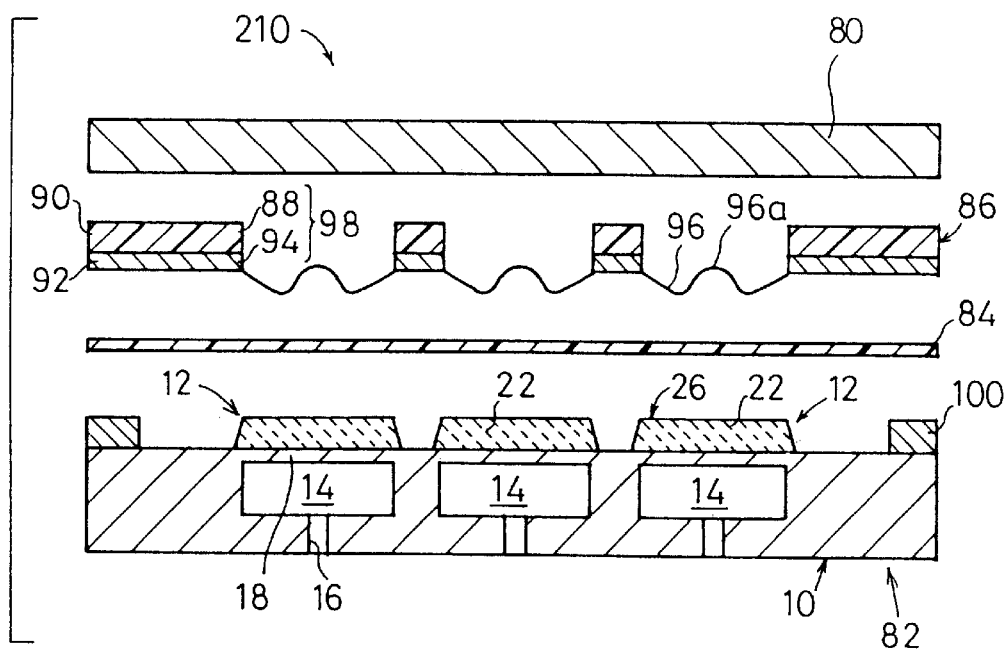
FIG. 53 shows an exploded view of a structure concerning an applied embodiment in which the ceramic element according to the first and second embodiments is applied to a relay device (hereinafter simply referred to as "relay device concerning the applied embodiment).

As shown in FIG. 53, the relay device according to this applied embodiment comprises an opposing terminal plate 80 for applying, for example, the ground electric potential Vss thereto, and a driving unit 82 provided opposingly to the back surface of the opposing terminal plate 80 and including a large number of actuator elements 12 arranged as switching elements, for example, in one row.

The driving unit 82 has a substrate 10 composed of, for example, a ceramic. The actuator elements 12 are arranged at positions on the substrate 10 corresponding to the respective switching elements. The substrate 10 is disposed so that its first principal surface is opposed to the back surface of the opposing terminal plate 82. The first principal surface is a continuous surface (flushed surface). Hollow spaces 14 are provided at positions corresponding to the respective switching elements (actuator elements) 12.

A thin insulating sheet (insulating film) 84 is arranged on the entire surfaces of the respective actuator elements 12. A substrate 86 provided with signal terminals is arranged between the insulating sheet 84 and the opposing terminal plate 80. In FIGS. 53 to 55B, the pair of electrodes 24a, 24b (upper and lower electrodes 40a, 40b) are omitted from illustration in order to avoid complicated illustration.

The substrate 86 provided with signal terminals is constructed by sticking a thin metal plate 92, for example, with an adhesive to one plate surface (plate surface facing the driving unit 82) of an insulating substrate 90 formed with a large number of openings 88. The metal plate 92 has a large number of openings 94 which are formed at positions corresponding to the large number of openings 88 formed through the insulating substrate 90 and which have the same aperture width as that of the openings 88. An extremely thin plate spring 96 made of metal, which is composed of, for example, beryllium copper, is provided to close the openings 94. The plate spring 96 has a cross-sectional configuration in which the central portion protrudes in the first direction (direction to face the opposing terminal plate 80). In this embodiment, the openings 98 of the substrate 86 with signal terminals are formed by the openings 88 of the insulating substrate 90 and the openings 94 of the metal plate 92 of the substrate 86 with signal terminals. The signal terminal section is constructed by the metal plate 92 and the plate spring 96.

A side wall 99, which is composed of, for example, a ceramic member having approximately the same height as the thickness of the main actuator element 26, is secured to the circumference of the substrate 10 which is a constitutive component of the driving unit 82.

Figure 54:
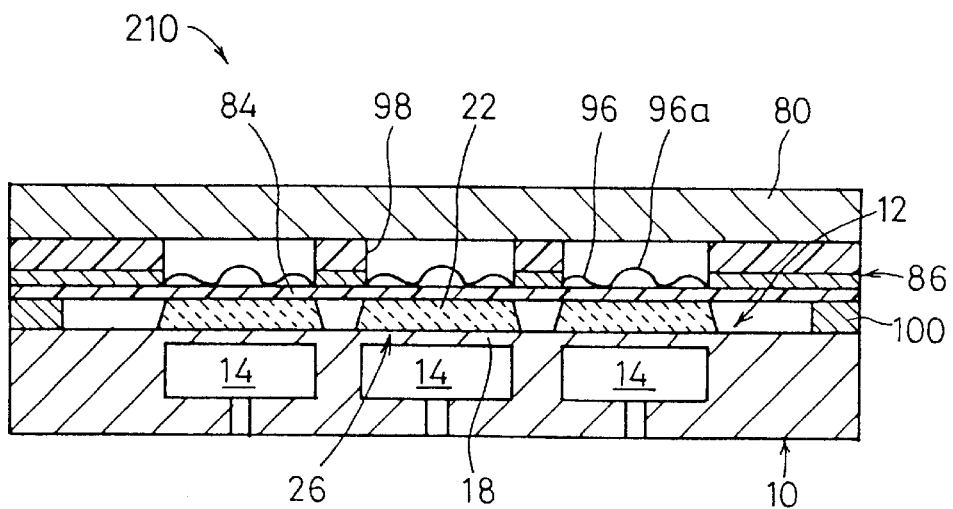
FIG. 54 shows an assembled structure illustrating the relay device concerning the applied embodiment.

The relay device 210 concerning the applied embodiment of the present invention is produced as follows. The insulating sheet 84 is secured onto the driving unit 82 by using, for example, an adhesive. During this process, the insulating sheet 84 is glued onto the upper surface of the side wall 99 of the substrate 10 and onto the upper surfaces of the respective actuator elements 26. Subsequently, the substrate 86 with signal terminals is stuck and secured onto the insulating sheet 84, for example, with an adhesive. During this sticking process, the surface of the substrate 86 with signal terminals on the side of the metal plate 92 is opposed and stuck to the insulating sheet 84. At this time, the protruding portion 96a of the plate spring 96 is inserted into the opening 98 of the substrate 86 with signal terminals toward the opposing terminal plate 80. After that, the opposing terminal plate 80 is stuck and secured onto the insulating substrate 90 of the substrate 86 with signal terminals by using, for example, an adhesive. At this stage, the relay device 210 concerning the applied embodiment of the present invention shown in FIG. 54 is completed.

The protruding amount of the plate spring 96 in the opening 98 is set as follows. At first, as shown in FIG. 55A, the protruding amount is in a degree in which the upper end of the protruding portion 96a of the plate spring 96 does not contact with the opposing terminal plate 80 in a state in which the anti-ferroelectric film 22 of the main actuator element 26 is not displaced in the first direction (in the direction for the main actuator element 26 to face the opposing terminal plate 80). As shown in FIG. 55B, the protruding amount is in a degree in which the upper end of the protruding portion 96a of the plate spring 96 contacts with the opposing terminal plate 80 in a state in which the anti-ferroelectric film 22 is displaced in the first direction (in an amount of displacement of about 5 $\mu$m in this embodiment).

When the plate springs 96 corresponding to a part of switching elements 12 of the large number of switching elements (actuator elements 12) contact with the opposing terminal plate 80, the plate springs 96 are electrically connected to the opposing terminal plate 80. The signal flows between the plate springs 90 and the opposing terminal plate 80. Thus, for example, the ON operation is performed.

As described above, in the relay device 210 concerning the applied embodiment according to the present invention, the ON/OFF operation of the large number of switching elements 12 can be controlled in accordance with the presence or absence of the contact of the plate springs 96 disposed at the back of the opposing terminal plate 80. In this embodiment, one unit for making the displacement movement of the plate spring 96 in the direction to make contact or separation with respect to the opposing terminal plate 80 is considered as one switching element 12. Further, the switching elements 12 are arranged, for example, in one array or in a matrix form. In this arrangement, when the displacement movement of each of the switching elements 12 is controlled in accordance with an attribute of an inputted switching signal, it is possible to provide a large number of combinations of switching forms. Thus, it is possible to realize a variety of switching operations.

In the relay device 210 concerning the applied embodiment of the present invention, the main actuator element 26 for selectively displacing the plate spring 96 comprises the anti-ferroelectric film 22, and the pair of electrodes 24a, 24b (upper and lower electrodes 40a, 40b) formed on the anti-ferroelectric film 22. In this arrangement, when the predetermined voltage is applied to the pair of electrodes 24a, 24b, the electric field is generated in the main actuator element 26 in response to the applied voltage. The generated electric field allows the anti-ferroelectric film 22 to make displacement, for example, in the first direction. The displacement of the anti-ferroelectric film 22 in the first direction causes the plate spring 96 to make displacement toward the opposing terminal plate 80. Thus, the ON operation of the switching element 12 is induced as described above.

Especially, as described above, once the displacement occurs, the anti-ferroelectric film 22 maintains the displacement even when the no voltage-loaded state is given. Therefore, when the voltage is applied to the necessary switching element 12 to perform the switching operation, and the main actuator element 26 concerning the necessary switching element 12 is displaced, then the displacement is maintained over the period until the displacement is counteracted even when the voltage application to the pair of electrodes 24a, 24b (upper and lower electrodes 40a, 40b) concerning the necessary switching element 12 is stopped. Thus, the ON operation of the necessary switching element 12 is continued. Therefore, the electric power consumption is greatly reduced, and it is possible to realize reduction of the running cost.

When the switching operation is performed while specifying the row and the column, the voltage may be applied to only the switching element column corresponding to the concerning row. It is unnecessary to consider any voltage application to the other switching element columns. Accordingly, when the electric wiring is arranged for driving the device, it is unnecessary to make individual wiring for the elements one by one, making it possible to realize simplified electric wiring. This results in reduction of the load on the driving voltage supply system. Thus, it is possible to simplify the mechanical structure and the circuit system and reduce the production cost.

That is, the relay device 210 makes it possible to achieve a highly integrated circuit of 1 millipitch, as compared with the conventional relay device based on the magnet system. Moreover, the contact state can be maintained even when the control voltage is not always applied. Thus, the provided relay device 210 contributes to the electric power saving.

Applied Embodiment 3

Next, a capacitance-variable capacitor 220 concerning an applied embodiment will be explained with reference to FIGS. 56A to 58. The capacitance-variable capacitor concerning this applied embodiment is constructed by applying, to the capacitance-variable capacitor, the ceramic element 100A (especially the analog displacement type) according to the first embodiment or the ceramic element 100B (especially the first analog displacement type) according to the second embodiment. Therefore, the two types of the capacitance-variable capacitors are referred to as the capacitance-variable capacitor 220A concerning the first applied embodiment and the capacitance-variable capacitor 220B concerning the second applied embodiment respectively. Components or parts corresponding to those shown in FIG. 1 and FIG. 15A are designated by the same reference numerals, duplicate explanation of which will be omitted.

Each of the capacitance-variable capacitors 220A, 220B concerning the applied embodiments comprises control electrodes for varying the capacitance C of the capacitor, and both terminal electrodes of the capacitor. The principle of the variable capacitance C of the capacitor is as follows. At first, the dielectric constant of the phase transition region Zt in the anti-ferroelectric film 22 is higher than the dielectric constant of regions in which no phase transition occurs. Therefore, the capacitance C of the capacitor can be made to be variable by changing the voltage applied to the control electrodes to change the range of the phase transition region Zt generated in the anti-ferroelectric film 22.

Based on this knowledge, at first, as shown in FIG. 56A, the capacitance-variable capacitor 220A concerning the first applied embodiment is obtained by applying the ceramic element 100A according to the first embodiment. A capacitor unit 80 is arranged at a predetermined position of the substrate 10 composed of, for example, ceramic.

As shown in FIG. 56A, the capacitor unit 80 comprises the vibrating section 18 and the fixed section 20 described above, as well as the anti-ferroelectric film 22 formed on the vibrating section 18, a pair of control electrodes (first control electrode 24a and second control electrode 24b) formed on the upper surface of the anti-ferroelectric film 22, and both terminal electrodes (upper electrode 40a and lower electrode 40b) formed on the upper and lower surfaces of the anti-ferroelectric film 22 respectively.

Next, the operation principle of the capacitance-variable capacitor 220A concerning the first applied embodiment will be explained with reference to FIGS. 56A to 57B.

At first, as shown in FIG. 56A, when the first control electrode 24a and the second control electrode 24b are allowed to have, for example, the ground electric potential respectively to make the applied voltage between the pair of control electrodes 24a, 24b to be zero, no electric field is generated in the capacitor unit 80. Therefore, the capacitance C, which appears between the both terminal electrodes 40a, 40b, is determined by the dielectric constant originally possessed by the anti-ferroelectric film 22. Thus, the initial capacitance value C0 is given.

Next, observation is made for the case in which the voltage value (level) of the voltage V applied to the pair of control electrodes 24a, 24b is gradually increased to be V1, V2, and V3. At first, as shown in FIG. 56B, when there is given the applied voltage V=V1 (>0V), i.e., when the applied voltage V is the voltage V1 which is smaller than the predetermined voltage Vd, then the electric field generated in the capacitor unit 80 is weak. Therefore, no phase transition occurs in the anti-ferroelectric film 22. Accordingly, the capacitance C, which appears between the both terminal electrodes 40a, 40b, is determined by the dielectric constant originally possessed by the anti-ferroelectric film 22. Thus, the initial capacitance value C0 is also given in this case.

Figure 57A:
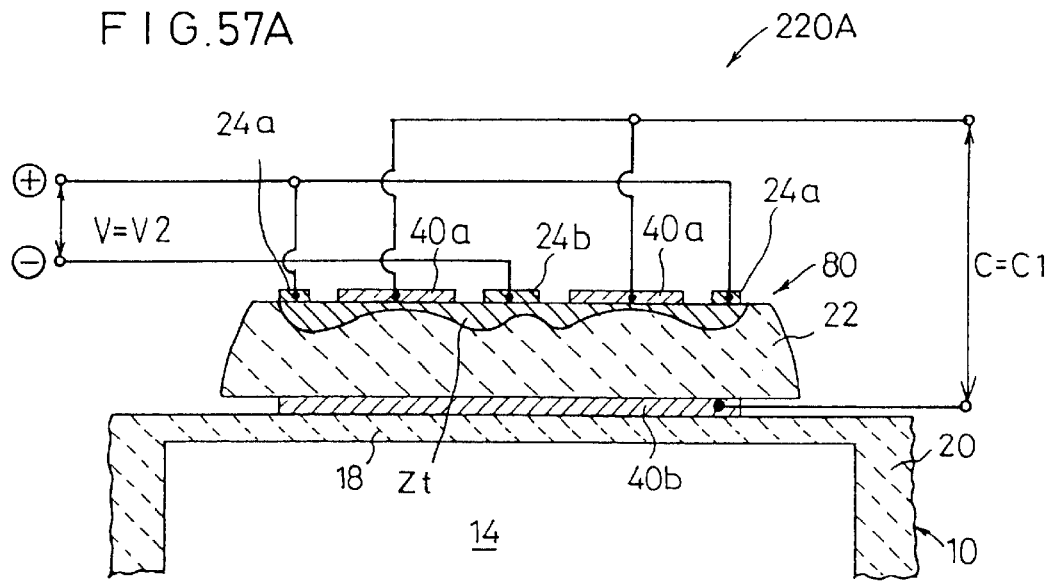
FIG. 57A illustrates a state in which a voltage V=V2 is applied to the pair of control electrodes of the capacitor unit.

As shown in FIG. 57A, the electric field intensity is sufficient to cause the phase transition in a region in which the distance between the pair of control electrodes 24a, 24b is shortest and in a region which is nearest to the pair of control electrodes 24a, 24b, at and after the stage in which the applied voltage V exceeds the predetermined voltage Vd. The phase transition occurs in such regions (occurrence of the phase transition region Zt). The dielectric constant of the anti-ferroelectric film 22 is increased in accordance with the phase transition. The capacitance C, which appears between the both terminal electrodes 40a, 40b, has a capacitance value C1 which is higher than the initial capacitance value C0.

Figure 57B:
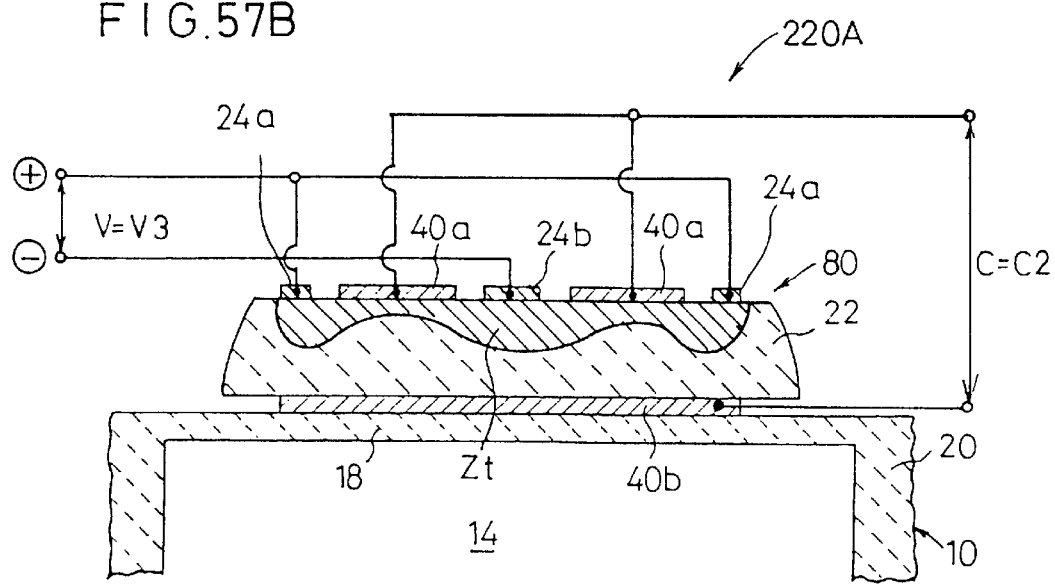
FIG. 57B illustrates a state in which a voltage V=V3 is applied to the pair of control electrodes of the capacitor unit.

As shown in FIG. 57B, the region, in which the electric field intensity is sufficient to cause the phase transition, is gradually widened as the applied voltage V is further increased. The phase transition is also caused in a region in which the distance between the pair of control electrodes 24a, 24b is long and in a region which is far from the pair of control electrodes 24a, 24b (spread of the phase transition region Zr). In this case, the dielectric constant of the anti-ferroelectric film 22 is further increased in accordance with the spread of the phase transition region Zt. The capacitance C, which appears between the both terminal electrodes 40a, 40b, has a capacitance value C2 which is higher than the capacitance value C1 obtained by the applied voltage V2.

As described above, the capacitance-variable capacitor, in which the capacitance C appearing between the both terminal electrodes 40a, 40b is changed in the analog manner in accordance with the increase in the voltage V applied to the pair of control electrodes 24a, 24b, can be easily constructed by utilizing the ceramic element 100A according to the first embodiment (especially of the analog displacement type). Moreover, the capacitance-variable capacitor can be constructed as a thin-film type. Therefore, it is possible to facilitate miniaturization of, for example, parametric amplifiers incorporated with the variable capacitor, automatic frequency control circuits (AFC), and various types of communication instruments.

Next, the capacitance-variable capacitor 220B concerning the second applied embodiment will be explained with reference to FIG. 58. Components or parts corresponding to those shown in FIG. 56A are designated by the same reference numerals, duplication explanation of which will be omitted.

Figure 58:
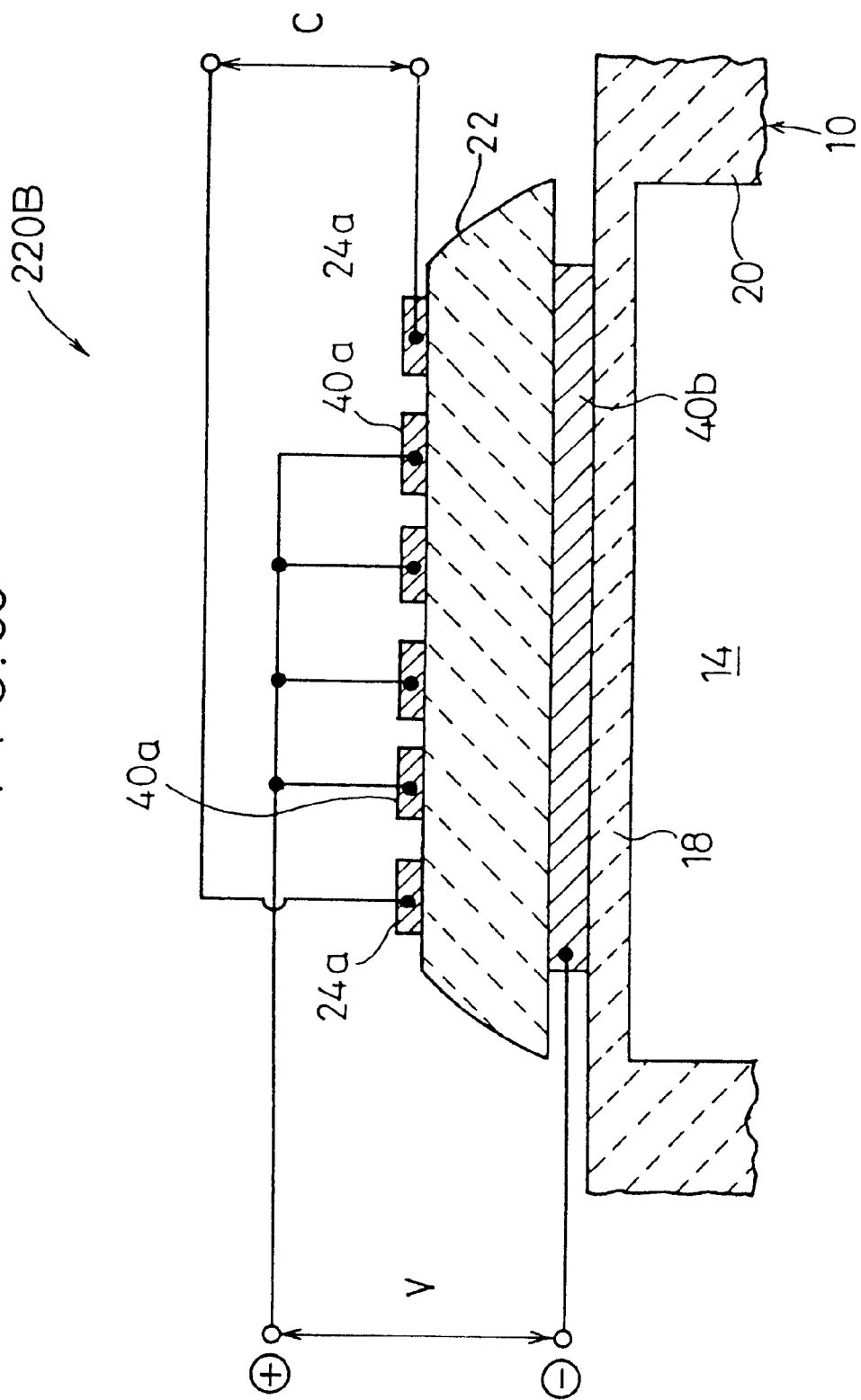
FIG. 58 shows a structure concerning a second applied embodiment wherein the ceramic element according to the second embodiment (first analog displacement type) is applied to a capacitance-variable capacitor.

As shown in FIG. 58, the capacitance-variable capacitor 220B concerning the second applied embodiment is constructed in approximately the same manner as the capacitance-variable capacitor 220A concerning the first applied embodiment. However, the former is different from the latter in that the film thickness distribution of the anti-ferroelectric film 22 involves dispersion of not less than 20%, the pair of electrodes 24a, 24b formed on the upper surface of the anti-ferroelectric film 22 are used as the both terminal electrodes of the capacitor, and the upper electrode 40a and the lower electrode 40b formed on the upper and lower surfaces of the anti-ferroelectric film 22 are used as the pair of control electrodes (upper and lower control electrodes).

In this embodiment, in the same manner as the capacitance-variable capacitor 220A concerning the first applied embodiment, it is possible to easily construct the capacitance-variable capacitor wherein the capacitance C, which appears between the both terminal electrodes 24a, 24b formed on the anti-ferroelectric film 22, is changed in the analog manner in accordance with the increase in the voltage V applied between the upper control electrode 40a and the lower control electrode 40b.

The embodiments described above are illustrative of the application of the ceramic elements 100A to 100C according to the first to third embodiments to the display device 200, the relay device 210, and the capacitance-variable capacitor (220A, 220B). Besides, the present invention is also applicable to filters, various sensors such as ultrasonic sensors, angular velocity sensors, acceleration sensors, and shock sensors, microphones, sounding bodies (speakers or the like), discriminators, and vibrators, resonators, and oscillators for power generation and communication. The present invention is also applicable to actuators to be used for, for example, servo displacement elements, pulse driving motors, ultrasonic motors, and piezoelectric fans.

Various illustrative embodiments of the ceramic element according to the present invention and various applied embodiments for applying the ceramic element to the display device, the relay device, and the capacitance-variable capacitor have been specifically explained. However, the present invention should not be interpreted to be one which is limited to the display device, the relay device, and the capacitance-variable capacitor concerning the illustrative embodiments and the applied embodiments. Various changes, modifications, and improvements may be made thereto without deviating from the scope of the present invention.

Industrial Applicability

As described above, the ceramic element according to the present invention comprises an operating section having an anti-ferroelectric film and at least a pair of electrodes formed on the anti-ferroelectric film, a vibrating section for supporting the operating section, and a fixed section for supporting the vibrating section in a vibrating manner, wherein the anti-ferroelectric film after polarization has a region in which its average dielectric constant is changed in an analog manner in accordance with a voltage applied to the electrodes.

Accordingly, the following effect is achieved. That is, the mechanical displacement amount is changed in an analog manner in accordance with the applied voltage. Further, the displacement amount, which is equivalent to that obtained upon application of the driving voltage, can be maintained in the no voltage-loaded state after completion of application of the driving voltage.

Therefore, it is possible to precisely control the magnitude of displacement amount in response to the applied voltage, and obtain a large displacement-generating force exceeding those obtained by the piezoelectric/electrostrictive film-type element even when a minute element is used. Thus, it is possible to simplify electric wiring for driving the element and effectively reduce the production cost when a variety of applications (for example, display devices and filters) are constructed.

Further, according to the present invention, there is provided the display device comprising an optical waveguide plate for introducing light thereinto, and a driving unit provided opposingly to one plate surface of the optical waveguide plate and including a number of actuator elements arranged corresponding to a large number of picture elements, for displaying, on the optical waveguide plate, a picture image corresponding to an image signal by controlling leakage light at a predetermined portion of the optical waveguide plate by controlling displacement action of each of the actuator elements in a direction to make contact or separation with respect to the optical waveguide plate in accordance with an attribute of the image signal to be inputted; wherein the actuator element comprises a main actuator element having an anti-ferroelectric film and at least a pair of electrodes formed on the anti-ferroelectric film, a vibrating section for supporting the main actuator element, and a fixed section for vibratingly supporting the vibrating section, the display device further comprising a displacement-transmitting section for transmitting, to the optical waveguide plate, the displacement action of the actuator element generated by applying a voltage to the pair of electrodes.

Accordingly, the following effect is achieved. That is, the display device consumes less electric power, and it is possible to simplify electric wiring for driving the display device. Further it is possible to effectively reduce the production cost and the running cost.

Further, according to the present invention, there is provided the relay device comprising an opposing terminal section, and a driving unit provided opposingly to one side of the opposing terminal section and including a number of actuator elements arranged corresponding to a large number of switching elements, for switching and controlling ON/OFF operation of the switching element by controlling displacement action of each of the actuator elements in a direction to make contact or separation with respect to the opposing terminal section in accordance with an attribute of a driving signal to be inputted; wherein the actuator element comprises a main actuator element having an anti-ferroelectric film and at least a pair of electrodes formed on the anti-ferroelectric film, a vibrating section for supporting the main actuator element, and a fixed section for vibratingly supporting the vibrating section, the relay device further comprising a signal terminal section for transmitting, to the opposing terminal section, the displacement action of the actuator element generated by applying a voltage to the pair of electrodes.

Accordingly, the following effect is achieved. That is, the relay device consumes less electric power, and it is possible to simplify electric wiring for driving the relay device.

Further, it is possible to effectively reduce the production cost and the running cost, and realize various types of switching operations.

Further, according to the present invention, there is provided the capacitor comprising a vibrating section for supporting a capacitor unit, and a fixed section for vibratingly supporting the vibrating section, wherein the capacitor unit comprises an anti-ferroelectric film formed on the vibrating section, a pair of control electrodes formed on an upper surface of the anti-ferroelectric film, and both terminal electrodes of the capacitor formed on the upper surface and a lower surface of the anti-ferroelectric film.

Accordingly, the following effect is achieved. That is, it is possible to easily construct a capacitance-variable capacitor in which the capacitance is changed in an analog manner. Further, the capacitor can be formed as one of the thin type. Therefore, it is possible to facilitate miniaturization of, for example, parametric amplifiers incorporated with the variable capacitor, automatic frequency control circuits (AFC), and various types of communication instruments.

What is claimed is:

1. A ceramic element comprising:

an operating section having an anti-ferroelectric film and at least a pair of electrodes formed on said anti-ferroelectric film, said pair of electrodes having a form in which an intensity of an electric field, which is generated by applying a voltage to said pair of electrodes, spatially differs;

a vibrating section for supporting said operating section; and a fixed section for supporting said vibrating section in a vibrating manner.

2. The ceramic element according to claim 1, wherein said ceramic element has regions in which a distance between said pair of electrodes is large and regions in which said distance between said pair of electrodes is small.

3. The ceramic element according to claim 1, wherein said anti-ferroelectric film after polarization has regions in which its average dielectric constant is increased in an analog manner in accordance with a voltage applied to said pair of electrodes.

4. The ceramic element according to claim 3, wherein said anti-ferroelectric film has portions in which displacement in a first direction is increased in an analog manner in accordance with said voltage applied to said electrodes in a state in which said anti-ferroelectric film is polarized.

5. The ceramic element according to claim 1, wherein said vibrating section and said fixed section are provided on a substrate formed by stacking ceramic green sheets or ceramic green tapes, followed by integrated sintering.

6. A ceramic element comprising:

an operating section having an anti-ferroelectric film and at least a pair of electrodes formed on said anti-ferroelectric film, said anti-ferroelectric film having a composition comprising Ag in an amount of 1 to 10% by weight as converted into an amount of silver oxide;

a vibrating section for supporting said operating section; and a fixed section for supporting said vibrating section in a vibrating manner.

7. The ceramic element according to claim 1, wherein at least on a part of said anti-ferroelectric film, both of said pair of electrodes are formed on a first principal surface of said anti-ferroelectric film.

8. The ceramic element according to claim 7, wherein the following expression is satisfied:

$$p/t \leq 2.5$$

provided that an average film thickness of said anti-ferroelectric film is t, and a pitch between said electrodes is p.

9. The ceramic element according to claim 1, wherein at least on a part of said anti-ferroelectric film, one of said pair of electrodes is formed on a first principal surface of said anti-ferroelectric film, and the other electrode is formed on a second principal surface of said anti-ferroelectric film.

10. The ceramic element according to claim 9, wherein the following expression is satisfied:

$$A/B \geq 2 \text{ or } A/B \leq 0.5$$

provided that an area of said one electrode is A, and an area of said other electrode is B.

11. The ceramic element according to claim 9, wherein a region interposed between said electrodes has film thickness distributions which involves dispersion of not less than 20%.

12. The ceramic element according to claim 1, wherein an intermediate layer is provided between said vibrating section and said anti-ferroelectric film.

13. The ceramic element according to claim 12, wherein said intermediate layer is a metal of Pt or Pd or an alloy of Pt and Pd.

14. The ceramic element according to claim 12, wherein a thickness of said intermediate layer is not less than 1 $\mu$m and not more than 10 $\mu$m.

15. The ceramic element according to claim 14, wherein said thickness of said intermediate layer is not less than 2 $\mu$m and not more than 6 $\mu$m.

16. The ceramic element according claim 5, wherein a thickness tb of said substrate satisfies tb$\leq$350 $\mu$m when Ln<tv×15 is satisfied provided that a boundary portion between an upper surface of said fixed section and an upper surface of said vibrating section concerning a shortest dimension passing through a center of said vibrating section is defined as a boundary point, a distance from said boundary point to an end of a region in which said anti-ferroelectric film is formed is Ln, and a thickness of said vibrating section is tv.

17. The ceramic element according to claim 16, wherein said thickness tb of said substrate satisfies tb$\leq$250 $\mu$m.

18. The ceramic element according to claim 17, wherein said thickness tb of said substrate satisfies tb$\leq$130 $\mu$m.

19. The ceramic element according to claim 18, wherein said thickness tb of said substrate satisfies tb$\leq$70 $\mu$m.

20. The ceramic element according to claim 16, wherein when said distance Ln from said boundary point to said end of said region in which said anti-ferroelectric film is formed satisfies Ln$\geq$tv×15, said thickness tv of said vibrating section satisfies tv$\leq$20 $\mu$m.

21. The ceramic element according to claim 16, wherein when said distance Ln from said boundary point to said end of said region in which said anti-ferroelectric film is formed satisfies Ln$\geq$tv×15, said thickness tv of said vibrating section satisfies tv$\leq$10 $\mu$m.

* * * * *